US012610515B2

(12) United States Patent
Ito et al.

(10) Patent No.: US 12,610,515 B2
(45) Date of Patent: Apr. 21, 2026

(54) SEMICONDUCTOR MEMORY DEVICE INCLUDING A SUBSTRATE THAT INCLUDES A FIRST REGION AND A SECOND REGION ARRANGED IN A FIRST DIRECTION

(71) Applicant: KIOXIA CORPORATION, Tokyo (JP)

(72) Inventors: Naomi Ito, Shinagawa (JP); Koichi Kishi, Fujisawa (JP)

(73) Assignee: KIOXIA CORPORATION, Tokyo (JP)

( * ) Notice: Subject to any disclaimer, the term of this patent is extended or adjusted under 35 U.S.C. 154(b) by 666 days.

(21) Appl. No.: 17/930,246

(22) Filed: Sep. 7, 2022

(65) Prior Publication Data

US 2023/0209801 A1 Jun. 29, 2023

(30) Foreign Application Priority Data

Dec. 24, 2021 (JP) ................................ 2021-210968

(51) Int. Cl.
*H10B 12/00* (2023.01)
*G11C 11/4091* (2006.01)

(52) U.S. Cl.
CPC .......... *H10B 12/00* (2023.02); *G11C 11/4091* (2013.01)

(58) Field of Classification Search
CPC ...... H10B 12/00; H10B 12/30; H10B 12/482; H10B 12/488; H10B 12/50; G11C 11/4091; G11C 11/4087; G11C 11/401; H01L 23/5386
See application file for complete search history.

(56) References Cited

U.S. PATENT DOCUMENTS

| | | | | |
|---|---|---|---|---|
| 8,569,826 | B2 | 10/2013 | Kidoh et al. | |
| 2010/0038616 | A1 | 2/2010 | Nagashima et al. | |
| 2018/0269228 | A1* | 9/2018 | Sonehara | H10B 43/27 |
| 2019/0067288 | A1 | 2/2019 | Juengling | |
| 2019/0252386 | A1* | 8/2019 | Lee | H10B 12/50 |
| 2020/0111512 | A1* | 4/2020 | Kim | G11C 7/18 |
| 2021/0012828 | A1* | 1/2021 | Kim | G11C 11/4097 |

(Continued)

FOREIGN PATENT DOCUMENTS

| | | | |
|---|---|---|---|
| KR | 10-2019-0095138 | | 8/2019 |
| TW | 202145230 A | * | 12/2021 |

*Primary Examiner* — Eliseo Ramos Feliciano
*Assistant Examiner* — Sophia W Kao
(74) *Attorney, Agent, or Firm* — Oblon, McClelland, Maier & Neustadt, L.L.P.

(57) ABSTRACT

A semiconductor memory device includes a substrate including a first region and a second region arranged in a first direction, a first wiring extending in the first direction across the first region and the second region, a second wiring disposed in the first region and extending in a second direction that intersects with the first region, a first semiconductor layer disposed in the first region, electrically connected to the second wiring, and opposed to the first wiring, a memory unit electrically connected to the first semiconductor layer, and a contact electrode extending in a third direction intersecting with a surface of the substrate, and connected to the first wiring. The contact electrode includes a first part that overlaps with the first wiring viewing from the third direction, and a second part that does not overlap with the first wiring viewing from the third direction.

20 Claims, 55 Drawing Sheets

(56) References Cited

U.S. PATENT DOCUMENTS

| | | | |
|---|---|---|---|
| 2021/0118862 A1 | 4/2021 | Maejima et al. | |
| 2022/0068905 A1* | 3/2022 | Huang | H01L 23/481 |
| 2022/0328087 A1 | 10/2022 | Bedeschi | |
| 2022/0343971 A1 | 10/2022 | Park | |

* cited by examiner

530C    $R_{MCA}$    $R_{MCA}$    530D $R_{HU2}$

Array    $R_{HU2}$    $R_{HU1}$    Array $R_{HU3}$    $R_{HU3}$ $R_{HU1}$ $R_{HU4}$    $R_{HU4}$    $R_{HU2}$ Array    $R_{HU2}$    $R_{HU1}$    Array $R_{HU1}$

530A    $R_{MCA}$    $R_{MCA}$    530B 610C  611C  612C  613C  611D  612D  610D  613D

| WLD | sa | SA | WLD | WLD | SA | WLD |
| WLD | sa | SA | WLD | WLD | SA | WLD |

610A  611A  612A  613A  611B  612B  613B  610B

Y
Z  X

SEMICONDUCTOR MEMORY DEVICE INCLUDING A SUBSTRATE THAT INCLUDES A FIRST REGION AND A SECOND REGION ARRANGED IN A FIRST DIRECTION

CROSS-REFERENCE TO RELATED APPLICATIONS

This application is based upon and claims the benefit of Japanese Patent Application No. 2021-210968, filed on Dec. 24, 2021, the entire contents of which are incorporated herein by reference.

BACKGROUND

Field

Embodiments described herein relate generally to a semiconductor memory device.

Description of the Related Art

There has been known a semiconductor memory device including a first wiring, a second wiring extending in a direction that intersects with the first wiring, a semiconductor layer electrically connected to the second wiring and opposed to the first wiring, and a memory unit electrically connected to the semiconductor layer. The memory unit is a portion where data can be stored, and, for which, for example, a capacitor is used.

DETAILED DESCRIPTION

Figure 1:
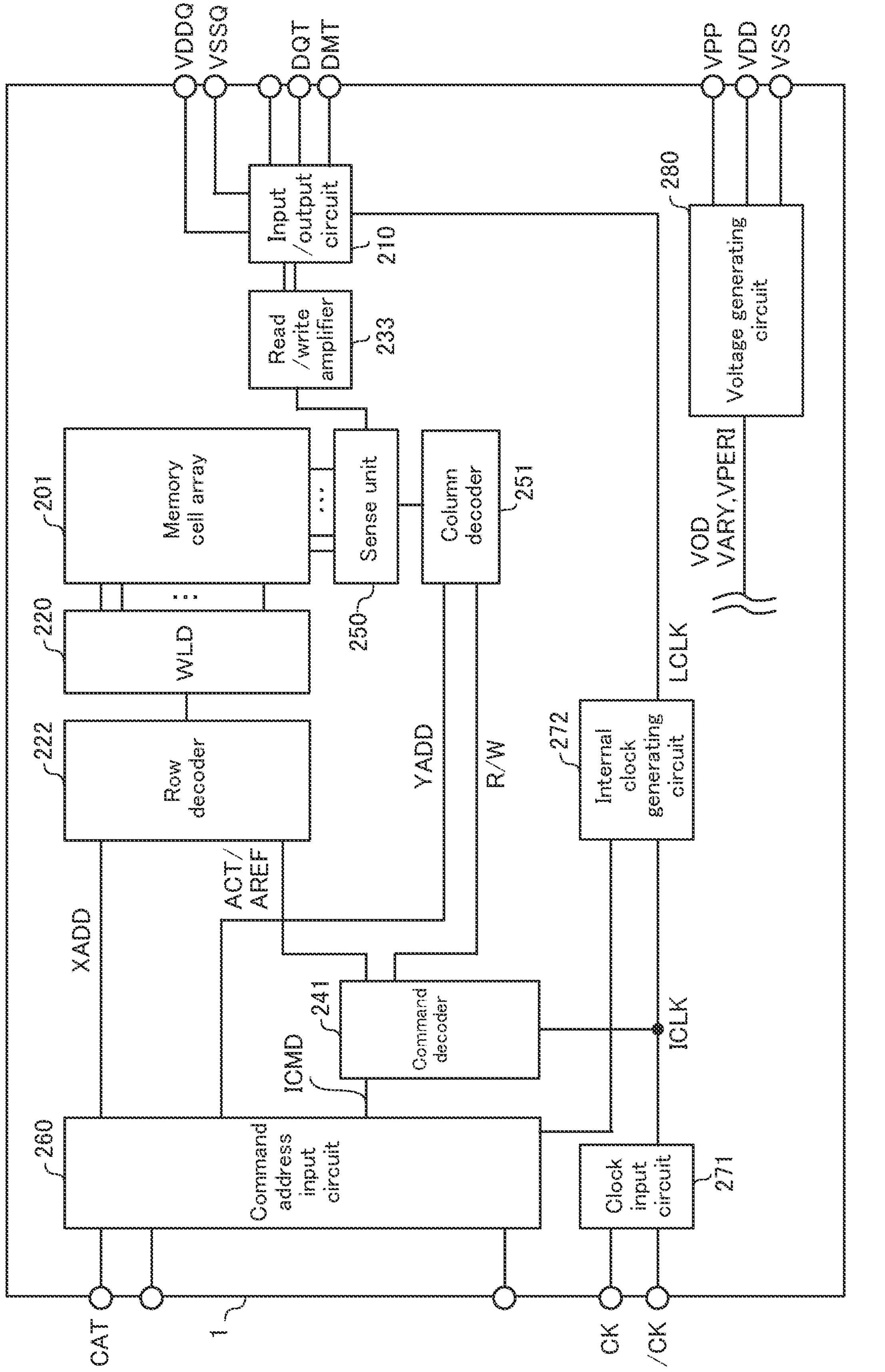
FIG. 1 is a schematic block diagram illustrating an exemplary configuration of a semiconductor memory device according to a first embodiment.

A semiconductor memory device according to one embodiment comprises a substrate including a first region and a second region arranged in a first direction, a first wiring extending in the first direction across the first region and the second region, a second wiring disposed in the first region and extending in a second direction intersecting with the first region, a memory cell disposed in the first region and connected to the first wiring and the second wiring, and a first contact electrode disposed in the second region, extending in a third direction intersecting with a surface of the substrate, and connected to the first wiring. The memory cell includes a semiconductor layer electrically connected to the second wiring and opposed to the first wiring, and a memory unit electrically connected to the semiconductor layer. The first contact electrode includes a first part that overlaps with the first wiring viewing from the third direction, and a second part that does not overlap with the first wiring viewing from the third direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like of a configuration, a member, or the like in a predetermined direction, this may mean a width, a length, a thickness, or the like in a cross-sectional surface or the like observed with a Scanning electron microscopy (SEM), a Transmission electron microscopy (TEM), or the like.

First Embodiment

[Configuration of Semiconductor Memory Device]

Using a Dynamic random access memory (DRAM) as an example, semiconductor memory devices according to the following embodiments will be described.

Figure 2:
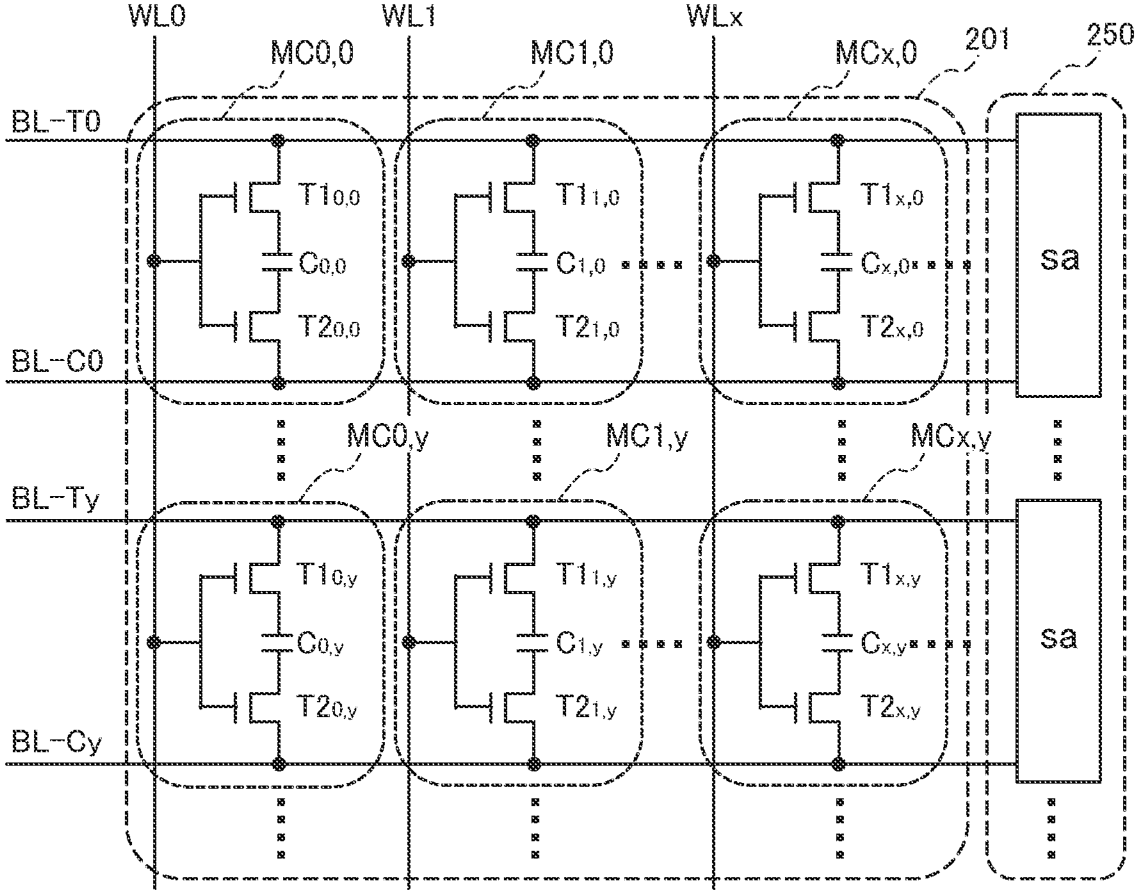
FIG. 2 is a schematic circuit diagram illustrating an exemplary configuration of a memory cell array according to the first embodiment.

FIG. 1 is a schematic block diagram illustrating an exemplary configuration of a semiconductor memory device according to a first embodiment. FIG. 2 is a schematic circuit diagram illustrating an exemplary configuration of a memory cell array 201 according to the first embodiment.

As illustrated in FIG. 1, a semiconductor memory device 1 according to the first embodiment includes the memory cell arrays 201, an input/output circuit 210, a word line driver 220 (written as a WLD in FIG. 1), a row decoder 222, a read/write amplifier 233, a command decoder 241, a sense unit 250, a column decoder 251, a command address input circuit 260, a clock input circuit 271, an internal clock generating circuit 272, and a voltage generating circuit 280.

The semiconductor memory device 1 also includes a plurality of external terminals, such as clock terminals CK, /CK, a command/address terminal CAT, a data terminal DQT, a data mask terminal DMT, and power supply terminals VPP, VDD, VSS, VDDQ, VSSQ.

Note that, in this embodiment, a configuration other than the memory cell arrays 201 in the semiconductor memory device 1 is referred to as a peripheral circuit in some cases.

In each of the memory cell arrays 201, as illustrated in FIG. 2, a plurality of word lines WL (word lines WL0, WL1, . . . , WLx, . . . ) and a plurality of bit lines BL (bit lines BL-T0, BL-C0, . . . , BL-Ty, BL-Cy, . . . ) are disposed in a matrix. The bit line BL-T and the bit line BL-C are wirings forming a pair.

The memory cell array 201 includes a plurality of memory cells MC (memory cells MC0,0, MC1,0, . . . , MCx,0, . . . , MC0,*y*, MC1,*y*, . . . , MCx,y, . . . ). The respective memory cells MC are disposed at respective portions where the plurality of word lines intersect with the plurality of bit lines.

The respective memory cells MC are connected to the word lines WL and the pairs of bit lines BL-T and BL-C. In the example in FIG. 2, the memory cell MC0,0 is connected to the word line WL0 and the pair of bit lines BL-T0, BL-C0. The memory cells MC1,0 is connected to the word line WL1 and the pair of bit lines BL-T0, BL-C0. The memory cell MCx,0 is connected to the word line WLx and the pair of bit lines BL-T0, BL-C0. The memory cell MC0,*y* is connected to the word line WL0 and the pair of bit lines BL-Ty, BL-Cy. The memory cell MC1,*y* is connected to the word line WL1 and the pair of bit lines BL-Ty, BL-Cy. The memory cell MCx,y is connected to the word line WLx and the pair of bit lines BL-Ty, BL-Cy.

Each memory cell MC is configured of two cell transistors T1, T2 and one cell capacitor C. Such a configuration of the memory cell MC is referred to as "2T1C" in some cases. As illustrated in FIG. 2, a first terminal of the cell transistor T1 is connected to the bit line BL-T and a second terminal of the cell transistor T1 is connected to one terminal of the cell capacitor C. A first terminal of the cell transistor T2 is connected to the bit line BL-C and a second terminal of the cell transistor T2 is connected to the other terminal of the cell capacitor C. Third terminals of the two cell transistors T1, T2 are each connected to the word line WL. Here, the first terminal is any one of the terminals of source/drain of the cell transistor. The second terminal is the other terminal of the source/drain of the cell transistor. The third terminal is a gate terminal of the cell transistor.

The word line WL is applied with a voltage of a low level or a high level and the bit lines BL-T, BL-C are applied with a voltage of a low level or a high level, and thus, the cell transistors T1, T2 are turned ON or turned OFF. This causes an electric charge to be accumulated in the cell capacitor C or causes an accumulated electric charge to be discharged.

Each memory cell MC latches the electric charge as volatile data in each cell capacitor C. Therefore, in order to maintain the electric charge (the volatile data) latched (stored) in each cell capacitor C of each memory cell MC, a refresh circuit performs a process to periodically refresh the electric charge of the cell capacitor C. In FIG. 1, for convenience of explanation, the refresh circuit and the like disposed in the DRAM are omitted.

Note that, the memory cell array 201 illustrated in FIG. 2 is referred to as a bank in some cases. Generally, the DRAM includes a plurality of the banks. In this embodiment, the plurality of banks are referred to as the memory cell array 201 in some cases.

Sense amplifiers sa sense data read out from the memory cells MC. As illustrated in FIG. 2, the sense amplifiers sa are disposed corresponding to the bit lines BL-T, BL-C forming the pairs. The sense unit 250 includes a plurality of the sense amplifiers sa.

The plurality of memory cells MC in the memory cell array 201 have respective corresponding memory addresses. Among the plurality of external terminals, the command/address terminal CAT receives a memory address from an external device, such as a memory controller. The memory address received by the command/address terminal CAT is transferred to the command address input circuit 260. Upon receiving the memory address, the command address input circuit 260 transmits a decoded row address XADD to the row decoder 222 and transmits a decoded column address YADD to the column decoder 251.

The command/address terminal CAT also receives a command from the external device, such as the memory controller. The command received by the command/address terminal CAT is transferred to the command address input circuit 260. Upon receiving the command, the command address input circuit 260 transmits the received command to the command decoder 241 as an internal command ICMD.

The command decoder 241 includes a circuit that decodes the internal command ICMD and generates a signal for executing the internal command. The command decoder 241 transmits, for example, an activated command ACT and a refresh command AREF to the row decoder 222. The row decoder 222 selects the word line WL in accordance with the command ACT and the refresh command AREF received from the command decoder 241. The row decoder 222 transmits a signal indicating the selected word line WL to the word line driver 220.

The word line driver 220 is connected to the word lines WL. The word line driver 220 receives the signal from the row decoder 222 and applies a voltage of a low level or a high level to the word line WL indicated by the signal.

The command decoder 241 transmits, for example, a read/write command R/W to the column decoder 251. The column decoder 251 selects the bit line BL in accordance with the read/write command R/W received from the command decoder 241. The column decoder 251 transmits a signal indicating the selected bit line BL to the sense unit 250.

The sense unit 250 is connected to the bit lines BL. The sense unit 250 receives the signal from the column decoder 251 and applies a voltage of a low level or a high level to the bit line BL indicated by the signal.

When the data is read out, the command/address terminal CAT receives the memory address together with a read command. This causes data to be read out from the memory cell MC in the memory cell array 201 specified by the memory address. The reading data is output to the outside from the data terminal DQT via the sense unit 250, the read/write amplifier 233, and the input/output circuit 210.

When the data is written, the command/address terminal CAT receives the memory address together with the write command, and the data terminal DQT receives writing data. As necessary, the data mask terminal DMT receives a data mask. The writing data is transmitted to the memory cell array 201 via the input/output circuit 210, the read/write amplifier 233, and the sense unit 250. This causes the writing data to be written in the memory cell MC specified by the memory address.

The read/write amplifier 233 includes various kinds of latch circuits that temporarily latch the reading data and the writing data.

The voltage generating circuit 280 is applied with a power supply voltage from the power supply terminals VPP, VDD, VSS. The voltage generating circuit 280 generates various kinds of internal voltages VOD, VARY, VPERI based on the power supply voltage. The internal voltages VOD, VARY are mainly used in the sense amplifier sa, and the internal voltage VPERI is used in another peripheral circuit.

The input/output circuit 210 is applied with a power supply voltage from the power supply terminals VDDQ, VSSQ. The power supply terminals VDDQ, VSSQ are applied with a dedicated power supply voltage such that a power source noise generated in the input/output circuit 210 does not propagate to another circuit block. Note that, the power supply voltages applied to the power supply terminals VDDQ, VSSQ may be the same voltage as the power supply voltages applied to the power supply terminals VDD, VSS.

The clock terminals CK, /CK are input with a complementary external clock signal. The external clock signal is supplied to the clock input circuit 271. The clock input circuit 271 generates an internal clock signal ICLK. The internal clock signal ICLK is supplied to the internal clock generating circuit 272 and the command decoder 241.

The internal clock generating circuit 272 generates various internal clock signals LCLK when it is enabled by a clock enable from the command address input circuit 260. The internal clock signal LCLK is used for measuring timings of various internal operations. For example, the internal clock signal LCLK is output to the input/output circuit 210. The input/output circuit 210 transmits and receives data from the data terminal DQT based on the input internal clock signal LCLK.

[Configuration of Sense Amplifier]

Figure 3:
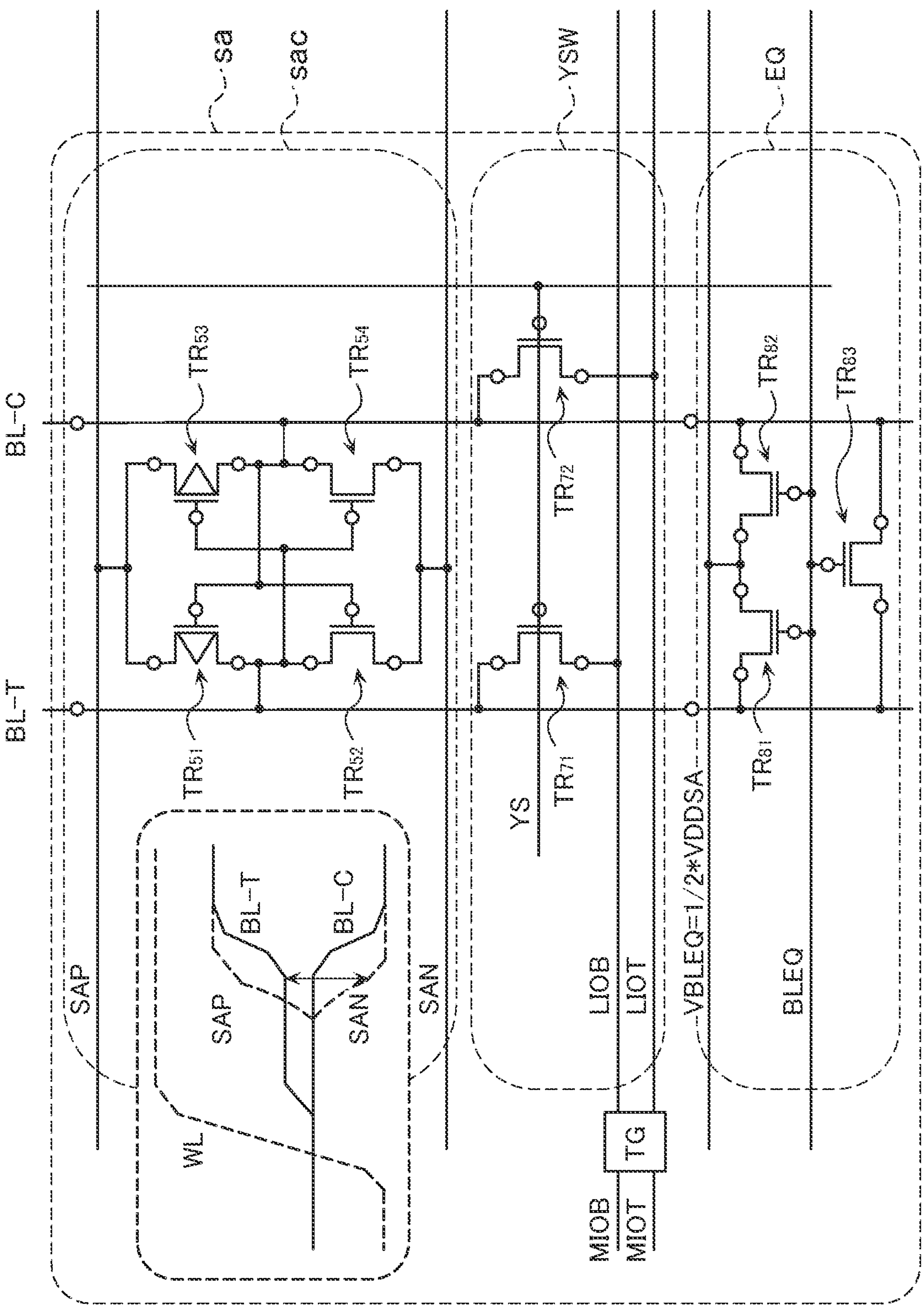
FIG. 3 is a circuit diagram illustrating an exemplary configuration of a sense amplifier including a sense amplifier circuit.

Next, with reference to FIG. 3, an exemplary configuration of the sense amplifier sa will be described. FIG. 3 is a circuit diagram illustrating the exemplary configuration of the sense amplifier sa including a sense amplifier circuit sac.

As illustrated in FIG. 3, the bit line BL-T and the bit line BL-C forming the pair with the bit line BL-T connected to the memory cell MC in the memory cell array 201 are each connected to the sense amplifier circuit sac.

The sense amplifier circuit sac includes transistors $TR_{51}$ to $TR_{54}$. The transistors $TR_{51}$, $TR_{53}$ are low withstand voltage P channel MOS transistors, and the transistors $TR_{52}$, $TR_{54}$ are low withstand voltage N channel MOS transistors.

One terminal of the transistor $TR_{51}$ is connected to a signal line supplied with a sense signal SAP, and the other terminal of the transistor $TR_{51}$ is connected to one terminal of the transistor $TR_{52}$. The other terminal of the transistor $TR_{52}$ is connected to a signal line supplied with a sense signal SAN. Between the transistors $TR_{51}$ and $TR_{52}$ (a connection point between the other terminal of the transistor $TR_{51}$ and the one terminal of the transistor $TR_{52}$), the bit line BL-T is connected.

One terminal of the transistor $TR_{53}$ is connected to a signal line supplied with the sense signal SAP, and the other terminal of the transistor $TR_{53}$ is connected to one terminal of the transistor $TR_{54}$. The other terminal of the transistor $TR_{54}$ is connected to a signal line supplied with the sense signal SAN. Between the transistors $TR_{53}$ and $TR_{54}$ (a connection point between the other terminal of the transistor $TR_{53}$ and the one terminal of the transistor $TR_{54}$), the bit line BL-C is connected.

Gate terminals (gate electrodes) of the transistors $TR_{51}$, $TR_{52}$ are connected between the transistors $TR_{53}$ and $TR_{54}$, gate terminals (gate electrodes) of the transistors $TR_{53}$, $TR_{54}$ are connected between the transistors $TR_{51}$ and $TR_{52}$.

A column switch YSW is connected to the bit lines BL-T, BL-C in the downstream with respect to the sense amplifier circuit sac. The column switch YSW includes transistors $TR_{71}$, $TR_{72}$. The transistors $TR_{71}$, $TR_{72}$ are low withstand voltage N channel MOS transistors.

One terminal of the transistor $TR_{71}$ is connected to the bit line BL-T, and the other terminal of the transistor $TR_{71}$ is connected to a local input/output line LIOB. One terminal of the transistor $TR_{72}$ is connected to the bit line BL-C, and the other terminal of the transistor $TR_{72}$ is connected to a local input/output line LIOT. Gate terminals (gate electrodes) of the transistors $TR_{71}$, $TR_{72}$ are connected to a signal line supplied with a column select signal YS.

Thus, the sense amplifier circuit sac is connected to the local input/output lines LIOT, LIOB via the column switch YSW. A transfer gate TG is connected to the local input/output line LIOT, LIOB, and is connected to main input/output lines MIOT, MIOB. The transfer gate TG functions as a switch. The main input/output lines MIOT, MIOB are connected to the read/write amplifier 233.

The bit lines BL-T, BL-C in the downstream with respect to the column switch YSW are connected to an equalize circuit EQ. The equalize circuit EQ includes transistors $TR_{81}$ to $TR_{83}$. The transistors $TR_{81}$ to $TR_{83}$ are low withstand voltage N channel MOS transistors.

One terminal of the transistor $TR_{81}$ is connected to the bit line BL-T, and the other terminal of the transistor $TR_{81}$ is connected to one terminal of the transistor $TR_{82}$. The other terminal of the transistor $TR_{82}$ is connected to the bit line BL-C. Between the transistors $TR_{81}$ and $TR_{82}$, a power line to which an equalize voltage VBLEQ is applied is connected. The equalize voltage VBLEQ has a magnitude of ½ of a power supply voltage VDDSA for the sense amplifier sa.

One terminal of the transistor $TR_{83}$ is connected to the bit line BL-T, and the other terminal of the transistor $TR_{83}$ is connected to the bit line BL-C. Gate terminals (gate electrodes) of the transistors $TR_{81}$ to $TR_{83}$ are connected to a signal line supplied with an equalize signal BLEQ.

Next, the operation of the sense amplifier sa including the above-described sense amplifier circuit sac will be described.

Usually in a steady state, the equalize signal BLEQ is driven to a high level. This causes the transistors $TR_{81}$ to $TR_{83}$ of the equalize circuit EQ to be turned ON, and the bit lines BL-T, BL-C to be equalized to a precharge voltage.

When the active command ACT is issued, equalizing is released and the corresponding word line WL is driven to a VPP level by the word line driver 220 based on the input row address XADD. The release of equalizing, that is, a non-active state of the equalize circuit EQ is continued from the active command ACT is issued until a precharge command is issued.

The word line WL is driven to the VPP level, and the cell transistors T1, T2 of the corresponding memory cell MC are turned ON. In view of this, the cell capacitor C of the memory cell MC is connected to the bit line BL-T and the bit line BL-C. As a result, corresponding to the electric charge of the cell capacitor C of the memory cell MC, the voltage of the bit line BL-T or the bit line BL-C is slightly changed. The example of FIG. 3 shows the state where the voltage of the bit line BL-T is slightly increased.

Afterwards, the sense signals SAN, SAP are changed to a low level and a high level, respectively, at a predetermined timing to activate the sense amplifier circuit sac. As a result, a voltage difference between the bit lines BL-T and BL-C are amplified. The example in FIG. 3 shows the state where the bit line BL-C is driven to the low level and the bit line BL-T is driven to the high level.

Next, when the read command is issued, the corresponding column select signal YS is changed to a high level in accordance with the column address YADD input synchronizing with the read command. At the point before the column select signal YS is activated, the local input/output lines LIOT, LIOB are precharged to a power supply voltage VCC.

When the column select signal YS is activated, the transistors $TR_{71}$, $TR_{72}$ of the column switch YSW are turned ON, and thus, the bit lines BL-T, BL-C are connected to the corresponding local input/output lines LIOT, LIOB. As a result, the local input/output line LIOT is maintained at a precharge level, and the local input/output line LIOB is lowered to a low level from the precharge level.

When the transfer gate TG is turned ON, the local input/output lines LIOT, LIOB are connected to the main input/output lines MIOT, MIOB. As a result, the main input/output line MIOT is maintained at a precharge level, and the main input/output line MIOB is lowered to a low level from the precharge level.

With the operation described above, the data is read out from the memory cell MC.

[Configuration of Transistors]

Figure 4:
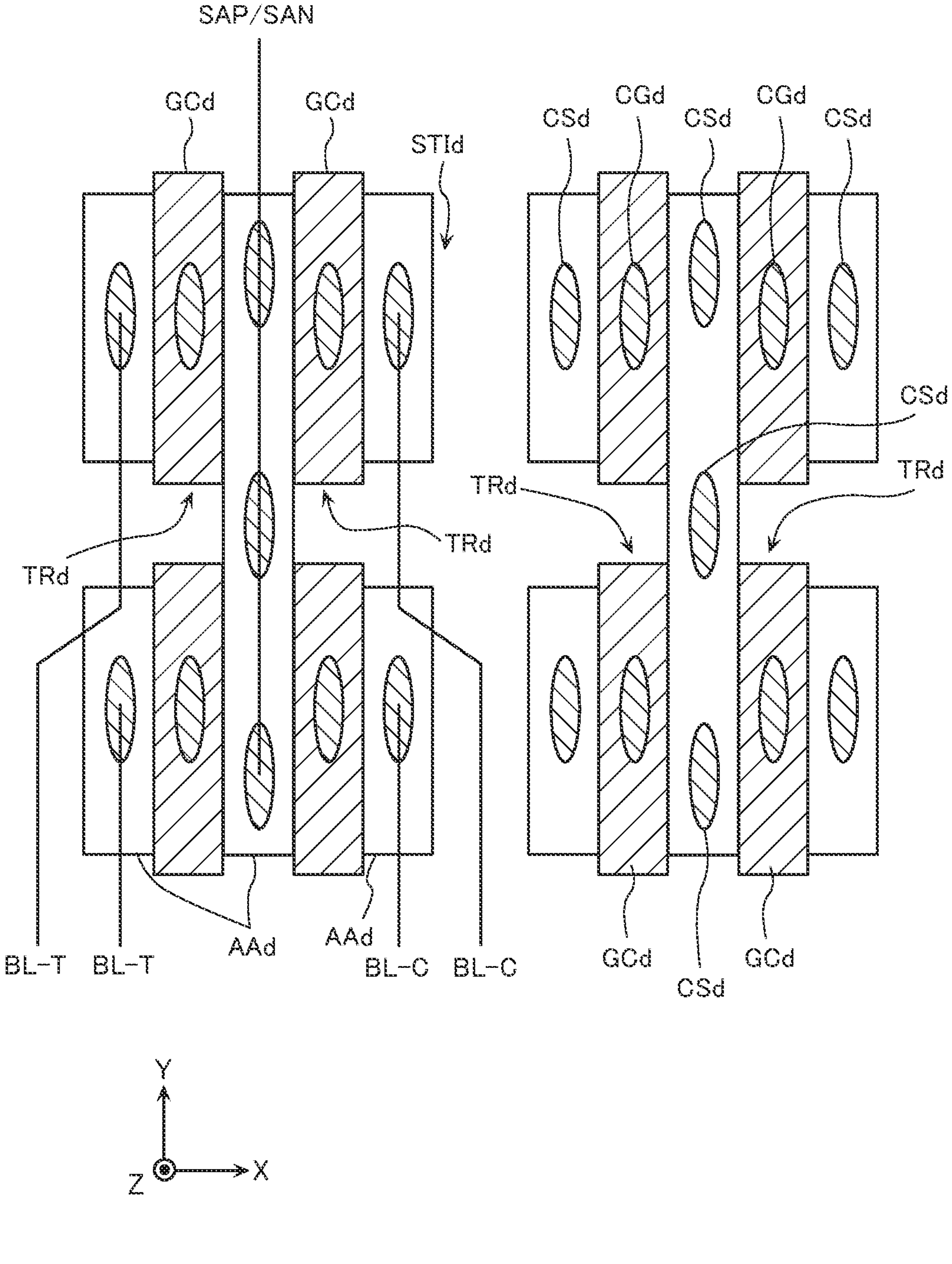
FIG. 4 is a schematic diagram illustrating an exemplary layout of transistors included in the sense amplifier circuit.

Next, with reference to FIG. 4, a physical exemplary configuration of transistors TRd included in the sense amplifier circuit sac will be described. FIG. 4 is a schematic diagram illustrating an exemplary layout of the transistors included in the sense amplifier circuit sac. Note that, a plurality of the transistors TRd are formed on a semiconductor substrate (for example, a semiconductor substrate 100 in, for example, FIG. 6, described below).

As illustrated in FIG. 4, in the sense amplifier circuit sac, a plurality of element regions AAd included in the respective plurality of transistors TRd are disposed into a grid shape in the X-direction and the Y-direction. The plurality of element regions AAd are electrically separated from one another by element isolation portions STId.

On the individual element regions AAd, a plurality of gate electrodes GCd arranged in the X-direction are disposed. In the example in FIG. 4, two gate electrodes GCd are disposed on the element region AAd. Note that, the element region AAd extends in the Y-direction in a region sandwiched between the two gate electrodes GCd, and is connected to the neighboring element region AAd.

The gate electrode GCd of the transistor TRd is connected to a gate contact CGd. The element region AAd of the transistor TRd is connected to a source/drain contact CSd. The transistor TRd arranged in the X-direction shares the source/drain contact CSd with the neighboring transistor TRd. The source/drain contact CSd is also disposed at the connecting portion of the element region AAd connected to one another in the Y-direction.

Among a plurality of the source/drain contacts CSd, the source/drain contacts CSd disposed in one end of the transistor TRd on one side in the X-direction are each connected to the bit line BL-T. The source/drain contacts CSd disposed in the other end of the transistor TRd on the other side in the X-direction are each connected to the bit line BL-C.

The source/drain contact CSd shared between the transistors TRd neighboring in the X-direction is connected in common to the signal line supplied with the sense signal SAP or the signal line supplied with the sense signal SAN. Specifically, when the transistor TRd is a P channel MOS transistor, the source/drain contact CSd is connected to the signal line supplied with the sense signal SAP. When the transistor TRd is a N channel MOS transistor, the source/drain contact CSd is connected to the signal line supplied with the sense signal SAN. The signal line supplied with the sense signal SAP or the signal line supplied with the sense signal SAN has the source/drain contact CSd extracted to an upper layer wiring and extends in the X-direction.

[Structure of Semiconductor Memory Device]

Figure 5:
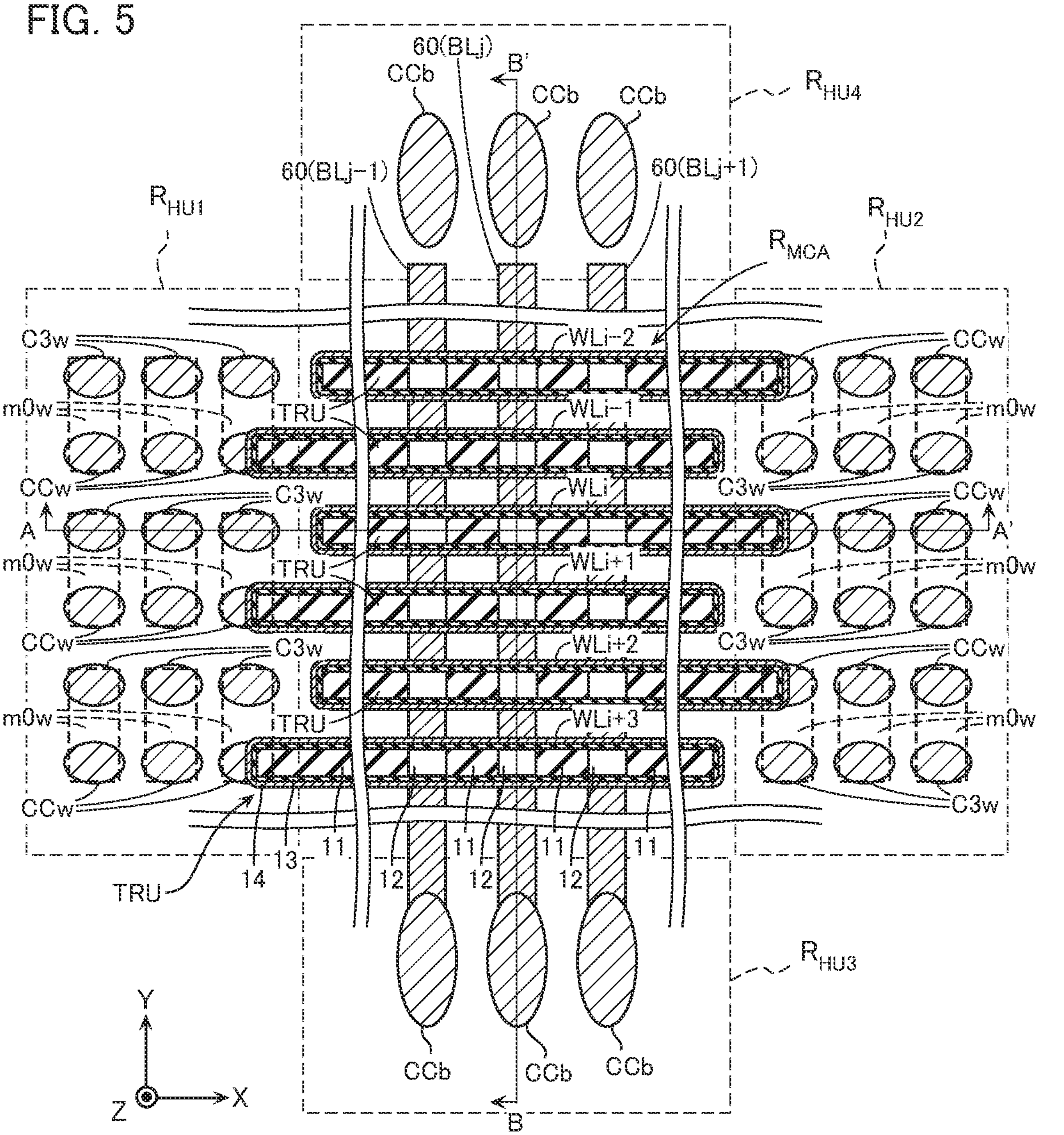
FIG. 5 is a schematic plan view illustrating an exemplary configuration of the memory cell array and contact electrodes according to the first embodiment.
Figure 6:
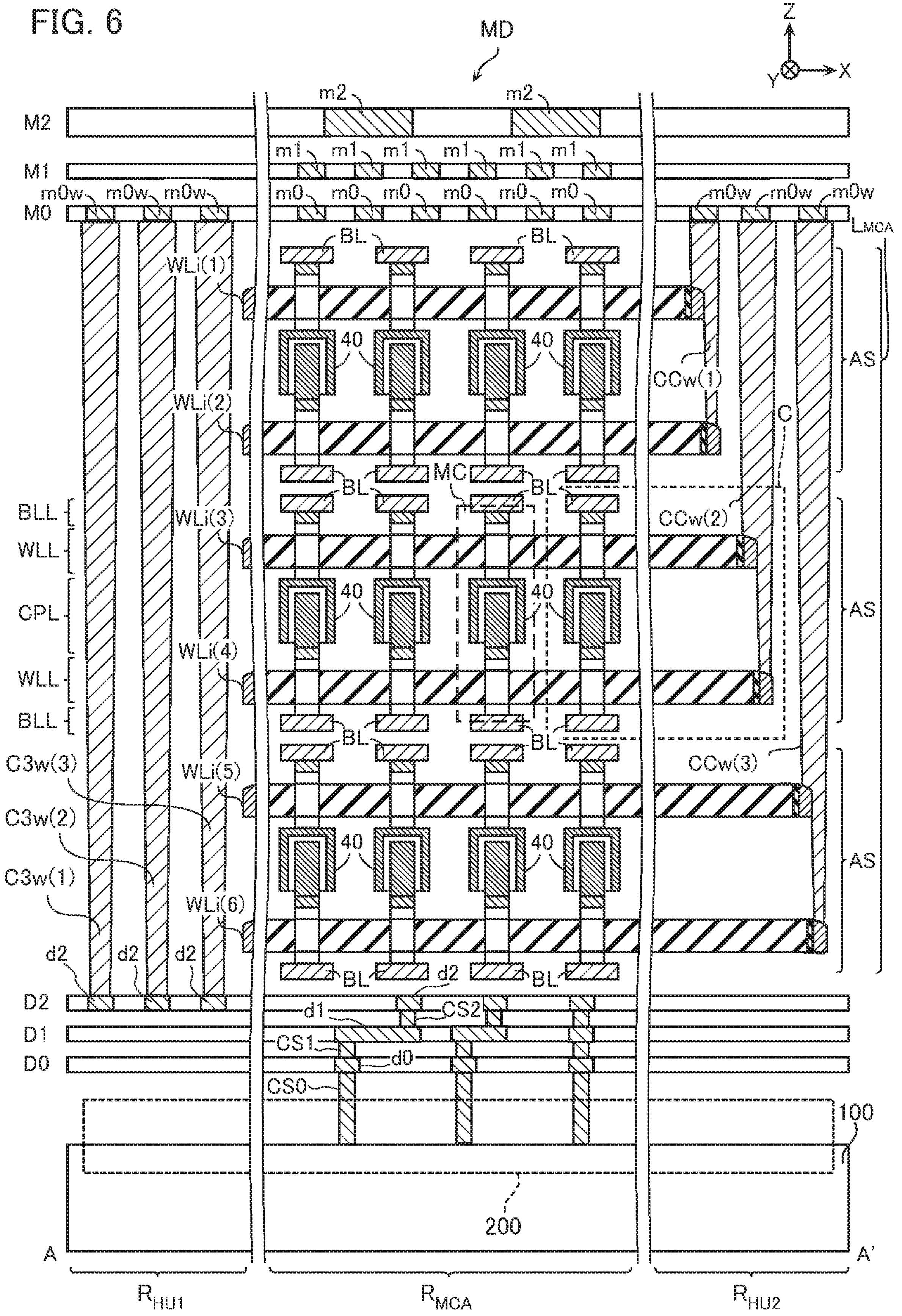
FIG. 6 is a schematic cross-sectional view of the structure illustrated in FIG. 5 taken along the line A-A', and viewed along a direction of the arrow.
Figure 7:
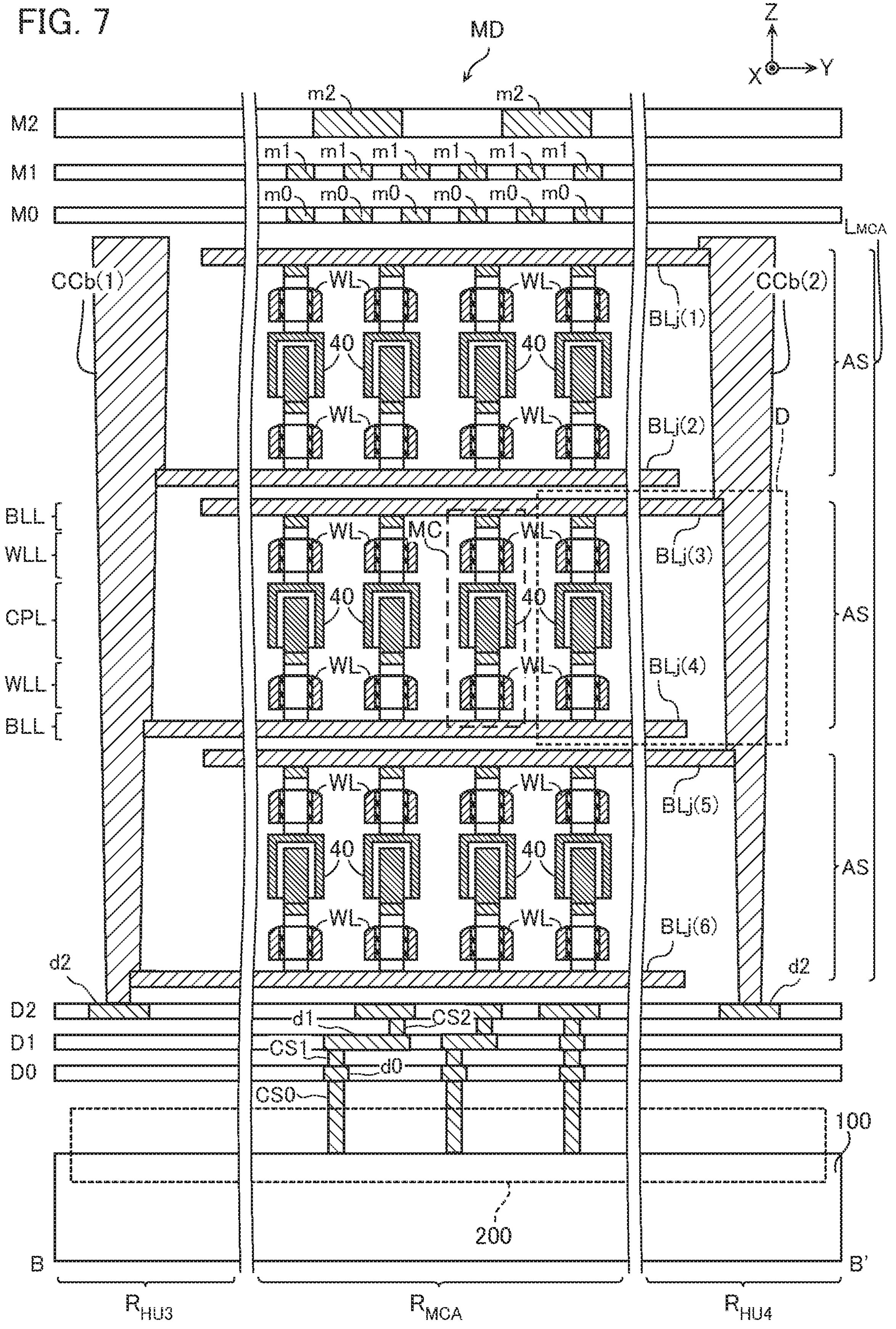
FIG. 7 is a schematic cross-sectional view of the structure illustrated in FIG. 5 taken along the line B-B', and viewed along a direction of the arrow.
Figure 8:
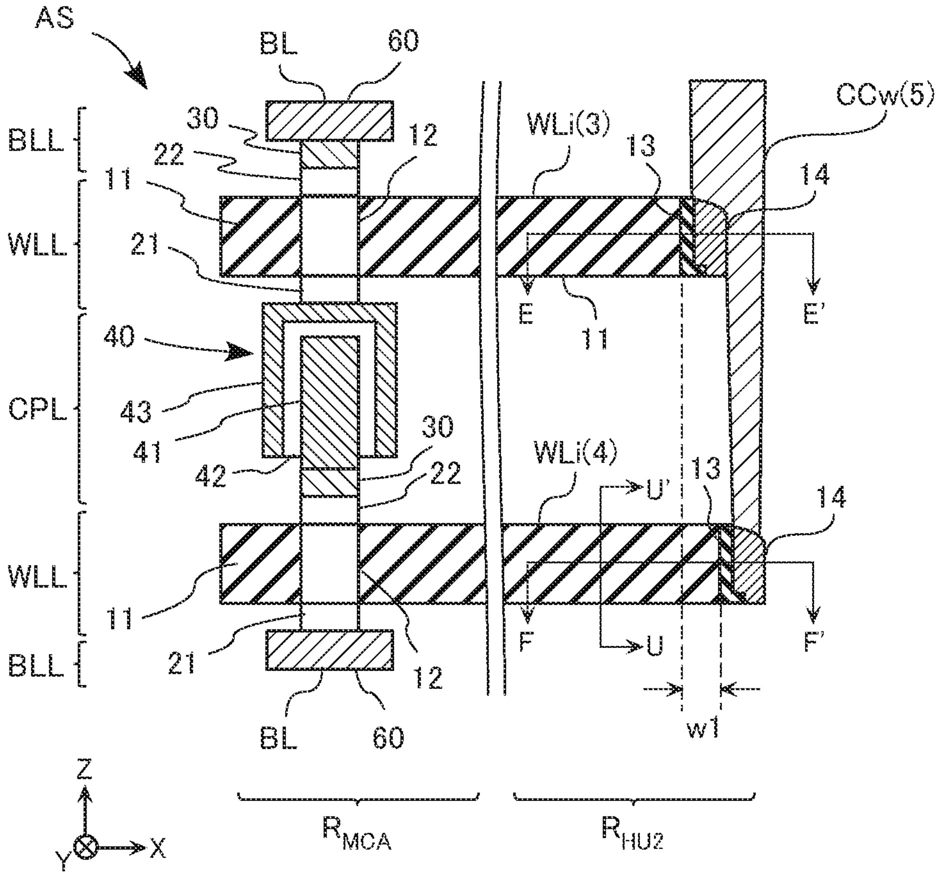
FIG. 8 is a schematic enlarged view of a part indicated by C in FIG. 6.
Figure 9:
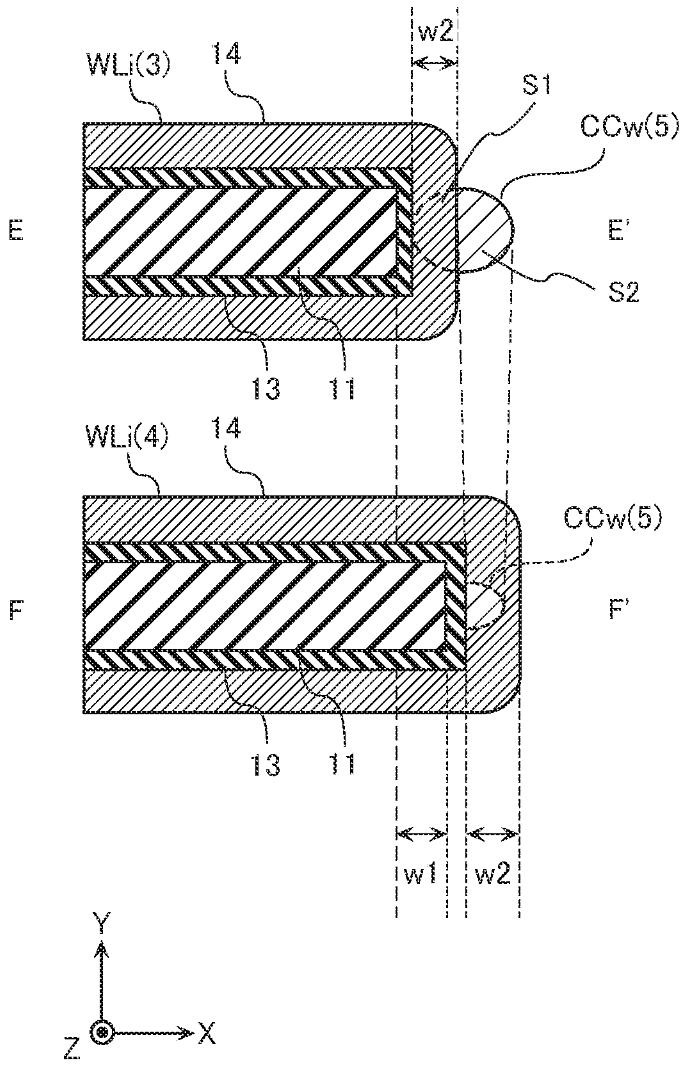
FIG. 9 is a schematic cross-sectional view of the structure illustrated in FIG. 8 taken along the line E-E' and the line F-F', and viewed along a direction of the arrow.
Figure 10:
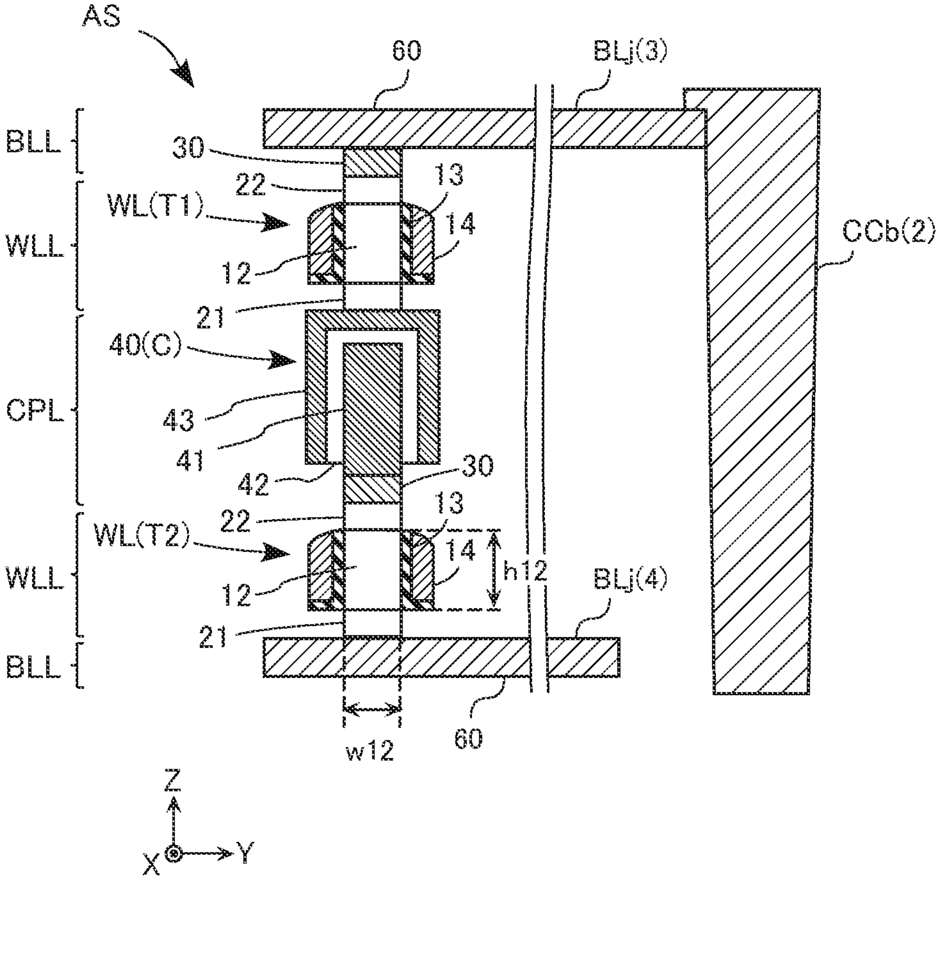
FIG. 10 is a schematic enlarged view of a part indicated by D in FIG. 7.
Figure 11:
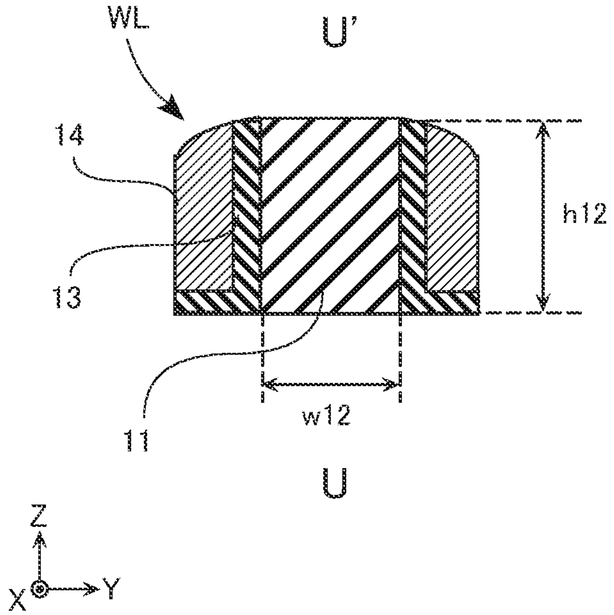
FIG. 11 is a schematic cross-sectional view of the structure illustrated in FIG. 8 taken along the line U-U', and viewed along a direction of the arrow.

FIG. 5 is a schematic plan view illustrating an exemplary configuration of the memory cell array 201 and contact electrodes according to the first embodiment. FIG. 6 is a schematic cross-sectional view of the structure illustrated in FIG. 5 taken along the line A-A', and viewed along a direction of the arrow. FIG. 7 is a schematic cross-sectional view of the structure illustrated in FIG. 5 taken along the line B-B', and viewed along a direction of the arrow. FIG. 8 is a schematic enlarged view of a part indicated by C in FIG. 6. FIG. 9 is a schematic cross-sectional view of the structure illustrated in FIG. 8 taken along the line E-E' and the line F-F', and viewed along a direction of the arrow. FIG. 10 is a schematic enlarged view of a part indicated by D in FIG. 7. FIG. 11 is a schematic cross-sectional view of the structure illustrated in FIG. 8 taken along the line U-U', and viewed along a direction of the arrow.

Note that, in FIG. 6 and FIG. 7, an insulating layer (for example, an inter-layer insulating film) covering components of the memory die MD is not illustrated. FIG. 5 illustrates a schematic plan view of the structure illustrated in FIG. 6 and FIG. 7 taken along an XY-plane including the word lines WL on the upmost stage, and viewed from an upper side (a +Z-direction side). Also in FIG. 5, the insulating layer (for example, the inter-layer insulating film) covering the components of the memory die MD is not illustrated. Therefore, FIG. 5 shows the bit lines BL that are not seen on the XY-plane including the word lines WL on the upmost stage. However, in FIG. 5, the configuration disposed below this (the bit lines BL, the peripheral circuit, and the like disposed below this) are omitted. The following FIG. 14, FIG. 20, FIG. 23, FIG. 27, FIG. 30, and FIG. 34 are also similar to FIG. 5. In FIG. 5, wirings m0*w* on a wiring layer M0 is indicated by a dotted line.

The memory die MD includes, for example, as illustrated in FIG. 6 and FIG. 7, the semiconductor substrate 100, a wiring layer D0 disposed above the semiconductor substrate 100, a wiring layer D1 disposed above the wiring layer D0, a wiring layer D2 disposed above the wiring layer D1, a memory cell array layer $L_{MCA}$ disposed above the wiring layer D2, a wiring layer M0 disposed above the memory cell array layer $L_{MCA}$, a wiring layer M1 disposed above the wiring layer M0, and a wiring layer M2 disposed above the wiring layer M1.

[Semiconductor Substrate 100]

The semiconductor substrate 100 is, for example, a semiconductor substrate formed of a silicon single crystal. The semiconductor substrate 100 has a surface on which a peripheral circuit 200 including the sense amplifiers sa (the sense unit 250) and the word line driver 220 is formed. Note that, the word line driver 220 is referred to as a driver circuit in some cases. In FIG. 6 and FIG. 7, the peripheral circuit 200 is disposed in a memory cell array region $R_{MCA}$ and hook-up regions $R_{HU1}$, $R_{HU2}$, $R_{HU3}$, $R_{HU4}$. However, the peripheral circuit 200 may be disposed in another region.

[Wiring Layers D0, D1, D2]

For example, as illustrated in FIG. 6 and FIG. 7, the wiring layers D0, D1, D2 include a plurality of wirings d0, d1, d2, respectively. These plurality of wirings d0, d1, d2 may, for example, include a stacked film or the like of a barrier conductive film of titanium nitride (TiN) or the like and a metallic film of tungsten (W), molybdenum (Mo), ruthenium (Ru) or the like. The semiconductor substrate 100 and the wiring d0 of the wiring layer D0 are connected via a contact CS0. The wiring d0 of the wiring layer D0 and the wiring d1 of the wiring layer D1 are connected via a contact CS1. The wiring d1 of the wiring layer D1 and the wiring d2 of the wiring layer D2 are connected via a contact CS2. The plurality of wirings d0, d1, d2 included in the wiring layers D0, D1, D2 and the contacts CS0, CS1, CS2 are electrically connected to at least one of the configuration in the memory cell array 201 and the configuration in the peripheral circuit 200.

[Memory Cell Array Layer $L_{MCA}$]

The memory cell array layer $L_{MCA}$ includes, as illustrated in FIG. 5, the memory cell array region $R_{MCA}$, the first hook-up regions $R_{HU1}$, $R_{HU2}$ arranged in both ends in the X-direction of the memory cell array region $R_{MCA}$, and the second hook-up regions $R_{HU3}$, $R_{HU4}$ arranged in both ends in the Y-direction of the memory cell array region $R_{MCA}$.

[Memory Cell Array Region $R_{MCA}$]

For example, as illustrated in FIG. 6 and FIG. 7, the memory cell array region $R_{MCA}$ includes a plurality (three in the illustrated example) of array structures AS arranged in the Z-direction. For example, as illustrated in FIG. 6 and FIG. 8, the array structures AS each include two bit line layers BLL arranged in the Z-direction, a capacitor layer CPL disposed between these two bit line layers BLL, and two word line layers WLL each disposed between the bit line layer BLL and the capacitor layer CPL.

The bit line layer BLL includes, for example, as illustrated in FIG. 5, a plurality of conductive layers 60 arranged in the X-direction. The conductive layer 60 may contain, for example, polysilicon (Poly-Si), tungsten (W), tungsten nitride (WN), tungsten silicide (WSi), tungsten silicide nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicide nitride (TiSiN), and ruthenium nitride titanium (RuTiN), may contain another conductive material, or may include a stacked film of a plurality of conductive materials, such as a stacked film of titanium nitride (TiN) and tungsten (W). The conductive layer 60 functions as the bit lines BL.

FIG. 5 illustrates the bit lines BL ( . . . , BLj−1, BLj, BLj+1, . . . ). The order of the bit lines BL arranged in the X-direction is represented by j. These plurality of bit lines BL extend in the Y-direction across the memory cell array region $R_{MCA}$ and the second hook-up regions $R_{HU3}$, $R_{HU4}$ in the memory cell array layer $L_{MCA}$.

As illustrated in FIG. 7, for the plurality of bit lines BLj, 1st to 6th bit lines counted from the +Z-direction to the −Z-direction are a bit line BLj(1) to a bit line BLj(6).

The bit line BLj(1), for example, corresponds to a bit line BL-Ty connected to a first terminal of a cell transistor T1*x,y* in the memory cell array 201 in FIG. 2. The bit line BLj(2), for example, corresponds to a bit line BL-Cy connected to a first terminal of a cell transistor T2*x,y* in the memory cell array 201 in FIG. 2.

The bit lines BLj(3), BLj(5) correspond to the bit lines BL-T connected to the second terminals of the cell transistors T1 in the memory cell array 201. The bit lines BLj(4), BLj(6) correspond to the bit lines BL-C connected to the second terminals of the cell transistors T2 in the memory cell array 201.

The capacitor layer CPL includes, for example, as illustrated in FIG. 5 and FIG. 6, a plurality of cell capacitors 40 arranged in the X-direction and the Y-direction. The cell capacitor 40 includes, for example, as illustrated in FIG. 8, two capacitor electrodes 41, 43, and an insulating film 42 disposed between these two capacitor electrodes 41, 43. The cell capacitor 40 corresponds to the cell capacitor C in FIG. 2. The capacitor electrode 41 and the semiconductor layer 22 are electrically connected via an electrode 30.

For example, the capacitor electrode 43 is a cylindrically-shaped electrode with one end in the Z-direction opened and an inside being hollow. The capacitor electrode 41 is a columnar electrode disposed inside the capacitor electrode 43. The capacitor electrodes 41, 43 may contain, for example, polysilicon (Poly-Si), tungsten (W), tungsten nitride (WN), tungsten silicide (WSi), tungsten silicide nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicide nitride (TiSiN), and ruthenium nitride titanium (RuTiN), may contain another conductive material, or may include a stacked film of a plurality of conductive materials.

The insulating film 42 is disposed between the capacitor electrodes 41 and 43, and functions as a dielectric material of the capacitor. The insulating film 42 may contain, for example, aluminum oxide (AlO), zirconium oxide (ZrO), hafnium oxide (HfO), niobium oxide (NbO), tantalum oxide (TaO), barium strontium titanate (BST), lead zirconate titanate (PZT), strontium bismuth tantalate (SBT), or another insulating metal oxide, may contain another insulating material, or may be their mixture, such as ZrHfO, ZrAlO, ZrNbO. The insulating layer 11 may include a stacked film of a plurality of insulating materials, such as a stacked film (ZAZ) of zirconium oxide, aluminum oxide, and zirconium oxide, and a stacked film of ZrHfO, ZrAlO, ZrNbO. The insulating film 42 may be of a ferroelectric material.

The cell capacitor 40 has an electrostatic capacitance proportional to a relative dielectric constant of the insulating film 42 and an area of the capacitor electrodes 41, 43, and inversely proportional to a film thickness of the insulating film 42.

The word line layer WLL includes, for example, as illustrated in FIG. 5, a plurality of transistor units TRU arranged in the Y-direction. The plurality of transistor units TRU each include a plurality of insulating layers 11 and semiconductor layers 12 alternately arranged in the X-direction, and gate insulating films 13 and conductive sidewall films 14 disposed on both side surfaces in the Y-direction of these configurations. For example, as illustrated in FIG. 8 and FIG. 10, the semiconductor layers 12 have lower ends each provided with a semiconductor layer 21. The semiconductor layers 12 have upper ends each provided with a semiconductor layer 22 and the electrode 30.

The insulating layer 11 contains, for example, silicon oxide ($SiO_2$). In the following description, the insulating layer 11 is referred to as a core material in some cases.

The semiconductor layers 12, 21, 22 contain, for example, polycrystalline silicon. The semiconductor layer 12, for example, may contain silicon (Si), germanium (Ge), carbon (C), zinc oxide tin (ZnSnO: generally referred to as "ZTO"), indium zinc oxide (InZnO: generally referred to as "IZO"), indium gallium zinc oxide (InGaZnO: generally referred to as "IGZO"), indium gallium silicon oxide (InGaSiO: generally referred to as "IGSO"), indium tungsten oxide (InWO: generally referred to as "IWO"), or another semiconductor material, or may include a stacked film of a plurality of semiconductor materials.

The semiconductor layers 21, 22 contain N-type impurities, such as phosphorus (P). The semiconductor layer 12 functions as channel regions and the like of the cell transistors T1, T2 (FIG. 2). The semiconductor layers 21, 22 function as the source/drain layers of the cell transistors T1, T2. The semiconductor layer 21 is connected to the semiconductor layer 12 and the conductive layer 60 or the capacitor electrode 43 disposed below the semiconductor layer 12. The semiconductor layer 22 is connected to the semiconductor layer 12. The semiconductor layer 22 is connected to the capacitor electrode 41 or the conductive layer 60 disposed above the semiconductor layer 12 via the electrode 30.

The gate insulating film 13, for example, may contain aluminum oxide (AlO), zirconium oxide (ZrO), hafnium oxide (HfO), niobium oxide (NbO), tantalum oxide (TaO), barium strontium titanate (BST), lead zirconate titanate (PZT), strontium bismuth tantalate (SBT), or another insulating metal oxide, may contain another insulating material, or may be their mixture, such as ZrHfO, ZrAlO, ZrNbO. The gate insulating film 13 may include a stacked film of a plurality of insulating materials. The gate insulating film 13 may, for example, contain a material similar to that of the insulating film 42.

The conductive sidewall film 14, for example, as illustrated in FIG. 5, extends in the X-direction along both side surfaces in the Y-direction of the plurality of semiconductor layers 12 and insulating layers 11 arranged in the X-direction. The conductive sidewall film 14 functions as the word lines WL and the gate electrodes of the cell transistors T1, T2. The sidewall film 14 may contain, for example, polysilicon (Poly-Si), tungsten (W), tungsten nitride (WN), tungsten silicide (WSi), tungsten silicide nitride (WSiN), molybdenum (Mo), molybdenum nitride (MoN), iridium (Ir), iridium oxide (IrO), ruthenium (Ru), ruthenium oxide (RuO), tantalum nitride (TaN), titanium nitride (TiN), titanium silicide nitride (TiSiN), ruthenium nitride titanium (RuTiN), may contain another conductive material, or may include a stacked film of a plurality of conductive materials.

FIG. 5 illustrates the plurality of word lines WL ( . . . , WLi−2, WLi−1, WLi, WLi+1, WLi+2, WLi+3, . . . ) arranged in the Y-direction. The order of the word lines WL arranged in the Y-direction is represented by i. These plurality of word lines WL extend in the X-direction across the memory cell array region $R_{MCA}$ and the first hook-up regions $R_{HU1}$, $R_{HU2}$.

As illustrated in FIG. 6, for the plurality of word lines WLi, 1st to 6th word lines counted from the +Z-direction to the −Z-direction are word lines WLi(1) to WLi(6).

The word lines WLi(1), WLi(2), for example, correspond to the word line WL0 connected to third terminals (gate terminals) of cell transistors $T\mathbf{1}_{0,0}$ and $T\mathbf{2}_{0,0}$ in the memory cell array 201 in FIG. 2. The word lines WLi(3), WLi(4) correspond to the word line WL1 connected to third terminals (gate terminals) of cell transistors $T\mathbf{1}_{1,0}$ and $T\mathbf{2}_{1,0}$ in the memory cell array 201. The word lines WLi(5), WLi(6) correspond to the word line WLx connected to third terminals (gate terminals) of cell transistors $T\mathbf{1}_{x,0}$ and $T\mathbf{2}_{x,0}$ in the memory cell array 201.

[First Hook-Up Regions $R_{HU1}$, $R_{HU2}$]

For example, as illustrated in FIG. 5, in the first hook-up regions $R_{HU1}$, $R_{HU2}$, end portions in the X-direction of the transistor units TRU and a plurality of contact electrodes CCw, C3*w* are disposed. The contact electrodes CCw are connected to the word lines WL. The contact electrodes C3*w* are disposed in current paths between the contact electrodes CCw and the peripheral circuit 200.

As exemplarily illustrated in FIG. 8, in the first hook-up regions $R_{HU1}$, $R_{HU2}$, the semiconductor layer 12 is not disposed in the transistor unit TRU. The insulating layer 11 disposed in the first hook-up regions $R_{HU1}$, $R_{HU2}$ extends in the X-direction. The gate insulating film 13 and the sidewall film 14 extend in the X-direction along both side surfaces in the Y-direction of the insulating layer 11. The gate insulating film 13 and the sidewall film 14 cover end portions in the X-direction of the insulating layer 11. End portions in the X-direction of the sidewall films 14 are connected to the contact electrodes CCw.

As illustrated in FIG. 5, in the first hook-up region $R_{HU1}$ on a −X-direction side, a plurality (nine in the illustrated example) of the contact electrodes CCw arranged in the X-direction are disposed for 2n-th (n is an integer of 1 or more) word lines WL counted from the +Y-direction. In the first hook-up region $R_{HU1}$, a plurality (nine in the illustrated example) of the contact electrodes C3*w* arranged in the X-direction are disposed for 2n−1-th word lines WL counted from the +Y-direction.

As illustrated in FIG. 5, in the first hook-up region $R_{HU2}$ on a +X-direction side, the plurality (nine in the illustrated example) of contact electrodes CCw arranged in the X-direction are disposed for 2n−1-th word lines WL counted from the +Y-direction. In the first hook-up region $R_{HU2}$, the plurality (nine in the illustrated example) of contact electrodes C3*w* arranged in the X-direction are disposed for 2n-th word lines WL counted from the +Y-direction.

For example, as illustrated in FIG. 6, for the plurality of contact electrode C3*w*, 1st to 3rd contact electrodes counted from the −X-direction to the +X-direction are contact electrodes C3*w*(1) to C3*w*(3), respectively. For the plurality of contact electrodes CCw, 1st to 3rd contact electrodes counted from the −X-direction to the +X-direction are contact electrodes CCw(1) to CCw(3), respectively.

Three contact electrodes C3*w*(1), C3*w*(2), C3*w*(3) are disposed in the first hook-up regions $R_{HU1}$ on the −X-direction side in the memory cell array layer $L_{MCA}$. Three contact electrodes CCw(1), CCw(2), CCw(3) are disposed in the first hook-up region $R_{HU2}$ on the +X-direction side in the memory cell array layer $L_{MCA}$.

The contact electrode CCw(1) aligned in the X-direction with the word lines WLi has a side surface connected to the word line WLi(1), has a lower end connected to the word line WLi(2), and has an upper end connected to the wiring m0$w$ in the wiring layer M0. The contact electrode CCw(2) aligned in the X-direction with the word lines WLi has a side surface connected to the word line WLi(3), has a lower end connected to the word line WLi(4), and has an upper end connected to the wiring m0$w$ in the wiring layer M0. The contact electrode CCw(3) aligned in the X-direction with the word lines WLi has a side surface connected to the word line WLi(5), has a lower end connected to the word line WLi(6), and has an upper end connected to the wiring m0$w$ in the wiring layer M0.

The contact electrodes C3$w$(1), C3$w$(2), C3$w$(3) aligned in the X-direction with the word lines WLi are each connected to the wiring m0$w$ in the wiring layer M0 at upper ends and are connected to the wiring d2 in the wiring layer D2 at lower ends.

As partly illustrated in FIG. 5, in the first hook-up regions $R_{HU1}$, as the contact electrodes CCw aligned in the X-direction with the word lines WLi+1, the contact electrodes CCw(1), CCw(2), CCw(3) are disposed and are connected to the word lines WLi+1. That is, the contact electrode CCw(3) aligned in the X-direction with the word lines WLi+1 has a side surface connected to the word line WLi+1(1), has a lower end connected to the WLi+1(2), and has an upper end connected to the wiring m0$w$ in the wiring layer M0. The contact electrode CCw(2) aligned in the X-direction with the word lines WLi+1 has a side surface connected to the word line Wli+1(3), has a lower end connected to the word line WLi+1(4), and has an upper end connected to the wiring m0$w$ in the wiring layer M0. The contact electrode CCw(1) aligned in the X-direction with the word lines WLi+1 has a side surface connected to the word line WLi+1(5), has a lower end connected to the word line WLi+1(6), and has an upper end connected to the wiring m0$w$ in the wiring layer M0.

In the first hook-up region $R_{HU2}$, as contact electrodes C3$w$ aligned in the X-direction with the word lines WLi+1, the contact electrodes C3$w$(1), C3$w$(2), C3$w$(3) are disposed. These contact electrodes C3$w$(1), C3$w$(2), C3$w$(3) each have an upper end connected to the wiring m0$w$ in the wiring layer M0 and a lower end connected to the wiring d2 in the wiring layer D2.

As illustrated in FIG. 5, the contact electrodes C3$w$(1), C3$w$(2), C3$w$(3), CCw(1), CCw(2), CCw(3) aligned in the X-direction with the word lines WLi are respectively connected to the contact electrodes CCw(1), CCw(2), CCw(3), C3$w$(1), C3$w$(2), C3$w$(3) aligned in the X-direction with the word lines WLi+1 via the wiring m0$w$ in the wiring layer M0.

With such a configuration, the word lines WLi(1), WLi(2) are connected to the wiring d2 in the wiring layer D2 through the contact electrode CCw(1) aligned in the X-direction with the word lines WLi, the wiring m0$w$ in the wiring layer M0, and the contact electrode C3$w$(1) aligned in the X-direction with the word lines WLi+1. The word lines WLi(3), WLi(4) are connected to the wiring d2 in the wiring layer D2 through the contact electrode CCw(2) aligned in the X-direction with the word lines WLi, the wiring m0$w$ in the wiring layer M0, and the contact electrode C3$w$(2) aligned in the X-direction with the word lines WLi+1. The word lines WLi(5), WLi(6) are connected to the wiring d2 in the wiring layer D2 through the contact electrode CCw(3) aligned in the X-direction with the word lines WLi, the wiring m0$w$ in the wiring layer M0, and the contact electrode C3$w$(3) aligned in the X-direction with the word lines WLi+1.

The word lines WLi+1(1), WLi+1(2) are connected to the wiring d2 in the wiring layer D2 through the contact electrode CCw(3) aligned in the X-direction with the word lines WLi+1, the wiring m0$w$ in the wiring layer M0, and the contact electrode C3$w$(3) aligned in the X-direction with the word lines WLi. The word lines WLi+1(3), WLi+1(4) are connected to the wiring d2 in the wiring layer D2 through the contact electrode CCw(2) aligned in the X-direction with the word lines WLi+1, the wiring m0$w$ in the wiring layer M0, and the contact electrode C3$w$(2) aligned in the X-direction with the word lines WLi. The word lines WLi+1(5), WLi+1(6) are connected to the wiring d2 in the wiring layer D2 through the contact electrode CCw(1) aligned in the X-direction with the word lines WLi+1, the wiring m0$w$ in the wiring layer M0, and the contact electrode C3$w$(1) aligned in the X-direction with the word lines WLi.

With such a configuration, the word lines WL in each of the array structures AS can be connected to the wiring d2 in the wiring layer D2 by individual array structure AS, and two word lines WL in each of the array structures AS also can be electrically connected. This ensures connecting the third terminals (the gate terminals) of the two cell transistors T1, T2 in the memory cell MC. The areas of the first hook-up regions $R_{HU1}$, $R_{HU2}$ can be reduced.

[Second Hook-Up Regions $R_{HU3}$, $R_{HU4}$]

For example, as illustrated in FIG. 5, in the second hook-up regions $R_{HU3}$, $R_{HU4}$, end portions in the Y-direction of the bit lines BL and a plurality of contact electrodes CCb are disposed. The contact electrodes CCb are connected to the end portions in the Y-direction of the bit lines BL.

In the second hook-up regions $R_{HU3}$ on a −Y-direction side, a plurality (three in the illustrated example) of the contact electrodes CCb are disposed corresponding to the plurality of bit lines BL arranged in the X-direction.

In the second hook-up region $R_{HU4}$ on a +Y-direction side, a plurality (three in the illustrated example) of the contact electrodes CCb are disposed corresponding to the plurality of bit lines BL arranged in the X-direction.

For example, as illustrated in FIG. 7, for the plurality of contact electrodes CCb, a 1st contact electrode counted from the −Y-direction to the +Y-direction is a contact electrode CCb(1), and a 2nd contact electrode is a contact electrode CCb(2).

The contact electrode CCb(1) is disposed in the second hook-up regions $R_{HU3}$ on the −Y-direction side in the memory cell array layer $L_{MCA}$. The contact electrode CCb (1) has a side surface connected to the bit lines BLj(2), BLj(4), BLj(6), and has a lower end connected to the wiring d2 in the wiring layer D2.

The contact electrode CCb(2) is disposed in the second hook-up region $R_{HU4}$ on the +Y-direction side in the memory cell array layer $L_{MCA}$. The contact electrode CCb (2) has a side surface connected to the bit lines BLj(1), BLj(3), BLj(5), and has a lower end connected to the wiring d2 in the wiring layer D2.

With such a configuration, the contact electrodes CCb ensure connecting the bit lines BL-T in each of the array structures AS in common to the wiring d2 in the wiring layer D2, and also ensure connecting the bit lines BL-C in each of the array structures AS in common to the wiring d2 in the wiring layer D2.

[Wiring Layers M0, M1, M2]

For example, as illustrated in FIG. 6 and FIG. 7, the plurality of wirings included in the wiring layers M0, M1, M2 are, for example, electrically connected to at least one of the configuration in the memory cell array 201 and the configuration in the peripheral circuit 200.

The wiring layer M0 includes a plurality of wirings m0. These plurality of wirings m0 may, for example, include a stacked film or the like of a barrier conductive film of, for example, titanium nitride (TiN), tantalum nitride (TaN), and a metallic film of, for example, copper (Cu). Note that, in FIG. 5 and FIG. 6, parts of the plurality of wirings m0 is exemplarily illustrated as the wirings m0*w*. The plurality of wirings m0*w* are disposed in the first hook-up regions $R_{HU1}$, $R_{HU2}$, and connect the contact electrodes CCw to C3*w*.

The wiring layer M1 includes a plurality of wirings m1. These plurality of wirings m1 may, for example, include a stacked film or the like of a barrier conductive film of, for example, titanium nitride (TiN), tantalum nitride (TaN), and a metallic film of, for example, copper (Cu).

The wiring layer M2 includes a plurality of wirings m2. These plurality of wirings m2 may, for example, include a stacked film or the like of a barrier conductive film of, for example, titanium nitride (TiN), tantalum nitride (TaN), and a metallic film of, for example, copper (Cu), aluminum (Al).

[Detailed Structure of Contact Electrodes CCw, CCb]

Next, with reference to FIG. 8 to FIG. 11, structures at contact areas between the word lines WL and the contact electrodes CCw and structures at contact areas between the bit lines BL and the contact electrodes CCb will be described.

In order to achieve a reduced chip size and high density of elements of the semiconductor memory device 1, it has been desired to form a fine wiring pattern with a small dimension in line width or pitch. In this embodiment, for example, as illustrated in FIG. 10, the semiconductor layer 12 of the word line WL has a width w12 (a length in the Y-direction) formed to be smaller than a height h12 (a length in the Z-direction) of the semiconductor layer 12. For example, as illustrated in FIG. 11, the insulating layer 11 (the core material) of the word line WL, similarly to the semiconductor layer 12, also has the width w12 (the length in the Y-direction) formed to be smaller than the height h12 (the length in the Z-direction) of the insulating layer 11.

As illustrated in FIG. 8 and FIG. 9, a position of an end portion in the X-direction of the core material of the word line WLi(3) is shifted in the +X-direction by the length "w1" with respect to a position of an end portion in the X-direction of the core material of the word line WLi(4). For example, as illustrated in FIG. 9, the word lines WLi(3), WLi(4) have widths (film thicknesses) of the sidewall film 14 at the end portions in the X-direction of a length "w2". Note that, the word line WL also has a width of the sidewall film 14 on both side surfaces in the Y-direction of the length "w2". The width of the sidewall film 14 at the end portion in the X-direction of the word line WLi(3) may be approximately the same as the width of the sidewall film 14 at the end portion in the X-direction of the WLi(4). The width of the sidewall film 14 on both the side surfaces in the Y-direction of the word line WLi(3) may also be approximately the same as the width of the sidewall film 14 on both the side surfaces in the Y-direction of the word line WLi(4).

The contact electrode CCw includes, as illustrated in FIG. 9, a first part S1 that overlaps with the word line WLi(3) viewing from the Z-direction and a second part S2 that does not overlap with the word line WLi(3) viewing from the Z-direction. The first part S1 is in contact with an upper surface of the sidewall film 14 corresponding to the word line WLi(3). The second part S2 is in contact with a side surface in the X-direction of the sidewall film 14 corresponding to the word line WLi(3) and the upper surface of the sidewall film 14 corresponding to the word line WLi(4).

The contact electrodes CCw are generally formed after the word lines WL. In forming the contact electrodes CCw, for example, contact holes extending in the Z-direction are formed and conductive layers are formed inside these contact holes. Forming of the contact holes is performed, for example, by Reactive Ion Etching (RIE). The contact holes are, for example, formed over a range in which a part overlaps with the word line WL(3) and a part does not overlap with the word line WL(3) viewing from the Z-direction. Here, the word line WL(3) functions as an etching stopper. Therefore, among the contact holes, parts disposed above the word line WL(3) are formed in both the part overlapping and the part not overlapping with the word line WL(3), and therefore, the parts disposed above the word line WL(3) have comparatively large diameters. On the other hand, parts disposed below the word line WL(3) are formed in the part not overlapping with the word line WL(3), and therefore, the parts disposed below the word line WL(3) have comparatively small diameters.

With such a configuration, the contact electrodes CCw can connect the plurality of word lines WL arranged in the Z-direction. Since a cross-sectional surface of the core material of the word line WL is formed to have the height h12 of the core material longer than the width w12 of the core material, an area of the side surface of the sidewall film 14 of the word line WL is large. Therefore, a contacted area between the contact electrode CCw and the sidewall film 14 of the word line WL increases to decrease a resistance in the contact area between the contact electrode CCw and the sidewall film 14 of the word line WL.

For example, as illustrated in FIG. 7 and FIG. 10, the contact electrode CCb is in contact with the upper surface and the side surface of the end portion in the Y-direction of the bit line BL in each stage.

The contact electrodes CCb are generally formed after the bit lines BL. In forming the contact electrodes CCb, for example, contact holes extending in the Z-direction are formed and conductive layers are formed inside these contact holes. Forming of the contact holes is performed, for example, by RIE. The contact holes are, for example, formed over a range in which a part overlaps with the bit line BL and a part does not overlap with the bit line BL viewing from the Z-direction. Here, the bit lines BL function as an etching stopper. Therefore, among the contact holes, parts disposed above the bit line BL are formed in both the part overlapping and the part not overlapping with the bit line BL, and therefore, the parts disposed above the bit line BL have comparatively large diameters. On the other hand, parts disposed below the bit line BL are formed in the part not overlapping with the bit line BL, and therefore, the parts disposed below the bit line BL have comparatively small diameters.

First Modification of First Embodiment

Figure 12:
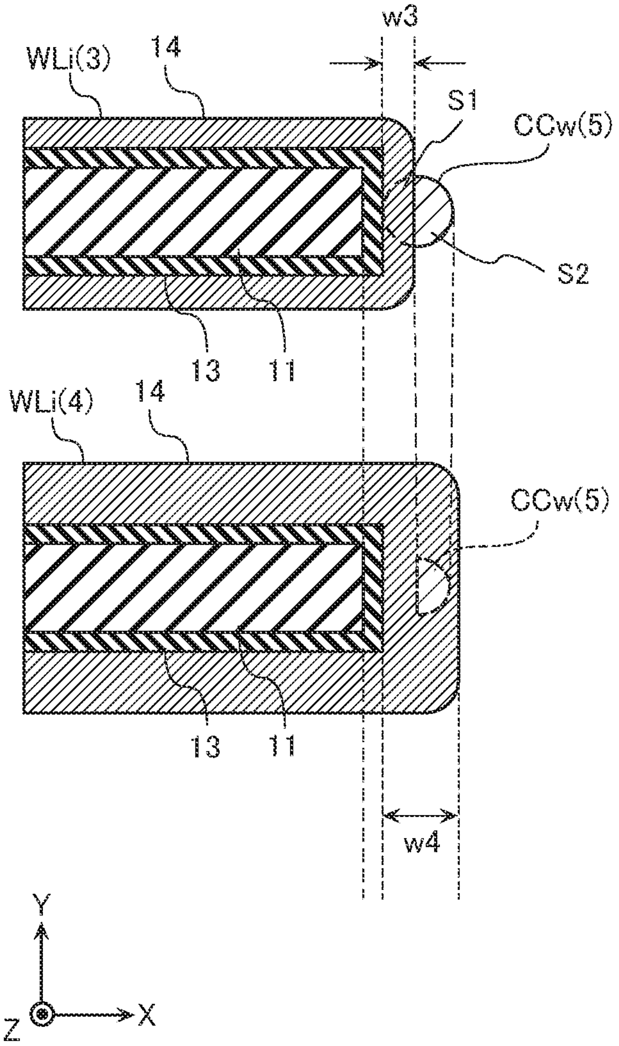
FIG. 12 is a schematic cross-sectional view illustrating a modification of the structure illustrated in FIG. 9.

Next, with reference to FIG. 12, a structure of a modification of the contact area between the word line WL and the contact electrode CCw will be described. FIG. 12 is a schematic cross-sectional view illustrating the modification of the structure illustrated in FIG. 9. Note that, in FIG. 12, the same reference numerals are attached for the same configurations as those in FIG. 9, and the description of the configuration is omitted.

For example, as illustrated in FIG. 12, a position of the end portion in the X-direction of the core material of the word line WLi(3) is the same as a position of the end portion in the X-direction of the core material of the word line WLi(4). Note that, the position of the end portion in the X-direction of the core material of the word line WLi(3) may be approximately the same as the position of the end portion in the X-direction of the core material of the word line WLi(4).

The word line WLi(3) has a width (a film thickness) of the sidewall film 14 at the end portion in the X-direction of a length "w3". The word line WLi(4) has a width of the sidewall film 14 at the end portion in the X-direction of a length "w4". Note that, the word line WLi(3) also has a width of the sidewall film 14 on both the side surfaces in the Y-direction of the length "w3". The word line WLi(4) also has a width of the sidewall film 14 on both the side surfaces in the Y-direction of the length "w4". The length "w4" is larger than the length "w3".

The sidewall films 14 have different widths in the word line WLi(3) and in the word line WLi(4). The width of the sidewall film 14 is subject to adjustment, for example, by etching, such as RIE. For example, the word line WLi(3) is etched more than the word line WLi(4). Note that, the width of the sidewall film 14 may have the thickness of the film adjusted when the film is formed by method, such as Chemical Vapor Deposition (CVD).

The widths of the sidewall films 14 are different in the word lines WLi(3) and WLi(4), and thus, the positions of the end portions in the X-direction of the sidewall films 14 are also different in the word lines WLi(3) and WLi(4). For example, the sidewall film 14 at the end portion in the X-direction of the word line WLi(3) in the upper side is in contact with the contact electrode CCw on the upper surface and the side surface. The sidewall film 14 at the end portion in the X-direction of the word line WLi(4) in the lower side is in contact with the contact electrode CCw on the upper surface.

The contact electrode CCw has the first part S1 that overlaps with the word line WLi(3) viewing from the Z-direction and the second part S2 that does not overlap with the word line WLi(3) viewing from the Z-direction. The first part S1 is in contact with the upper surface of the sidewall film 14 corresponding to the word line WLi(3). The second part S2 is in contact with the side surface in the X-direction of the sidewall film 14 corresponding to the word line WLi(3) and the upper surface of the sidewall film 14 corresponding to the word line WLi(4).

Even in such a configuration, the plurality of word lines WL in which the contact electrodes CCw are arranged in the Z-direction can be connected. The contacted area between the contact electrode CCw and the sidewall film 14 of the word line WL increases to decrease a resistance in the contact area between the contact electrode CCw and the sidewall film 14 of the word line WL.

Second Modification of First Embodiment

Figure 13:
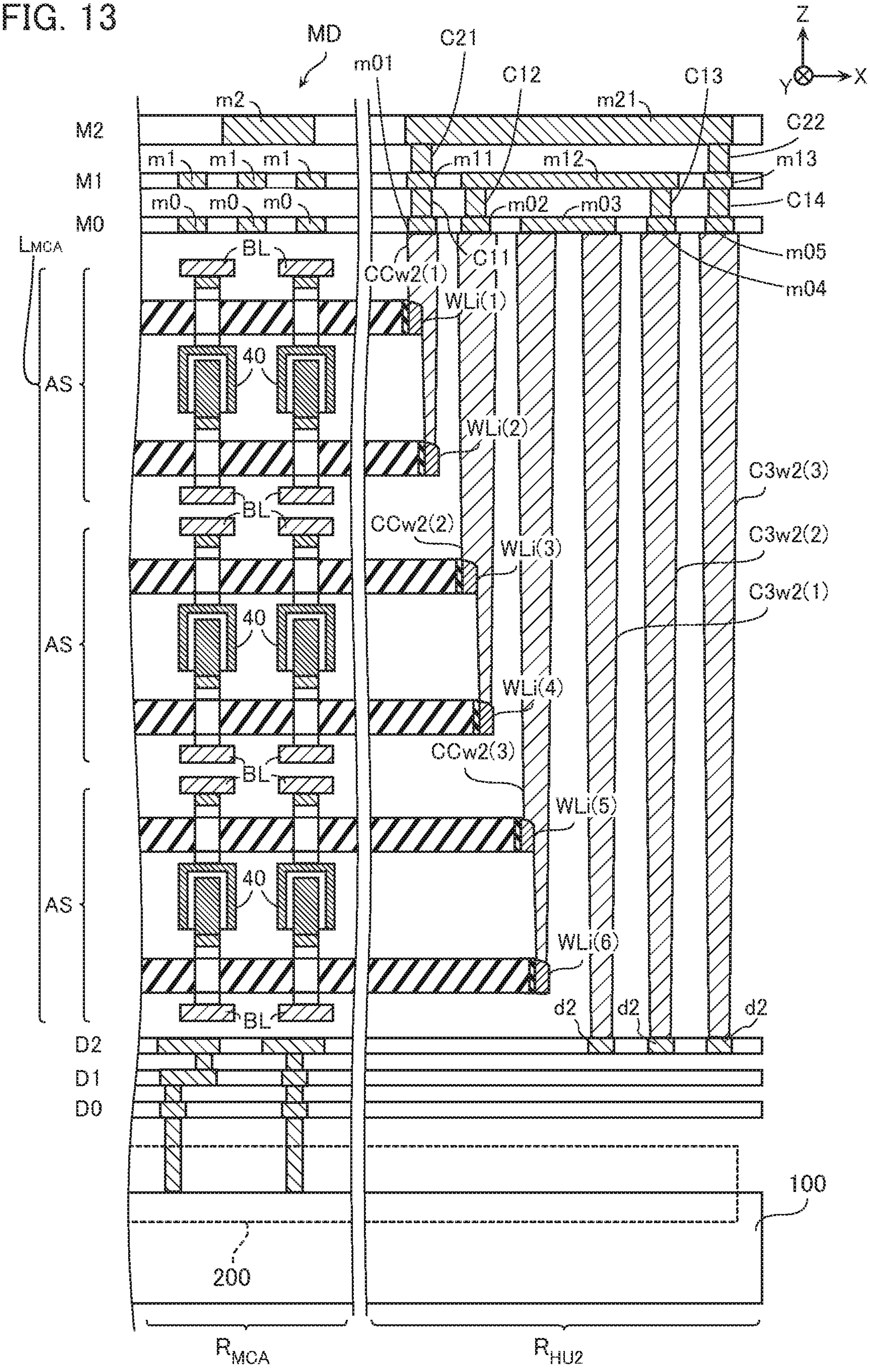
FIG. 13 is a schematic cross-sectional view illustrating a modification of the structure illustrated in FIG. 6.

Next, with reference to FIG. 13, a modification of an arrangement structure of the contact electrodes CCw will be described. FIG. 13 is a schematic cross-sectional view illustrating the modification of the structure illustrated in FIG. 6.

In the memory die MD in the above-described first embodiment, the two hook-up regions $R_{HU1}$, $R_{HU2}$ are disposed on both the sides in the X-direction of the memory cell array region $R_{MCA}$. In the hook-up region $R_{HU1}$ on one hand, a row of three contact electrodes CCw arranged in the X-direction and a row of three contact electrodes C3*w* arranged in the X-direction are alternately disposed in the Y-direction. Also in the hook-up region $R_{HU2}$ on the other hand, a row of three contact electrodes CCw arranged in the X-direction and a row of three contact electrodes C3*w* arranged in the X-direction are alternately disposed in the Y-direction.

On the other hand, in the memory die MD in the second modification, one hook-up region is disposed on one side in the X-direction of the memory cell array region $R_{MCA}$. In the one hook-up region, a row of six contact electrodes (three contact electrodes CCw2 and three contact electrodes C3*w*2) arranged in the X-direction is disposed. The row of these six contact electrodes CCw2, C3*w*2 is arranged in the Y-direction corresponding to the word line WL.

For example, as illustrated in FIG. 13, in the memory cell array layer $L_{MCA}$, a plurality of the contact electrodes CCw2, C3*w*2 extending in the Z-direction are disposed in the first hook-up region $R_{HU2}$. For the plurality of contact electrodes CCw2, 1st to 3rd contact electrodes counted from the −X-direction to the +X-direction are contact electrodes CCw2(1) to CCw2(3), respectively.

The plurality of contact electrodes C3*w*2 are disposed on the +X-direction side of the plurality of contact electrodes CCw2. For the plurality of contact electrodes C3*w*2, 1st to 3rd contact electrodes counted from the −X-direction to the +X-direction are contact electrodes C3*w*2(1) to C3*w*2(3), respectively.

The contact electrode CCw2 is basically configured similarly to the contact electrode CCw. However, the contact electrode CCw2(1) to the contact electrode CCw2(3) have upper ends connected to wirings m01, m02, m03 as parts of the above-described wirings m0, respectively.

The contact electrode C3*w*2 is basically configured similarly to the contact electrode C3*w*. However, the contact electrode C3*w*2(1) to the contact electrode C3*w*2(3) have upper ends connected to wirings m03, m04, m05 as parts of the above-described wirings m0, respectively.

The word lines WLi(1), WLi(2) are connected to the wiring d2 in the wiring layer D2 through the contact electrode CCw2(1), the wiring m01 in the wiring layer M0, a contact C11, a wiring m11 in the wiring layer M1, a contact C21, a wiring m21 in the wiring layer M2, a contact C22, a wiring m13 in the wiring layer M1, a contact C14, a wiring m05 in the wiring layer M0, and the contact electrode C3*w*2(3).

The word lines WLi(3), WLi(4) are connected to the wiring d2 in the wiring layer D2 through the contact electrode CCw2(2), the wiring m02 in the wiring layer M0, a contact C12, a wiring m12 in the wiring layer M1, a contact C13, a wiring m04 in the wiring layer M0, and the contact electrode C3*w*2(2).

The word lines WLi(5), WLi(6) are connected to the wiring d2 in the wiring layer D2 through the contact electrode CCw2(3), the wiring m03 of the wiring layer M0, and the contact electrode C3*w*2(1).

With such a configuration, the word lines WL in each of the array structures AS can be connected to the wiring d2 in the wiring layer D2 by individual array structure AS, and two word lines WL in each of the array structures AS also can be electrically connected. This ensures connecting the third terminals (the gate terminals) of the two cell transistors T1, T2 in the memory cell MC. Using the contact electrodes CCw2, C3*w*2 of one first hook-up region ensures electrically connecting the word lines WL to the peripheral circuit 200.

Note that, in the example in FIG. 13, using the contact electrodes CCw2, C3*w*2 disposed in the first hook-up region $R_{HU2}$, the word lines WL are electrically connected to the peripheral circuit 200. However, using the contact electrodes CCw2, C3*w*2 disposed in the first hook-up region $R_{HU1}$, the word lines WL may be electrically connected to the peripheral circuit 200. The first hook-up region without the contact electrodes CCw2, C3*w*2 may be removed.

Second Embodiment

[Structure of Memory Cell Array 201 and Contact Electrodes]

Figure 14:
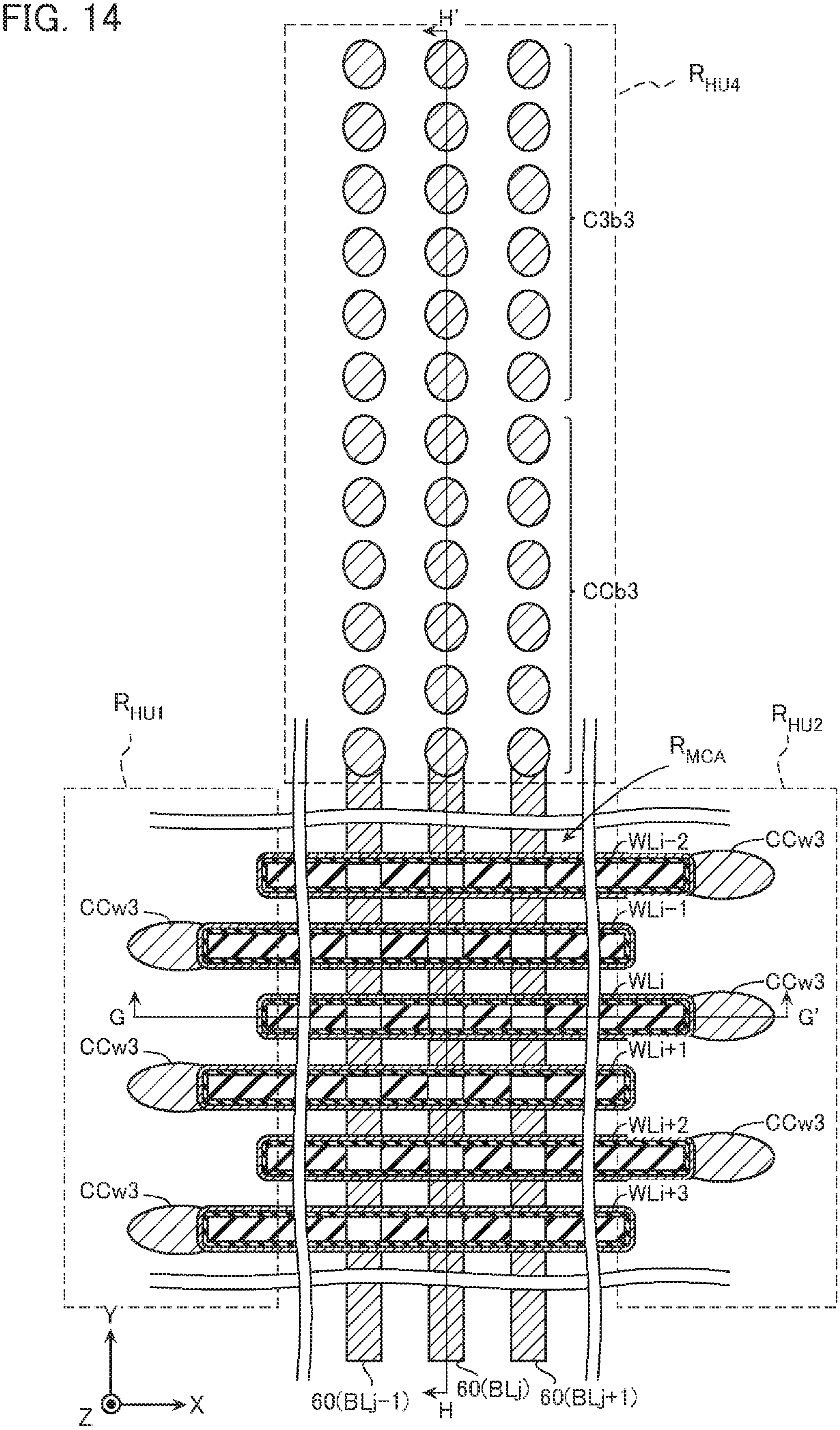
FIG. 14 is a schematic plan view illustrating an exemplary configuration of a memory cell array and contact electrodes according to a second embodiment.
Figure 15:
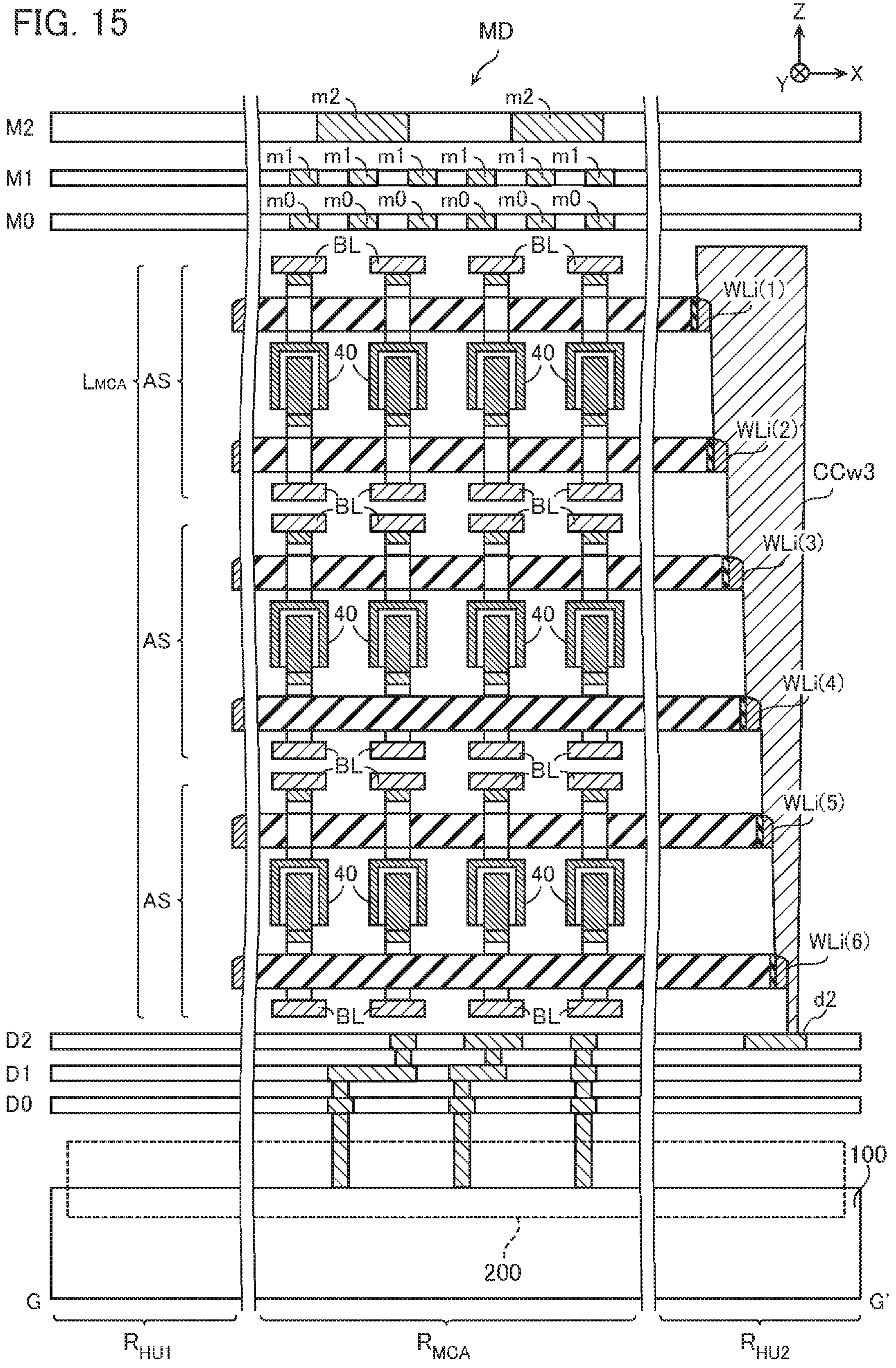
FIG. 15 is a schematic cross-sectional view of the structure illustrated in FIG. 14 taken along the line G-G', and viewed along a direction of the arrow.
Figure 16:
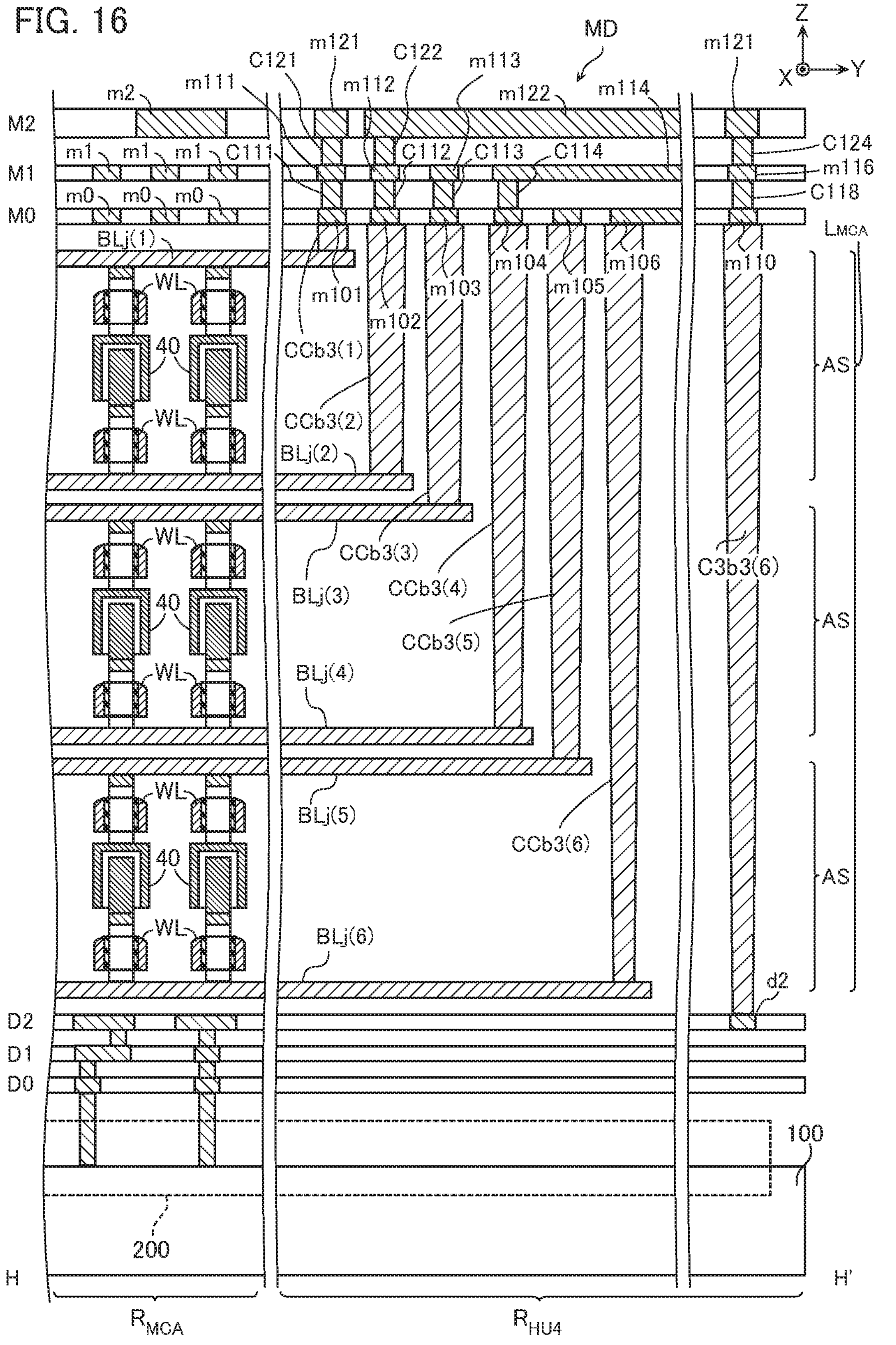
FIG. 16 is a schematic cross-sectional view of the structure illustrated in FIG. 14 taken along the line H-H', and viewed along a direction of the arrow.
Figure 17:
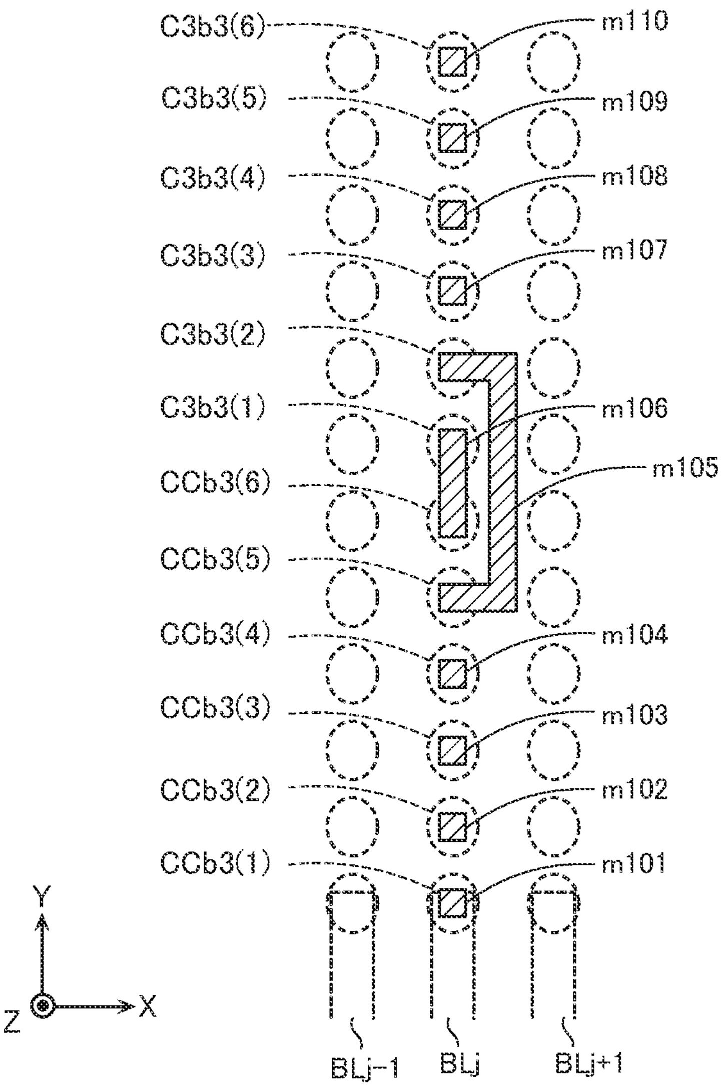
FIG. 17 is a schematic diagram illustrating a configuration of an upper layer wiring in a hook-up region illustrated in FIG. 16.
Figure 18:
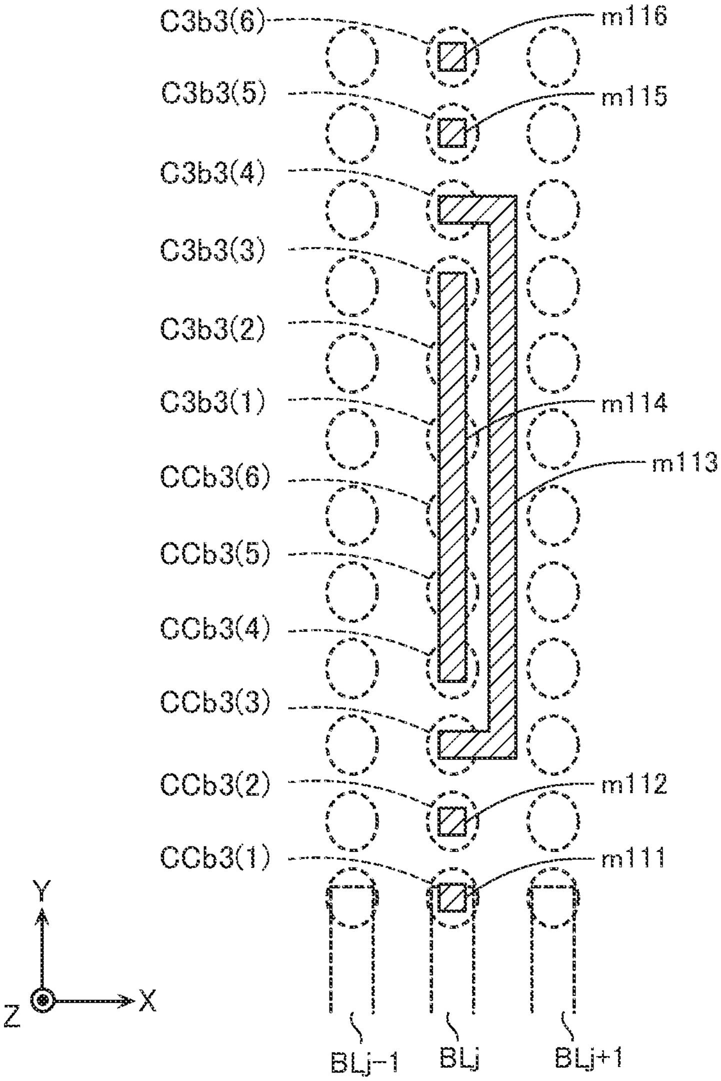
FIG. 18 is a schematic diagram illustrating the configuration of the upper layer wiring in the hook-up region illustrated in FIG. 16.
Figure 19:
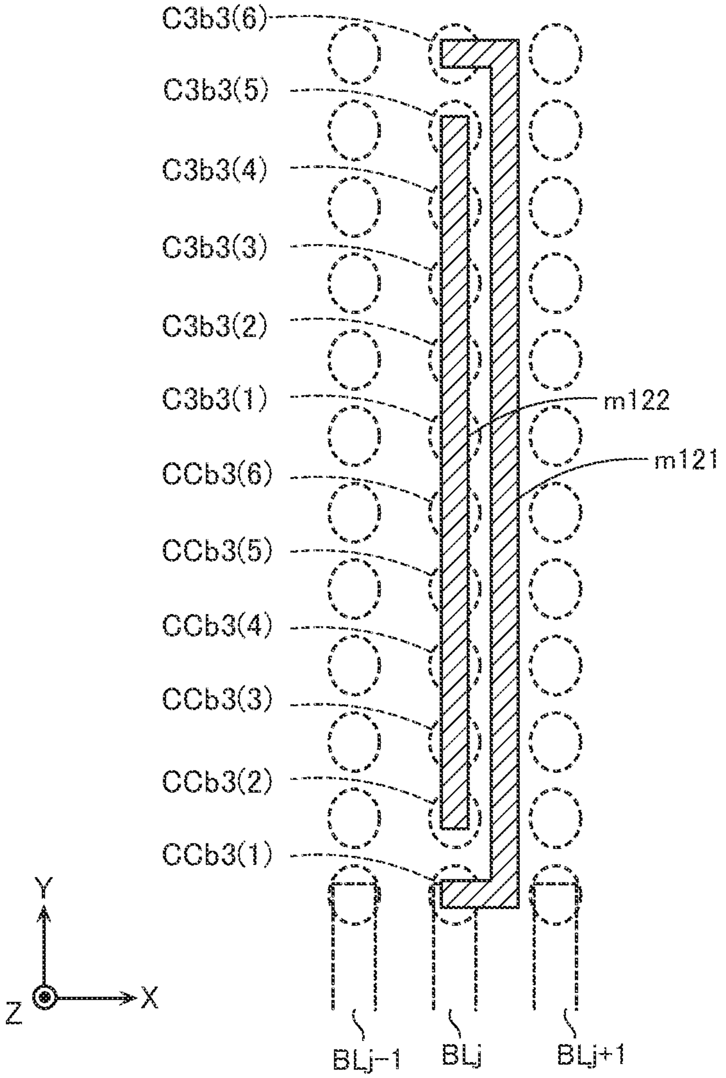
FIG. 19 is a schematic diagram illustrating the configuration of the upper layer wiring in the hook-up region illustrated in FIG. 16.

FIG. 14 is a schematic plan view illustrating an exemplary configuration of the memory cell array 201 and contact electrodes according to a second embodiment. FIG. 15 is a schematic cross-sectional view of the structure illustrated in FIG. 14 taken along the line G-G', and viewed along a direction of the arrow. FIG. 16 is a schematic cross-sectional view of the structure illustrated in FIG. 14 taken along the line H-H', and viewed along a direction of the arrow. FIG. 17 to FIG. 19 are schematic diagram illustrating a configuration of an upper layer wiring in the hook-up region illustrated in FIG. 16.

Note that, FIG. 17 illustrates a configuration of the wirings in the wiring layer M0, FIG. 18 illustrates a configuration of the wirings in the wiring layer M1, and FIG. 19 illustrates a configuration of the wirings in the wiring layer M2.

In FIG. 15 and FIG. 16, the insulating layer (for example, the inter-layer insulating film) covering the components of the memory die MD is not illustrated. In FIG. 14 to FIG. 16, the same reference numerals are attached for the same configurations as those in FIG. 5 to FIG. 7, and the description of the configuration is omitted.

Each of the memory cells MC in the memory cell array 201 in the second embodiment is configured of two cell transistors and one cell capacitor (2T1C).

For example, as illustrated in FIG. 14 and FIG. 15, in each of the first hook-up regions $R_{HU1}$, $R_{HU2}$, the contact electrodes CCw3 extending in the Z-direction are disposed. As illustrated in FIG. 15, the contact electrode CCw3 aligned in the X-direction with the word lines WLi is disposed in the first hook-up region $R_{HU2}$. The contact electrode CCw3 aligned in the X-direction with the word lines WLi has a side surface connected to the word lines WLi(1), WLi(2), WLi(3), WLi(4), WLi(5), WLi(6), and has a lower end connected to the wiring d2 in the wiring layer D2.

While it is not illustrated, the contact electrode CCw3 aligned in the X-direction with the word lines WLi+1 is disposed in the first hook-up region $R_{HU1}$. The contact electrode CCw3 aligned in the X-direction with the word lines WLi+1 has a side surface connected to the word lines WLi+1(1), WLi+1(2), WLi+1(3), WLi+1(4), WLi+1(5), WLi+1(6), and has a lower end connected to the wiring d2 in the wiring layer D2.

The contact electrode CCw3 connects the word lines WL of each of the array structures AS in common to the wiring d2 in the wiring layer D2.

As illustrated in FIG. 14, among the plurality of word lines WL, 2n−1-th (n is an integer of 1 or more) word lines WL (that is, odd-numbered word lines WL) counted from the +Y-direction are connected to the contact electrodes CCw3 disposed in the first hook-up region $R_{HU2}$ on the +X-direction side. Among the plurality of word lines WL, 2n-th word lines WL (that is, even-numbered word lines WL) counted from the +Y-direction are connected to the contact electrodes CCw3 disposed in the first hook-up region $R_{HU1}$ on the −X-direction side.

For example, as illustrated in FIG. 14 and FIG. 16, in the second hook-up region $R_{HU4}$, a plurality of contact electrodes CCb3, C3*w*3 extending in the Z-direction are disposed. For the plurality of contact electrodes CCb3, m-th contact electrodes counted from the −Y-direction to the +Y-direction are contact electrodes CCb3(*m*). m is numbers of 1 to 6. Also for a plurality of contact electrodes C3*b*3, m-th contact electrodes counted from the −Y-direction to the +Y-direction are contact electrodes C3*b*3(*m*). m is numbers of 1 to 6.

For example, as illustrated in FIG. 16 and FIG. 17, a contact electrode CCb3(1) to a contact electrode CCb3(6) have lower ends connected to the bit line BLj(1) to the bit line BLj(6), respectively, and have upper ends connected to wirings m101 to m106, respectively, in the wiring layer M0, respectively.

A contact electrode C3*b*3(1) to a contact electrode C3*b*3(6) have upper ends connected to wirings m106, m105, m107 to m110 in the wiring layer M0, respectively, and have lower ends connected to the wiring d2 in the wiring layer D2, respectively.

For example, as illustrated in FIG. 16 and FIG. 17, the bit line BLj(6) is connected to the wiring d2 in the wiring layer D2 through the contact electrode CCb3(6), the wiring m106 in the wiring layer M0, and the contact electrode C3*b*3(1). The bit line BLj(5) is connected to the wiring d2 in the wiring layer D2 through the wiring m105 in the wiring layer M0 and the contact electrode C3*b*3(2).

For example, as illustrated in FIG. 16 and FIG. 18, the bit line BLj(4) is connected to the wiring d2 in the wiring layer D2 through the contact electrode CCb3(4), the wiring m104 in the wiring layer M0, a contact C114, a wiring m114 in the wiring layer M1, a contact that is not illustrated, the wiring m107 in the wiring layer M0, and the contact electrode C3*b*3(3).

For example, as illustrated in FIG. 16 and FIG. 18, the bit line BLj(3) is connected to the wiring d2 in the wiring layer D2 through the contact electrode CCb3(3), the wiring m103 in the wiring layer M0, a contact C113, a wiring m113 in the wiring layer M1, a contact that is not illustrated, the wiring m108 in the wiring layer M0, and the contact electrode C3*b*3(4).

For example, as illustrated in FIG. 16 and FIG. 19, the bit line BLj(2) is connected to the wiring d2 in the wiring layer D2 through the contact electrode CCb3(2), the wiring m102 in the wiring layer M0, a contact C112, a wiring m112 in the wiring layer M1, a contact C122, a wiring m122 in the wiring layer M2, a contact that is not illustrated, a wiring m115 in the wiring layer M1, a contact that is not illustrated, the wiring m109 in the wiring layer M0, and the contact electrode C3*b*3(5).

For example, as illustrated in FIG. 16 and FIG. 19, the bit line BLj(1) is connected to the wiring d2 in the wiring layer D2 through the contact electrode CCb3(1), the wiring m101 in the wiring layer M0, a contact C111, a wiring m111 in the wiring layer M1, a contact C121, a wiring m121 in the wiring layer M2, a contact C124, a wiring m116 in the wiring layer M1, a contact C118, the wiring m110 in the wiring layer M0, and the contact electrode C3*b*3(6).

The contact electrodes CCb3, C3*b*3 connect the bit lines BL-T, BL-C in each of the array structures AS to the wiring d2 in the wiring layer D2 by individual array structure AS.

Note that, in the example in FIG. 14 and FIG. 15, the contact electrodes CCw3 are disposed in the first hook-up regions $R_{HU1}$, $R_{HU2}$ on both the sides. However, the contact electrodes CCw3 may be disposed in the first hook-up region on one side (any one of the first hook-up regions $R_{HU1}$, $R_{HU2}$). In the example in FIG. 14 and FIG. 16, the contact electrodes CCb3, C3b3 are disposed in the second hook-up region $R_{HU4}$ on one side. However, the contact electrodes CCb3 may be disposed in the second hook-up regions $R_{HU3}$ on the opposite side or may be disposed in the second hook-up regions $R_{HU3}$, $R_{HU4}$ on both the sides.

Third Embodiment

[Structure of Memory Cell Array 201 and Contact Electrodes]

Figure 20:
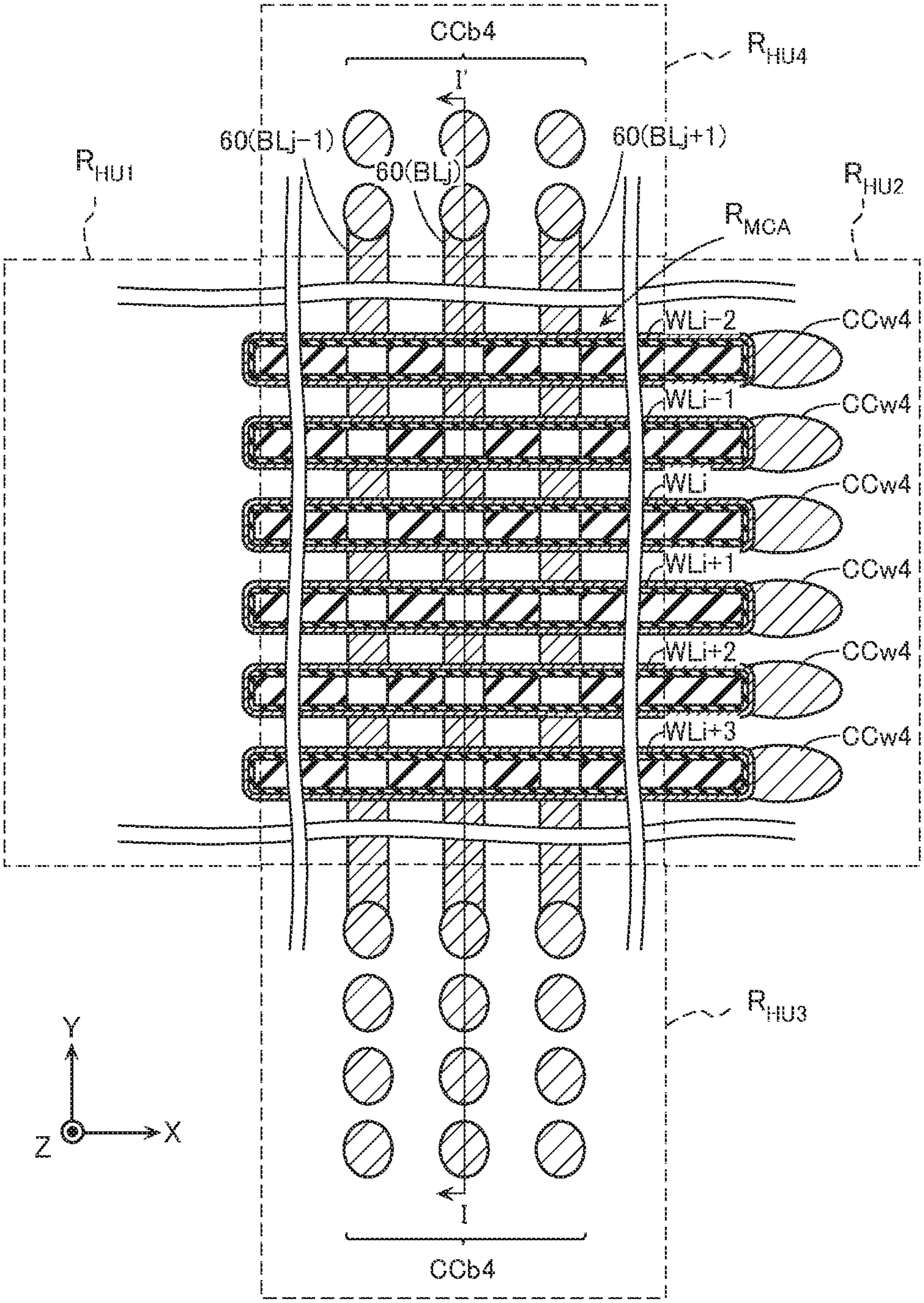
FIG. 20 is a schematic plan view illustrating an exemplary configuration of a memory cell array and contact electrodes according to a third embodiment.
Figure 21:
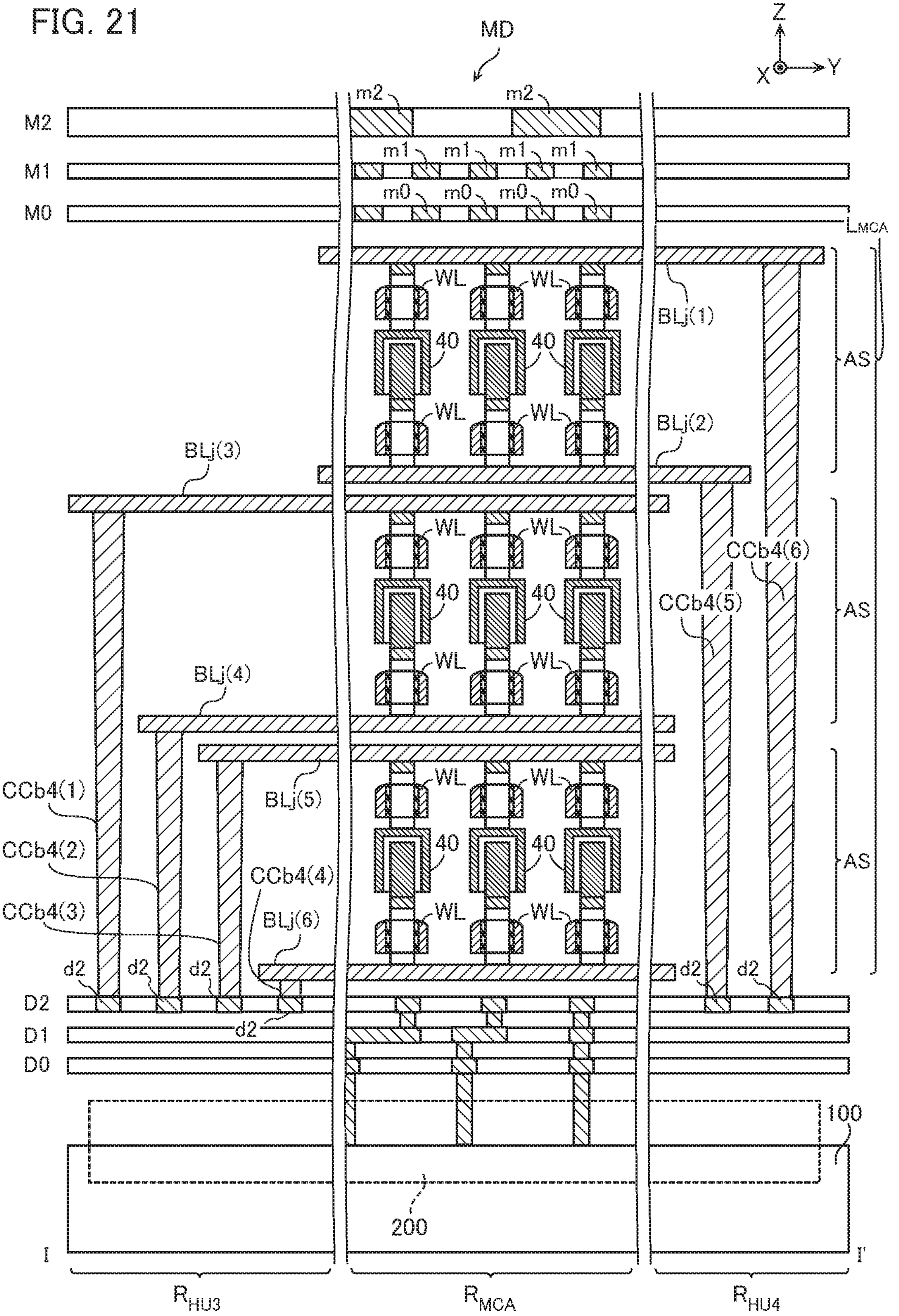
FIG. 21 is a schematic cross-sectional view of the structure illustrated in FIG. 20 taken along the line I-I', and viewed along a direction of the arrow.

FIG. 20 is a schematic plan view illustrating an exemplary configuration of the memory cell array 201 and contact electrodes according to a third embodiment. FIG. 21 is a schematic cross-sectional view of the structure illustrated in FIG. 20 taken along the line I-I', and viewed along a direction of the arrow.

Note that, in FIG. 21, an insulating layer (for example, an inter-layer insulating film) covering the components of the memory die MD is not illustrated. In FIG. 20 to FIG. 21, the same reference numerals are attached for the same configurations as those in FIG. 5 to FIG. 7 and the like, and the description of the configuration is omitted. Contact electrodes CCw4 have configurations the same as those of the contact electrodes CCw3 illustrated in FIG. 14 and FIG. 15. However, the contact electrodes CCw4 are disposed in the first hook-up region $R_{HU2}$ on one side.

Each of the memory cells MC in the memory cell array 201 in the third embodiment is configured of two cell transistors and one cell capacitor (2T1C).

In the above-described second embodiment, as illustrated in FIG. 14 and FIG. 16, the plurality of contact electrodes CCb3, C3b3 are disposed in the second hook-up region $R_{HU4}$ on one side. The plurality of contact electrodes CCb3, C3b3 are connected to the wiring d2 in the wiring layer D2 via the wiring layers M0, M1, M2 in the upper side. However, in the third embodiment, a plurality of contact electrodes CCb4 are disposed in the second hook-up regions $R_{HU3}$, $R_{HU4}$ on both the sides. The plurality of contact electrodes CCb4 are connected to the wiring d2 in the wiring layer D2 without the wiring layers M0, M1, M2 in the upper side.

For example, as illustrated in FIG. 20 and FIG. 21, in the second hook-up regions $R_{HU3}$, $R_{HU4}$, the plurality of contact electrodes CCb4 extending in the Z-direction are disposed. For the plurality of contact electrodes CCb4, m-th contact electrodes counted from the −Y-direction to the +Y-direction are contact electrodes CCb4($m$). m is numbers of 1 to 6. In the second hook-up region $R_{HU3}$, four contact electrodes CCb4(1), CCb4(2), CCb4(3), CCb4(4) are disposed. In the second hook-up region $R_{HU4}$, two contact electrodes CCb4 (5), CCb4(6) are disposed.

For example, as illustrated in FIG. 20 and FIG. 21, the contact electrodes CCb4(1) to CCb4(6) have upper ends connected to the bit lines BLj(3) to BLj(6), BLj(2), BLj(1), respectively, and have lower ends connected to the wiring d2 in the wiring layer D2, respectively.

With such a configuration, the contact electrodes CCb4 ensure connecting the bit lines BL-T, BL-C in each of the array structures AS to the wiring d2 in the wiring layer D2 by individual array structure AS.

Note that, in the examples in FIG. 20 and FIG. 21, the contact electrodes CCb4 are disposed in the second hook-up regions $R_{HU3}$, $R_{HU4}$ on both the sides. However, the contact electrodes CCb4 may be disposed in the second hook-up region on one side (any one of the second hook-up regions $R_{HU3}$, $R_{HU4}$).

Fourth Embodiment

[Circuit of Memory Cell Array 201]

Figure 22:
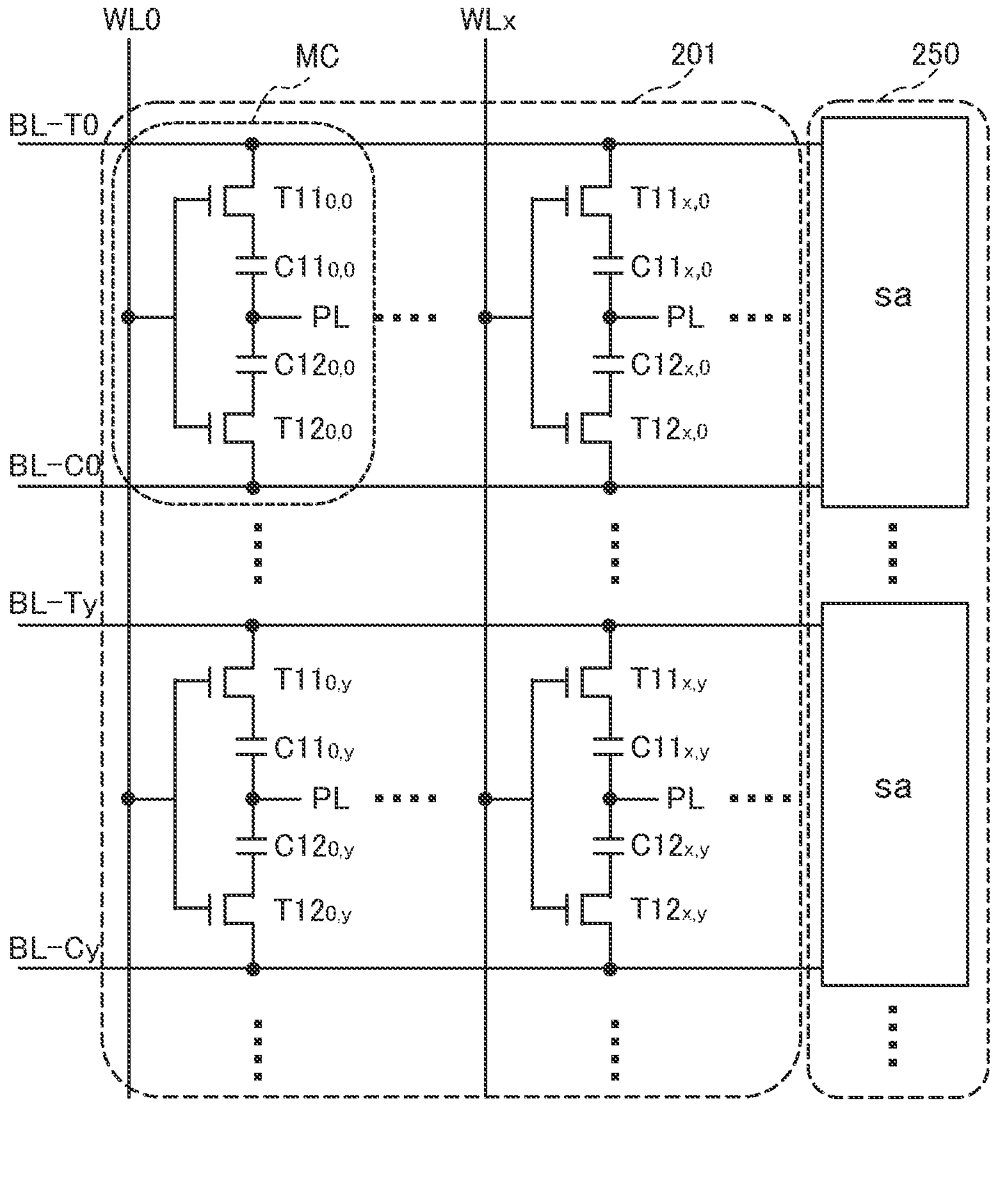
FIG. 22 is a schematic circuit diagram illustrating an exemplary configuration of a memory cell array according to a fourth embodiment.

FIG. 22 is a schematic circuit diagram illustrating an exemplary configuration of the memory cell array 201 according to a fourth embodiment. The memory cell array 201 according to the fourth embodiment is, as illustrated in FIG. 22, basically configured similarly to the memory cell array 201 according to the first embodiment.

However, the memory cell MC included in the memory cell array 201 according to the fourth embodiment is different from the memory cell MC included in the memory cell array 201 according to the first embodiment. The memory cells MC according to the fourth embodiment are each configured of two cell transistors T11, T12 and two cell capacitors C11, C12. Such a configuration of memory cell MC is referred to as "2T2C" in some cases.

The two cell transistors T11, T12 are basically configured similarly to the two cell transistors T1, T2. However, second terminals of the cell transistors T11, T12 are connected to one terminals of the cell capacitors C11, C12, respectively.

The other terminals of the cell capacitors C11, C12 are each connected to a plate line PL. The plate line PL is applied with a predetermined voltage.

The word line WL is applied with a voltage of a low level or a high level, and the bit lines BL-T, BL-C are applied with a voltage of a low level or a high level, and thus, the cell transistors T11, T12 are turned ON or turned OFF. This causes an electric charge to be accumulated in the cell capacitors C11, C12 or causes an accumulated electric charge to be discharged.

[Structure of Memory Cell Array 201 and Contact Electrodes]

Figure 23:
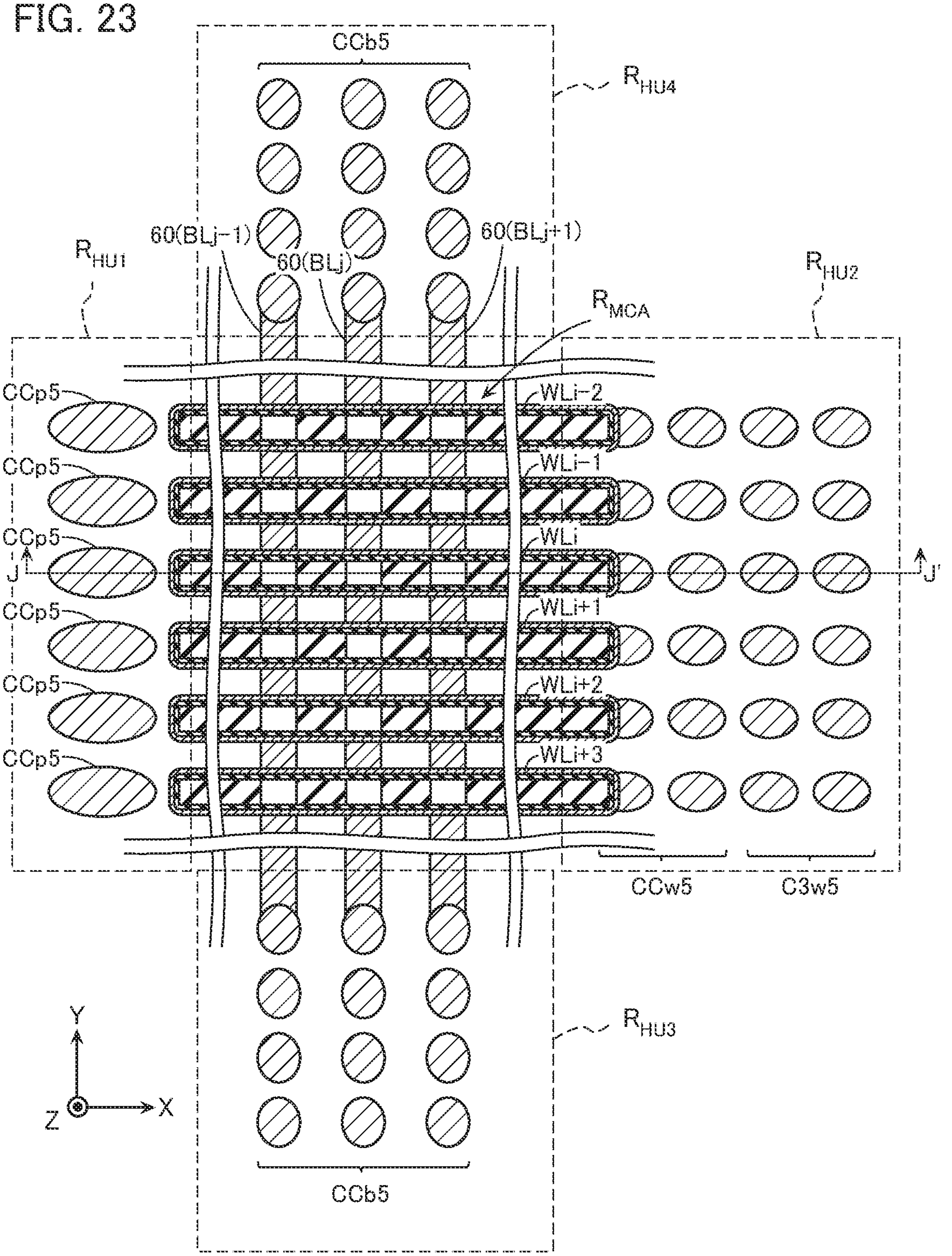
FIG. 23 is a schematic plan view illustrating an exemplary configuration of the memory cell array and contact electrodes according to the fourth embodiment.
Figure 24:
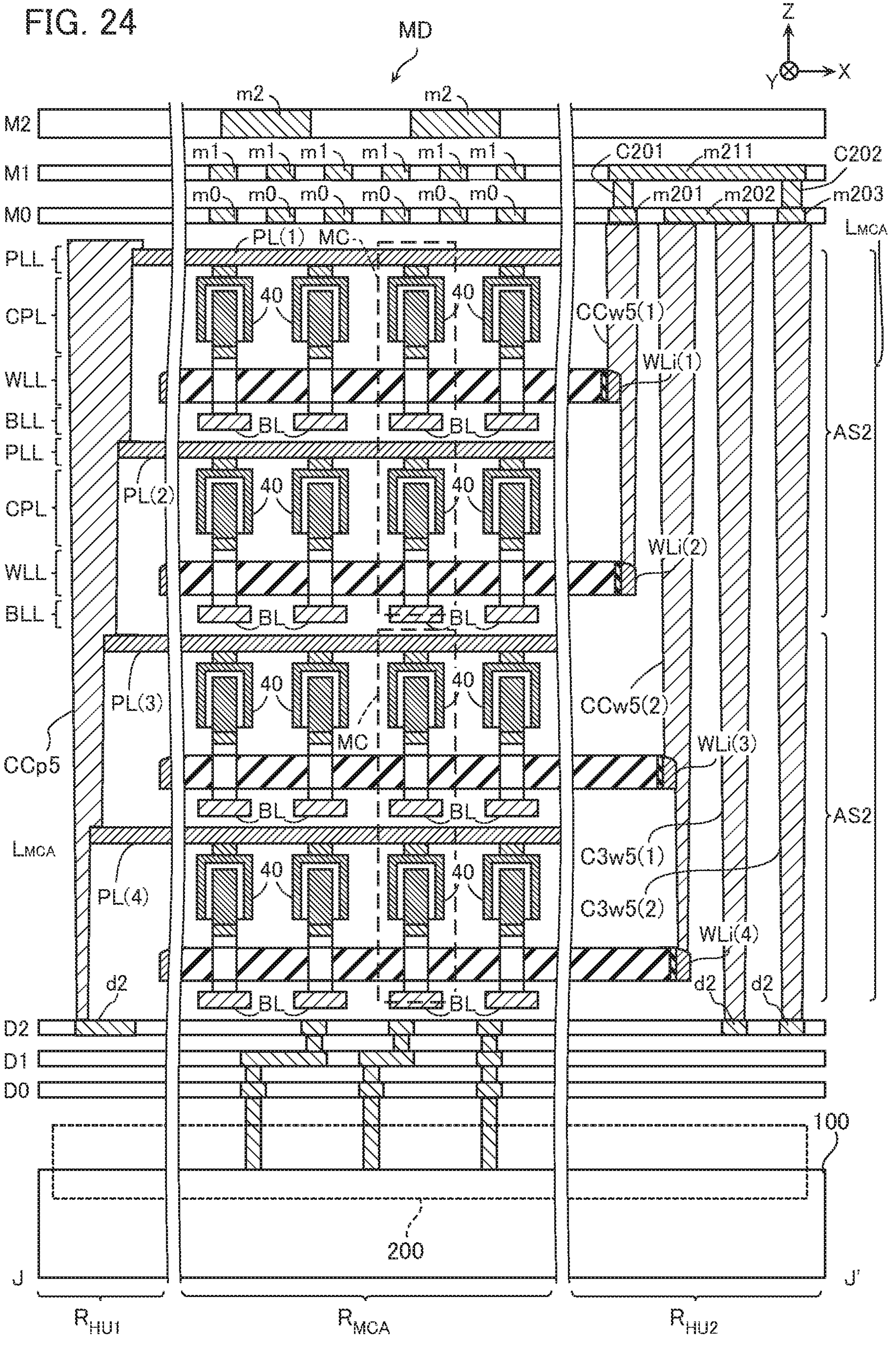
FIG. 24 is a schematic cross-sectional view of the structure illustrated in FIG. 23 taken along the line J-J', and viewed along a direction of the arrow.

FIG. 23 is a schematic plan view illustrating an exemplary configuration of the memory cell array 201 and contact electrodes according to the fourth embodiment. FIG. 24 is a schematic cross-sectional view of the structure illustrated in FIG. 23 taken along the line J-J', and viewed along a direction of the arrow.

Note that, in FIG. 23 and FIG. 24, the same reference numerals are attached for the same configurations as the above-described configurations, and the description of the configuration is omitted.

[Memory Cell Array Region $R_{MCA}$]

For example, as illustrated in FIG. 24, the memory cell array region $R_{MCA}$ includes a plurality (two in the illustrated example) of array structures AS2 arranged in the Z-direction. For example, as illustrated in FIG. 24, the array structures AS2 each include two sub array structures arranged in the Z-direction. These two sub array structures each include the bit line layer BLL, the word line layer WLL formed on the bit line layer BLL, the capacitor layer CPL formed on the word line layer WLL, and a plate line layer PLL formed on the capacitor layer CPL.

Thus, the array structure AS2 has a structure stacking two sub array structures formed of the bit line layer BLL, the word line layer WLL, the capacitor layer CPL, and the plate line layer PLL. The sub array structures, and the bit line layer BLL, the word line layer WLL, the capacitor layer CPL, and the plate line layer PLL, are each formed in a plurality of stages (four stages in the illustrated example) in the Z-direction. The upper stage is referred to as a "first stage", a stage below the "first stage" is referred to as a "second stage", a stage below the "second stage" is referred to as a "third stage", and a stage below the "third stage" is referred to as a "fourth stage" in some cases.

The bit line layer BLL, the word line layer WLL, and the capacitor layer CPL have the configurations similar to those described using FIG. 8 and FIG. 10.

The plate line layer PLL includes a plurality of conductive layers arranged in the Y-direction. This conductive layer may be metal, such as tungsten (W), or may include a stacked film or the like of a barrier conductive film of, for example, titanium nitride (TiN) and a metallic film of, for example, tungsten (W). This conductive layer functions as the plate line PL. The plurality of plate lines PL extend in the X-direction across the memory cell array region $R_{MCA}$ and the first hook-up regions $R_{HU1}$.

In the example in FIG. 24, the memory cell MC is configured of two stages of the cell transistors and the cell capacitors. For example, the memory cell MC included in the array structure AS2 disposed on the upper side is configured of the cell transistor and the cell capacitor 40 included in the sub array structure in the first stage and the cell transistor and the cell capacitor 40 included in the sub array structure in the second stage. The memory cell MC included in the array structure AS2 disposed on the lower side is configured of the cell transistor and the cell capacitor 40 included in the sub array structure in the third stage and the cell transistor and the cell capacitor 40 included in the sub array structure in the fourth stage. For example, the cell transistors included in the sub array structures in the first stage and the third stage correspond to the cell transistors T11 in FIG. 22, and the cell capacitors 40 included in the sub array structures in the first stage and the third stage correspond to the cell capacitors C11 in FIG. 22. The cell transistors included in the sub array structures in the second stage and the fourth stage correspond to the cell transistors T12 in FIG. 22, and the cell capacitors 40 included in the sub array structures in the second stage and the fourth stage correspond to the cell capacitors C12 in FIG. 22.

The bit lines BL included in the sub array structures in the first stage and the third stage correspond to the bit lines BL-T in FIG. 22. The bit lines BL included in the sub array structures in the second stage and the fourth stage correspond to the bit lines BL-C in FIG. 22.

For example, as illustrated in FIG. 24, for the plurality of word lines WLi, 1st to 3rd word lines counted from the +Z-direction to the −Z-direction are the word lines WLi(1) to WLi(3), respectively.

For the plurality of plate lines PL, 1st to 4th plate lines counted from the +Z-direction to the −Z-direction are the plate lines PL(1) to PL(4), respectively.

[First Hook-Up Regions $R_{HU1}$, $R_{HU2}$]

For example, as illustrated in FIG. 23 and FIG. 24, in the first hook-up region $R_{HU2}$, a plurality of contact electrodes CCw5, C3*w*5 extending in the Z-direction are disposed. Rows of two contact electrodes CCw5 and two contact electrodes C3*w*5 arranged in the X-direction are arranged in the Y-direction corresponding to the word lines WL. For example, as illustrated in FIG. 24, for the plurality of contact electrodes CCw5, m-th contact electrodes counted from the −X-direction to the +X-direction are contact electrodes CCw5(*m*). m is numbers of 1 to 2. For the plurality of contact electrodes C3*w*5, m-th contact electrodes counted from the −X-direction to the +X-direction are contact electrodes C3*w*5(*m*). m is numbers of 1 to 2.

In the first hook-up region $R_{HU1}$, contact electrodes CCp5 extending in the Z-direction are disposed. The contact electrode CCp5 is a contact electrode for connection of the plate line PL. The contact electrodes CCp5 are arranged in the Y-direction corresponding to the plurality of word lines WL arranged in the Y-direction.

[Second Hook-Up Regions $R_{HU3}$, $R_{HU4}$]

In the second hook-up regions $R_{HU3}$, $R_{HU4}$, a plurality of contact electrodes CCb5 are disposed. Note that, the plurality of contact electrodes CCb5 in FIG. 23 have configurations the same as those of the contact electrodes CCb4 in FIG. 20 and FIG. 21.

[Wiring Layers M0, M1, M2]

The wiring layer M0 includes a plurality of wirings m201 to m203. These plurality of wirings m201 to m203 are parts of the above-described plurality of wirings m0, and are connected to the contact electrodes CCw5, C3*w*5.

The wiring layer M1 includes a wiring m211. The wiring m211 is a part of the above-described plurality of wirings m1 and is connected to the contact electrodes CCw5, C3*w*5.

The wiring m201 in the wiring layer M0 and the wiring m211 in the wiring layer M1 are connected via a contact C201. The wiring m203 in the wiring layer M0 and the wiring m201 in the wiring layer M1 are connected via a contact C202.

[Configuration of Contact Electrodes Ccw5, C3*w*5, CCp5]

A contact electrode CCw5(1) has a side surface connected to the word lines WLi(1), WLi(2), and has an upper end connected to the wiring m201 in the M0. A contact electrode CCw5(2) has a side surface connected to the word lines WLi(3), WLi(4), and has an upper end connected to the wiring m202 in the M0. A contact electrode C3*w*5(1) has an upper end connected to the wiring m202 in the M0, and has a lower end connected to the wiring d2 in the wiring layer D2. The contact electrode C3*w*5(2) has an upper end connected to the wiring m203 in the M0, and has a lower end connected to the wiring d2 in the wiring layer D2.

The word lines WLi(1), WLi(2) are connected to the wiring d2 in the wiring layer D2 through the contact electrode CCw5(1), the wiring m201 in the wiring layer M0, the contact C201, the wiring m211 in the wiring layer M1, the contact C202, and the contact electrode C3*w*5(2). The word line WLi(3), WLi(4) are connected to the wiring d2 in the wiring layer D2 through the contact electrode CCw5(2), the wiring m202 in the wiring layer M0, and the contact electrode C3*w*5(1).

The contact electrode CCp5 has a side surface connected to the plate lines PL(1), PL(2), PL(3), PL(4), and has a lower end connected to the wiring d2 in the wiring layer D2.

With the above-described configuration, the word lines WL can be connected to the wiring d2 in the wiring layer D2 by each two stages, and two stages of the word lines WL also can be electrically connected. This ensures connecting the third terminals (the gate terminals) of the two cell transistors T11, T12 in the memory cell MC.

Note that, in the example in FIG. 23, the contact electrodes CCb5 are disposed in the second hook-up regions $R_{HU3}$, $R_{HU4}$ on both the sides. However, the contact electrodes CCb5 may be disposed in the second hook-up region on one side (any one of the second hook-up regions $R_{HU3}$, $R_{HU4}$).

Figure 25:
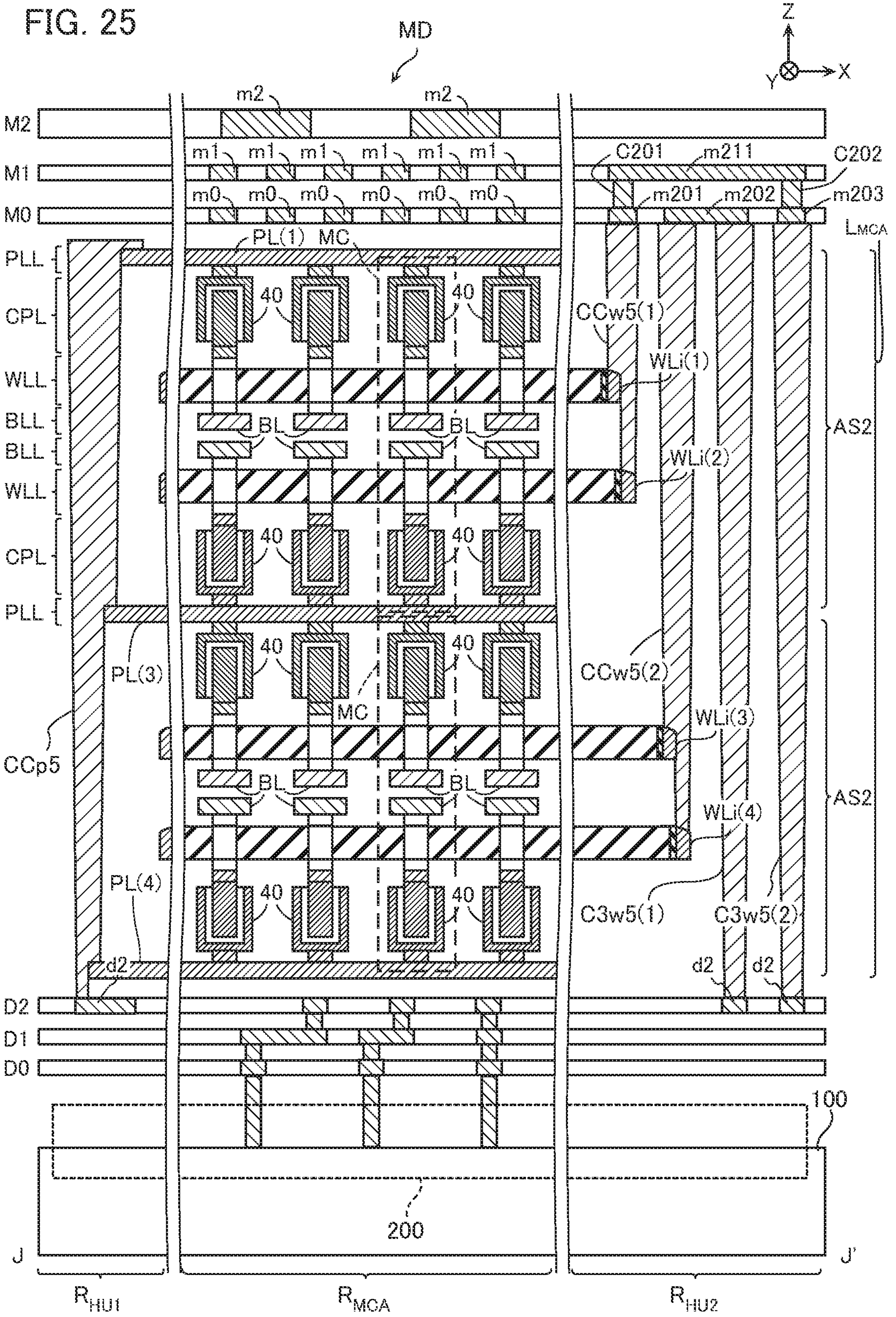
FIG. 25 is a schematic cross-sectional view illustrating a modification of the structure illustrated in FIG. 24.

In the structure of the memory cell array 201 in FIG. 24, the bit lines BL, the word lines WL (the cell transistors), the cell capacitors 40, and the plate lines PL are formed in each of the four stages. However, the configuration of these may be two stages or may be even-numbered stages of six or more. The contact electrodes CCw5, C3*b*5 are disposed in the first hook-up region $R_{HU2}$, and the contact electrodes CCp5 are disposed in the first hook-up region $R_{HU1}$. However, the contact electrodes CCw5, C3b5 may be disposed in the first hook-up region $R_{HU1}$, and the contact electrodes CCp5 may be disposed in the first hook-up region $R_{HU2}$ First Modification of Fourth Embodiment FIG. 25 is a schematic cross-sectional view illustrating of a modification of the structure illustrated in FIG. 24. Note that, in FIG. 25, an insulating layer (for example, an inter-layer insulating film) covering the components of the memory die MD is not illustrated. In FIG. 25, the same reference numerals are attached for the same configurations as the above-described configurations, and the description of the configuration is omitted.

The memory cell array 201 in FIG. 25 is basically configured similarly to the memory cell array 201 in FIG. 24. However, in the structure of the memory cell array 201 in FIG. 25, the bit line layers BLL, the word line layers WLL, the capacitor layers CPL, and the plate line layers PLL in the sub array structures in the second stage and the fourth stage are disposed in an order from the upper side. That is, the bit line layers BLL, the word line layers WLL, the capacitor layers CPL, and the plate line layers PLL in the sub array structures in the second stage and the fourth stage are disposed in the inverse order from each of the configurations in the sub array structures in the first stage and the third stage. The plate line layer PLL in the second stage is common with the plate line layer PLL in the third stage. For example, in the illustrated example, the plate line PL(2) is omitted, and the configuration in the sub array structure in the second stage is connected to the plate line PL(3). With such a configuration, reducing the number of the plate line layers PLL (the plate lines PL) ensures achieving a high integration in the Z-direction of the memory cell array 201.

Note that, while in the example in FIG. 25, the configurations in the sub array structures in the second stage and the fourth stage are disposed upside down, the configurations in the sub array structures in the first stage and the third stage may be disposed upside down. In this case, the plate line layer PLL in the first stage may be made common with the plate line layer PLL in the second stage, and the plate line layer PLL in the third stage may be made common with the plate line layer PLL in the fourth stage.

Fifth Embodiment

Figure 26:
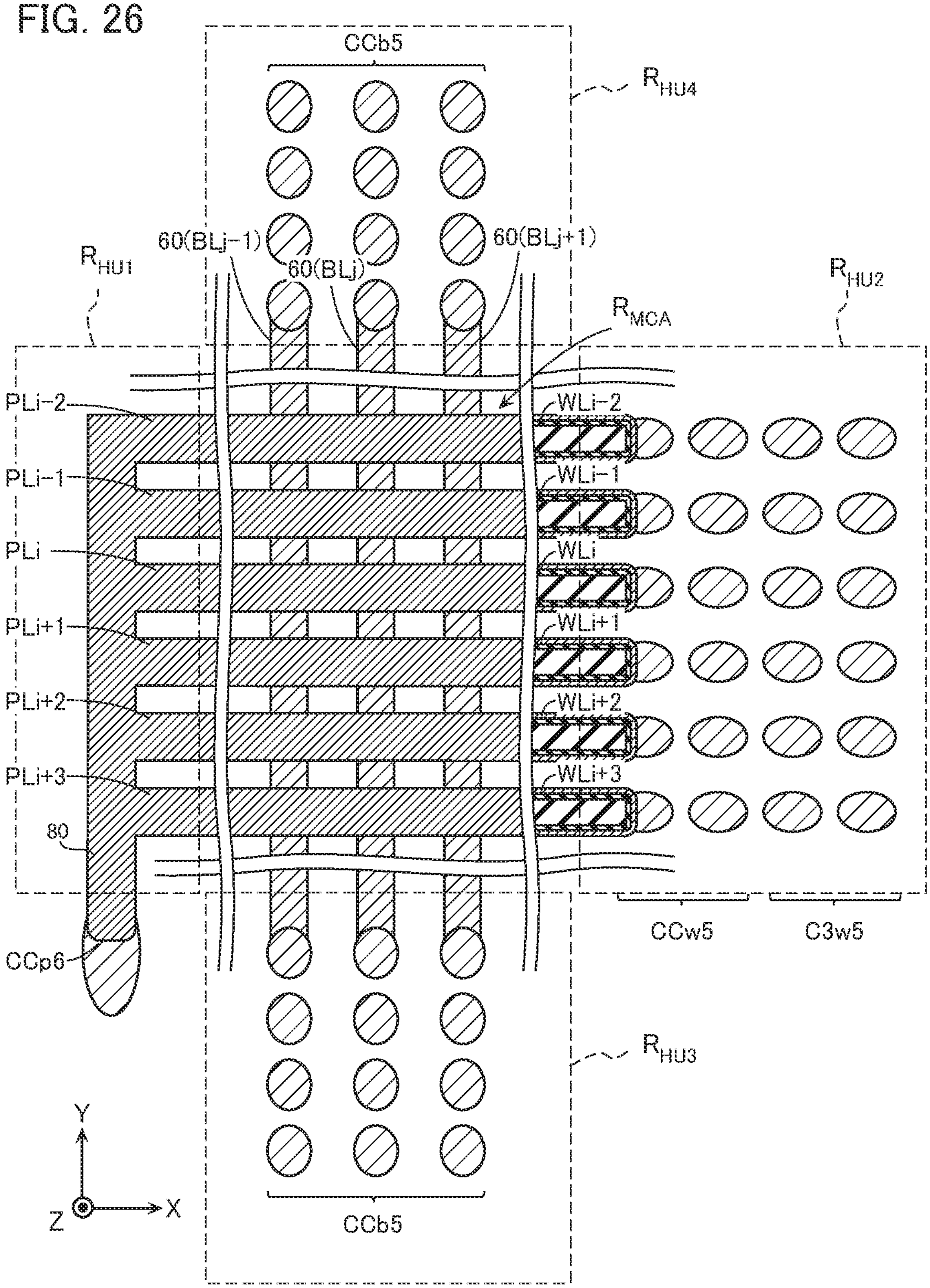
FIG. 26 is a schematic plan view illustrating an exemplary configuration of a memory cell array and contact electrodes according to a fifth embodiment.

FIG. 26 is a schematic plan view illustrating an exemplary configuration of the memory cell array 201 and contact electrodes according to a fifth embodiment. FIG. 26 mainly illustrates a schematic plan view of the memory cell array 201 according to the fifth embodiment taken along an XY-plane including the plate lines PL in the upmost stage, and viewed from an upper side (the +Z-direction side). In FIG. 26, an insulating layer (for example, an inter-layer insulating film) covering the components of the memory die MD is not illustrated. Therefore, in FIG. 26, the bit lines BL that do not appear on the XY-plane including the word lines WL in the upmost stage appear. However, in FIG. 26, configurations disposed below this (the bit lines BL, the peripheral circuit, and the like disposed below this) are omitted. Note that, in FIG. 26, the contact electrodes CCw5, the contact electrodes C3w5, the contact electrodes CCb5 have the same configuration as those in FIG. 23, and the description of the configuration is omitted.

In the example in FIG. 26, a plurality of plate lines PLi−2, PLi−1, PLi, PLi+1, PLi+2, PLi+3, . . . extend in the X-direction and are arranged in the Y-direction. The order of the plate lines PL arranged in the Y-direction is represented by i. Note that the plate lines PL are arranged in each stage in the Z-direction as illustrated in FIG. 24 and the like.

These plurality of plate lines PLi−2, PLi−1, PLi, PLi+1, PLi+2, PLi+3, have end portions in the −X-direction to which a conductive layer 80 is connected. The conductive layer 80 extends in the Y-direction, and is connected to a contact electrode CCp6 at one end in the Y-direction. Note that the conductive layer 80 is disposed in each stage in the Z-direction. The conductive layers 80 in these respective stages are connected to the plurality of plate lines PL in the respective stages, and are connected to the common contact electrode CCp6 at the one ends in the Y-direction.

The conductive layer 80 may be disposed in the first hook-up region $R_{HU1}$. The conductive layer 80 may be disposed in a region in which dummy memory cells MC are formed in the memory cell array region $R_{MCA}$.

The contact electrode CCp6 has a side surface connected to a plurality of the conductive layers 80, and has a lower end connected to the wiring d2 in the wiring layer D2. The contact electrode CCp6 may be disposed in the first hook-up region $R_{HU1}$ and may be disposed in the memory cell array region $R_{MCA}$.

Thus, when the conductive layers 80 and the contact electrode CCp6 connect the plate lines PL to the wiring d2 in the wiring layer D2, the contact electrodes CCw5 connecting the word lines WL can be disposed in the first hook-up regions $R_{HU1}$ on one side or the first hook-up regions $R_{HU1}$, $R_{HU2}$ on both the sides.

Sixth Embodiment

[Structure of Memory Cell Array 201 and Contact Electrodes]

Figure 27:
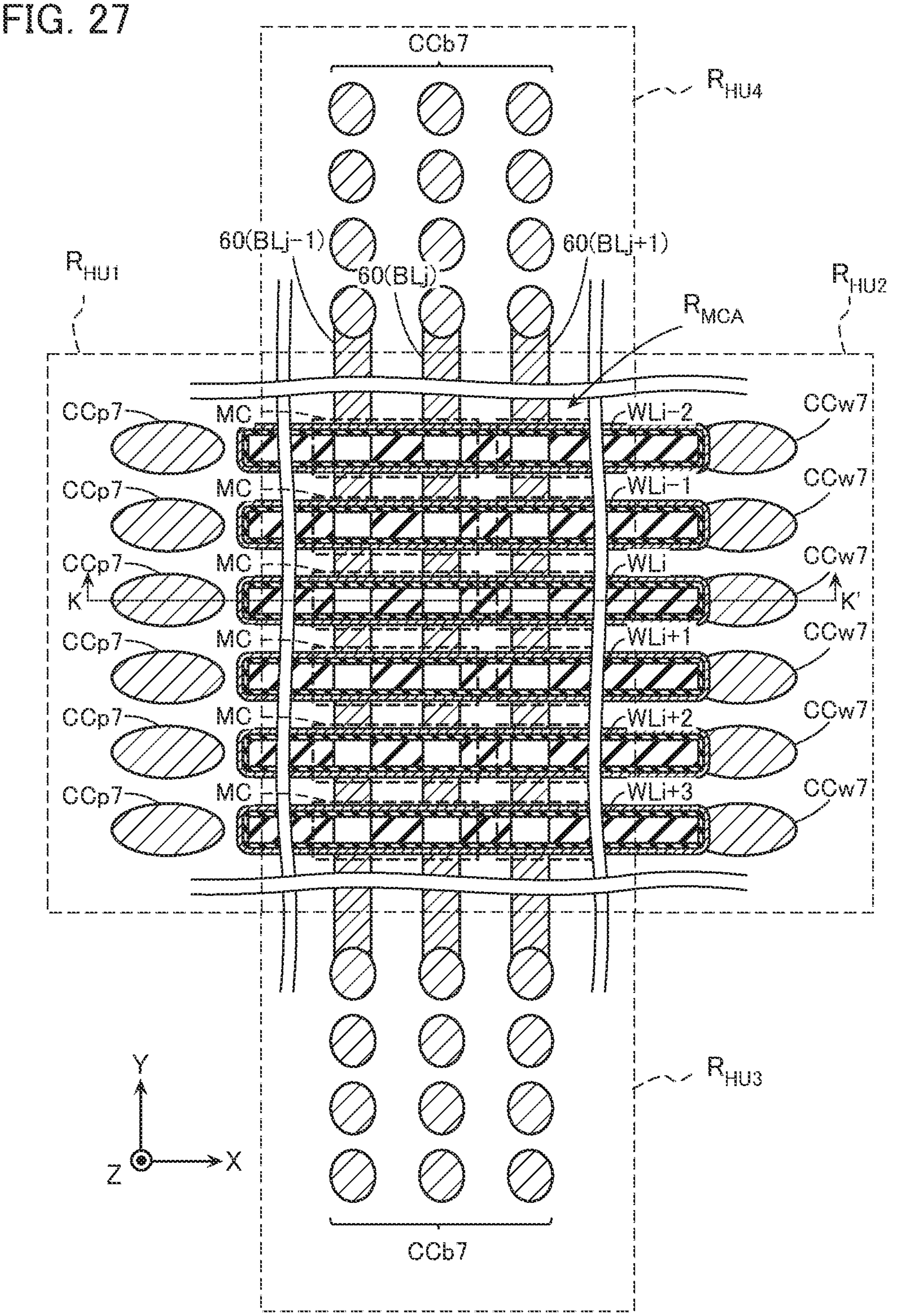
FIG. 27 is a schematic plan view illustrating an exemplary configuration of a memory cell array and contact electrodes according to a sixth embodiment.
Figure 28:
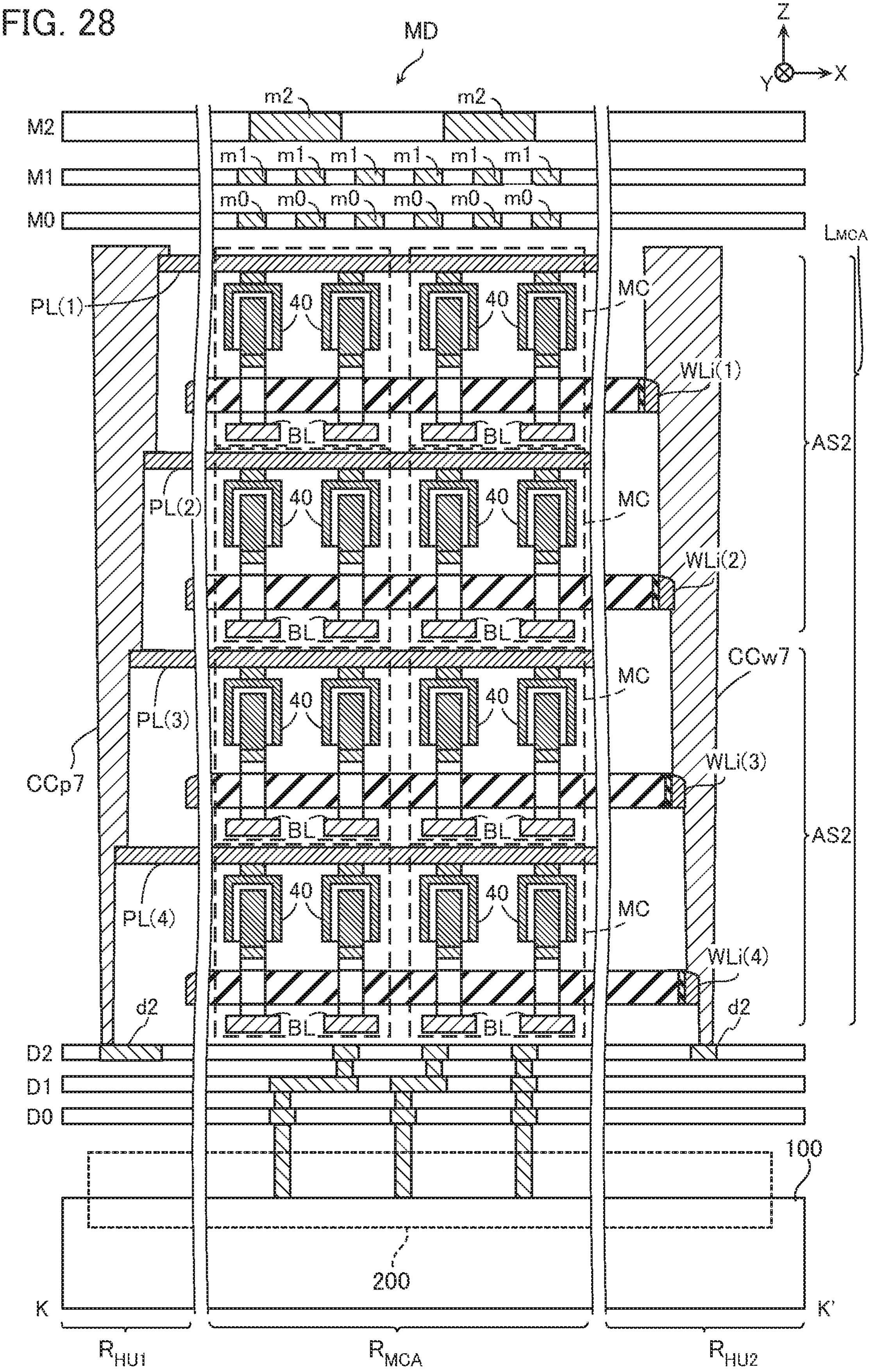
FIG. 28 is a schematic cross-sectional view of the structure illustrated in FIG. 27 taken along the line K-K', and viewed along a direction of the arrow.

FIG. 27 is a schematic plan view illustrating an exemplary configuration of the memory cell array 201 and contact electrodes according to a sixth embodiment. FIG. 28 is a schematic cross-sectional view of the structure illustrated in FIG. 27 taken along the line K-K', and viewed along a direction of the arrow.

Note that, in FIG. 28, an insulating layer (for example, an inter-layer insulating film) covering the components of the memory die MD is not illustrated. In FIG. 27 and FIG. 28, the same reference numerals are attached for the same configurations as the above-described configurations, and the description of the configuration is omitted.

Each of the memory cells MC in the memory cell array 201 in the sixth embodiment is configured of two cell transistors and two cell capacitors (2T2C).

For example, as illustrated in FIG. 27 and FIG. 28, in the first hook-up region $R_{HU2}$, a plurality of contact electrodes CCw7 extending in the Z-direction are disposed. The plurality of contact electrodes CCw7 are connected to the respective plurality of word lines WL arranged in the Y-direction, and are arranged in the Y-direction corresponding to the plurality of word lines WL.

In the second hook-up regions $R_{HU3}$, $R_{HU4}$, a plurality of contact electrodes CCb7 are disposed. Note that, the plurality of contact electrodes CCb7 in FIG. 27 have configurations the same as those of the contact electrodes CCb4 in FIG. 20 and FIG. 21 and the contact electrodes CCb5 in FIG. 23.

In the first hook-up region $R_{HU1}$, contact electrodes CCp7 extending in the Z-direction are disposed. Note that, the contact electrodes CCp7 in FIG. 27 and FIG. 28 have configurations the same as those of the contact electrodes CCp5 in FIG. 23 and FIG. 24.

Note that, the memory cell array 201 and the array structures AS2 in FIG. 27 and FIG. 28 have configurations the same as those of the memory cell array 201 and the array structures AS2 in FIG. 23 and FIG. 24.

In the above-described example in FIG. 24, the memory cell MC is configured of the two stages of the cell transistors and the cell capacitors. In contrast to this, in the example in FIG. 27 and FIG. 28, the memory cell MC is configured of two cell transistors arranged in the X-direction in the same stage and two cell capacitors arranged in the X-direction in the same stage. For example, one of the two cell transistors arranged in the X-direction corresponds to the cell transistor T11 in FIG. 22, and the other one of the two cell transistors arranged in the X-direction corresponds to the cell transistor T12 in FIG. 22. One of the two cell capacitors arranged in the X-direction corresponds to the cell capacitor C11 in FIG. 22, and the other one of the two cell capacitors arranged in the X-direction corresponds to the cell capacitor C12 in FIG. 22.

One of two bit lines BL arranged in the X-direction corresponds to the bit line BL-T in FIG. 22. The other one of the two bit lines BL arranged in the X-direction corresponds to the bit line BL-C in FIG. 22.

The contact electrode CCw7 has a side surface connected to the word lines WLi(1) to WLi(4), and has a lower end connected to the wiring d2 in the wiring layer D2.

With the above-described configuration, the word lines WL can be connected to the wiring d2 in the wiring layer D2 with a combination of the two cell transistors and cell capacitors arranged in the X-direction as the memory cell MC.

Note that, in the example in FIG. 27, the contact electrodes CCb7 are disposed in the second hook-up regions $R_{HU3}$, $R_{HU4}$ on both the sides. However, the contact electrodes CCb7 may be disposed in the second hook-up region on one side (any one of the second hook-up regions $R_{HU3}$, $R_{HU4}$).

In the structure of the memory cell array 201 in FIG. 28, the bit lines BL, the word lines WL (the cell transistors), the cell capacitors 40, and the plate lines PL are formed in each of the four stages. However, the configuration of these may be two stages or may be even-numbered stages of six or more. The contact electrodes CCw7 are disposed in the first hook-up region $R_{HU2}$, and the contact electrodes CCp7 are disposed in the first hook-up regions $R_{HU1}$ However, the contact electrodes CCw7 may be disposed in the first hook-up region $R_{HU1}$, and the contact electrodes CCp7 may be disposed in the first hook-up region $R_{HU2}$.

In FIG. 28, as in FIG. 25, the configuration of the word line WL, the bit line BL, the plate line PL, the cell transistor, and the cell capacitor 40 in a predetermined stage may be inverted upside down.

Seventh Embodiment

[Circuit of Memory Cell Array 201]

Figure 29:
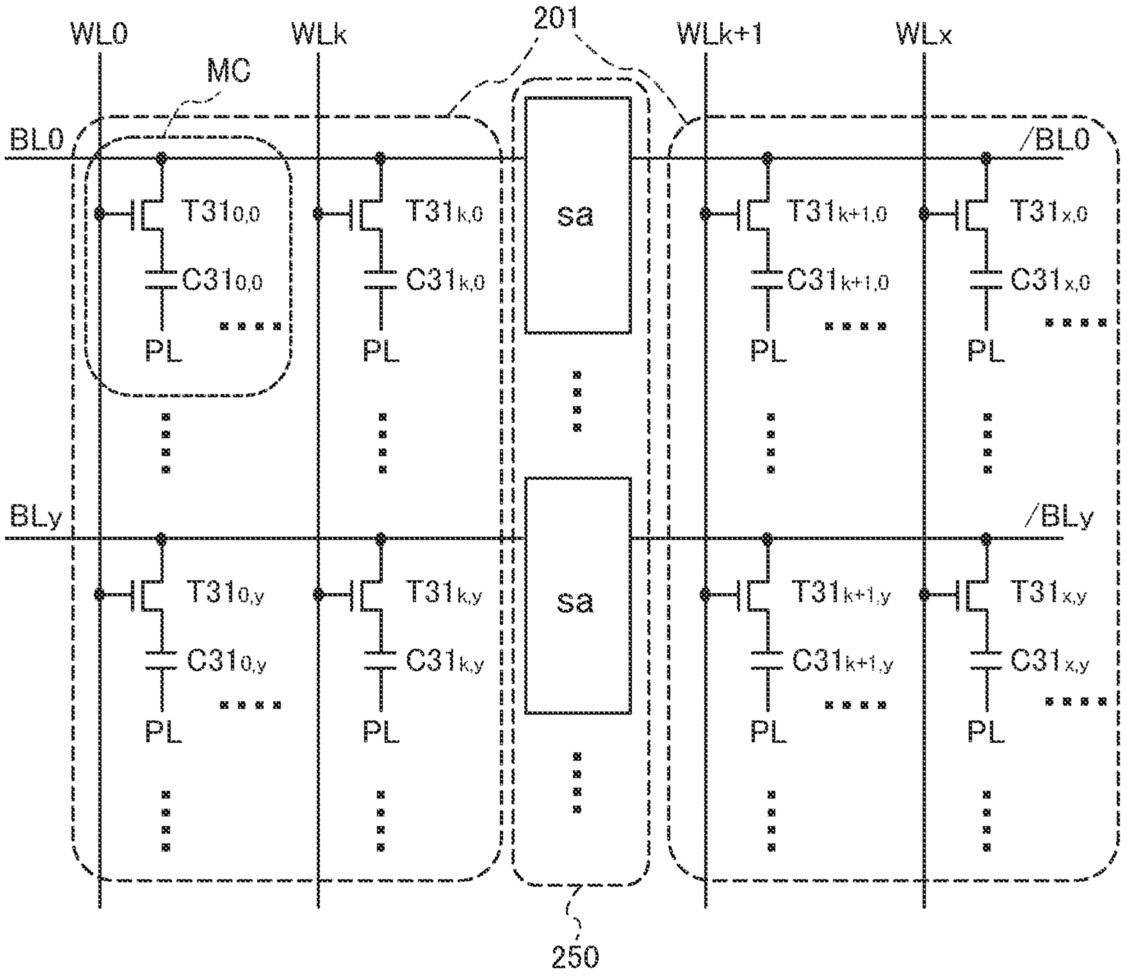
FIG. 29 is a schematic circuit diagram illustrating an exemplary configuration of a memory cell array according to a seventh embodiment.

FIG. 29 is a schematic circuit diagram illustrating an exemplary configuration of the memory cell array 201 according to a seventh embodiment. In the memory cell array 201 according to the seventh embodiment, as illustrated in FIG. 29, the plurality of word lines WL (word lines WL0, . . . , WLk, WLk+1, . . . WLx, . . . ) and the plurality of bit lines BL (bit lines BL0, . . . , BLy, . . . , /BL0, . . . , /BLy, . . . ) are disposed in a matrix.

The memory cell array 201 includes the plurality of memory cells MC. The respective memory cells MC are disposed at portions (cross points) where the plurality of word lines intersect with the plurality of bit lines. The respective memory cells MC are connected to the word lines WL and the bit lines BL.

Each of the memory cells MC is configured of one cell transistor T31 and one cell capacitor C31. Such a configuration of memory cell MC is referred to as "1T1C" in some cases. As illustrated in FIG. 29, a first terminal of the cell transistor T31 is connected to the bit line BL, and a second terminal of the cell transistor T31 is connected to one terminal of the cell capacitor C31.

The other terminal of the cell capacitor C31 is connected to the plate line PL. The plate line PL is applied with a predetermined voltage. A third terminal of the cell transistor T31 is connected to the word line WL. Here, the first terminal is any one terminal of the source/drain of the cell transistor. The second terminal is the other terminal of the source/drain of the cell transistor. The third terminal is a gate terminal of the cell transistor.

The word line WL is applied with a voltage of a low level or a high level, the bit line BL is applied with a voltage of a low level or a high level, and thus, the cell transistor T31 is turned ON or turned OFF. This causes an electric charge to be accumulated in the cell capacitor C31 or causes an accumulated electric charge to be discharged.

The sense amplifier sa senses data read out from the memory cell MC. For example, as illustrated in FIG. 29, the plurality of sense amplifiers sa are disposed corresponding to the respective plurality of bit lines BL0, . . . , BLj, . . . . In FIG. 29, the connection is made in the order of the bit line BL to the sense amplifier sa to the bit line /BL. Specifically, each of the bit lines BL0, . . . , BLj, . . . extend in one direction from each sense amplifier sa, and each of the bit lines /BL0, . . . , /BLj, . . . extend in the other direction from each sense amplifier sa. Such connections between the bit lines BL, /BL and the sense amplifiers sa are referred to as an "open bit line method".

In the example in FIG. 29, the memory cells MC connected to the word lines WL0, . . . , WLk are connected to the bit line BLy extending in one direction from the sense amplifier sa. The memory cells MC connected to the word lines WLk+1, . . . , WLx, . . . are connected to the bit line /BLy extending in the other direction from the sense amplifier sa. The number of the memory cells MC connected to the bit line BLy and the respective word lines WL0, . . . , WLk and the number of the memory cells MC connected to the bit line BLy/ and the respective word lines WLk+1, . . . , WLx, . . . are the same number.

[Structure of Memory Cell Array 201 and Contact Electrodes]

Figure 30:
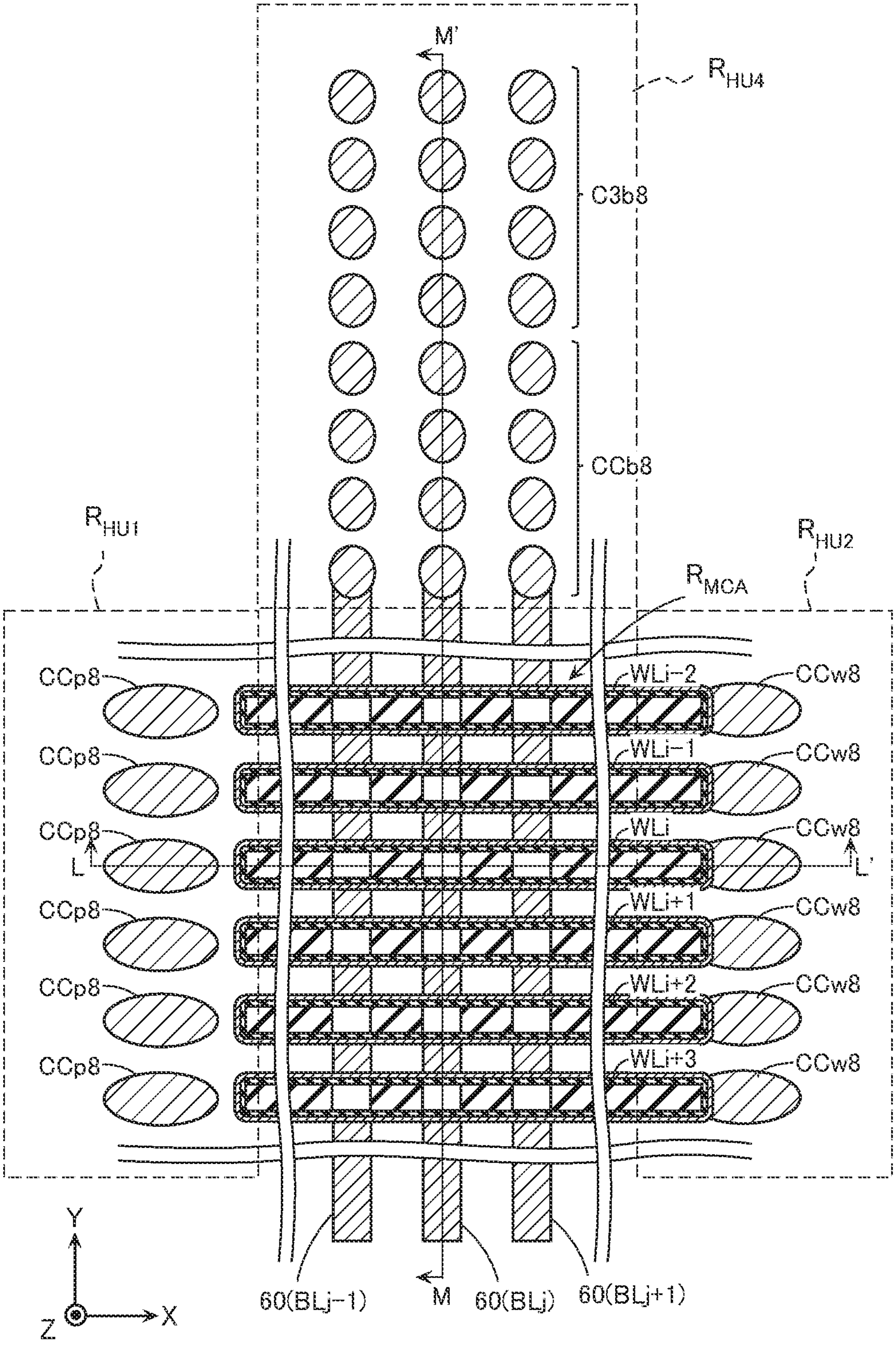
FIG. 30 is a schematic plan view illustrating an exemplary configuration of the memory cell array and contact electrodes according to the seventh embodiment.
Figure 31:
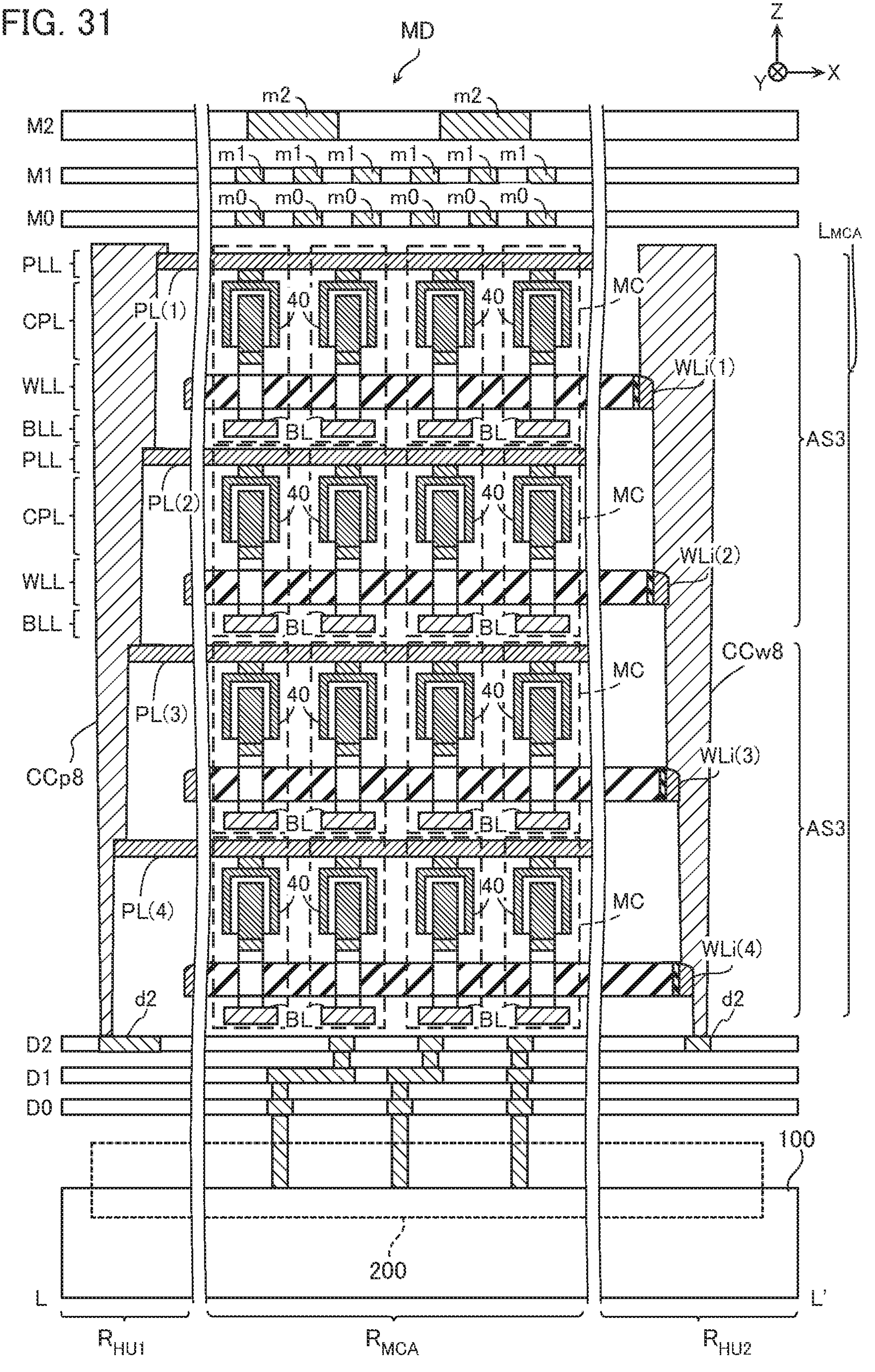
FIG. 31 is a schematic cross-sectional view of the structure illustrated in FIG. 30 taken along the line L-L', and viewed along a direction of the arrow.
Figure 32:
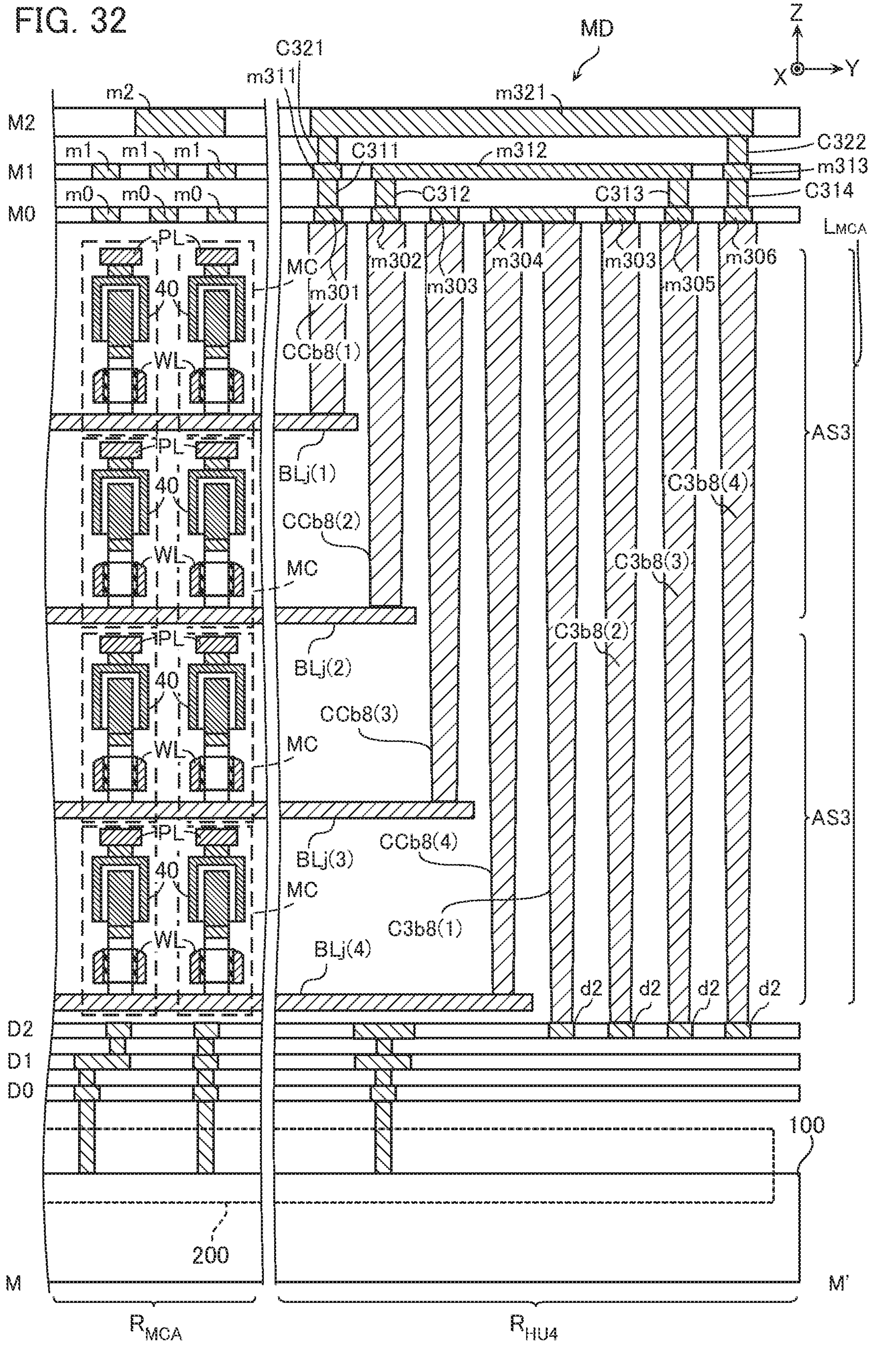
FIG. 32 is a schematic cross-sectional view of the structure illustrated in FIG. 30 taken along the line M-M', and viewed along a direction of the arrow.

FIG. 30 is a schematic plan view illustrating an exemplary configuration of the memory cell array 201 and contact electrodes according to the seventh embodiment. FIG. 31 is a schematic cross-sectional view of the structure illustrated in FIG. 30 taken along the line L-L', and viewed along a direction of the arrow. FIG. 32 is a schematic cross-sectional view of the structure illustrated in FIG. 30 taken along the line M-M', and viewed along a direction of the arrow.

Note that, in FIG. 30 to FIG. 32, an insulating layer (for example, an inter-layer insulating film) covering the components of the memory die MD is not illustrated. In FIG. 30 to FIG. 32, the same reference numerals are attached for the same configurations as the above-described configurations, and the description of the configuration is omitted.

[Memory Cell Array Region $R_{MCA}$]

For example, as illustrated in FIG. 31, the memory cell array region $R_{MCA}$ includes a plurality (two in the illustrated example) of array structures AS3 arranged in the Z-direction. For example, as illustrated in FIG. 31, the array structure AS3 is, for example, configured approximately similarly to the array structure AS2 described with reference to FIG. 24.

However, in the examples in FIG. 31 and FIG. 32, the memory cell MC is configured of one cell transistor and one cell capacitor 40. For example, the cell transistor of each of the memory cells MC corresponds to the cell transistor T31 in FIG. 29, and the cell capacitor 40 corresponds to the cell capacitor C31 in FIG. 29.

[First Hook-Up Regions $R_{HU1}$, $R_{HU2}$]

For example, as illustrated in FIG. 30 and FIG. 31, in the first hook-up region $R_{HU2}$, contact electrodes CCw8 extending in the Z-direction are disposed. The contact electrodes CCw8 are arranged in the Y-direction corresponding to the word lines WL. In the first hook-up region $R_{HU1}$, contact electrodes CCp8 extending in the Z-direction are disposed. The contact electrodes CCp8 are arranged in the Y-direction corresponding to the word lines WL. Note that the contact electrodes CCp8 have configurations the same as those of the contact electrodes CCp5 in FIG. 23 and FIG. 24.

[Second Hook-Up Regions $R_{HU3}$, $R_{HU4}$]

For example, as illustrated in FIG. 30 and FIG. 32, in the second hook-up region $R_{HU4}$, a plurality of contact electrodes CCb8, C**3*b*8 extending in the Z-direction are disposed. A plurality of rows of four contact electrodes CCb8 and four contact electrodes C3*b*8 arranged in the Y-direction are arranged in the X-direction corresponding to the bit lines BL. For example, as illustrated in FIG. 30 and FIG. 32, for the plurality of contact electrodes CCp8, m-th contact electrodes counted from the −Y-direction to the +Y-direction are contact electrodes CCb8**(*m*). m is numbers of 1 to 4. For the plurality of contact electrodes C**3*b*8, m-th contact electrodes counted from the −Y-direction to the +Y-direction are contact electrodes C3*b*8**(*m*). m is numbers of 1 to 4.

[Wiring Layers M0, M1, M2]

The wiring layer M0 includes a plurality of wirings m301 to m306. These plurality of wirings m301 to m306 are parts of the above-described plurality of wirings m0, and are connected to the contact electrodes CCb8, C**3*b*8**.

The wiring layer M1 includes wirings m311 to m313. The wirings m311 to m313 are parts of the above-described plurality of wirings m1, and are connected to the contact electrodes CCb8, C**3*b*8**.

The wiring layer M2 includes a wiring m321. The wiring m321 is a part of the above-described plurality of wirings m2, and is connected to the contact electrodes CCb8, C**3*b*8**.

The wiring m301 in the wiring layer M0 and the wiring m311 in the wiring layer M1 are connected via a contact C311. The wiring m302 in the wiring layer M0 and the wiring m312 in the wiring layer M1 are connected via a contact C312. The wiring m305 in the wiring layer M0 and the wiring m312 in the wiring layer M1 are connected via a contact C313. The wiring m306 in the wiring layer M0 and the wiring m313 in the wiring layer M1 are connected via a contact C314. The wiring m311 in the wiring layer M1 and the wiring m321 in the wiring layer M2 are connected via a contact C321. The wiring m313 in the wiring layer M1 and the wiring m321 in the wiring layer M2 are connected via a contact C322.

[Configuration of Contact Electrode CCw8]

The contact electrode CCw8 has a side surface connected to the word lines WLi(1), WLi(2) and the word lines WLi(3), WLi(4), and has a lower end connected to the wiring d2 in the wiring layer D2.

[Configuration of Contact Electrodes CCb8, C**3*b*8**]

As illustrated in FIG. 32, a contact electrode CCb8(1) to a contact electrode CCb8(4) have lower ends connected to the bit lines BLj(1) to BLj(4), respectively, and have upper ends connected to the wirings m301 to m304 in the wiring layer M0, respectively.

A contact electrode C**3*b*8(1) to a contact electrode CCb8 (4) have upper ends connected to the wirings m304, m303, m305, m306 in the wiring layer M0, respectively, and have lower ends connected to the wiring d2 in the wiring layer D2**, respectively.

Note that, in the example in FIG. 32, the contact electrodes CCb8, C**3*b*8 are disposed in the second hook-up region $R_{HU4}$ on one side. However, the contact electrodes CCb8, C3*b*8 may be disposed in the second hook-up region $R_{HU3}$ The contact electrodes CCb8, C3*b*8** may be disposed in the second hook-up regions $R_{HU3}$, $R_{HU4}$ on both the sides.

The structure of the memory cell array 201 in FIG. 24, the bit lines BL, the word lines WL (the cell transistors), the cell capacitors 40, and the plate lines PL are formed in each of the four stages. However, the configuration of these may be two stages, three stages, or may be five stages or more. The contact electrodes CCw8 are disposed in the first hook-up region $R_{HU2}$, and the contact electrodes CCp8 are disposed in the first hook-up region $R_{HU1}$. However, the contact electrodes CCw8 may be disposed in the first hook-up regions $R_{HU1}$, and the contact electrodes CCp8 may be disposed in the first hook-up region $R_{HU2}$.

In FIG. 31 and FIG. 32, as in FIG. 25, the configuration of the word line WL, the bit line BL, the plate line PL, the cell transistor, and the cell capacitor 40 in a predetermined stage may be inverted upside down.

Eighth Embodiment

[Circuit of Memory Cell Array 201]

Figure 33:
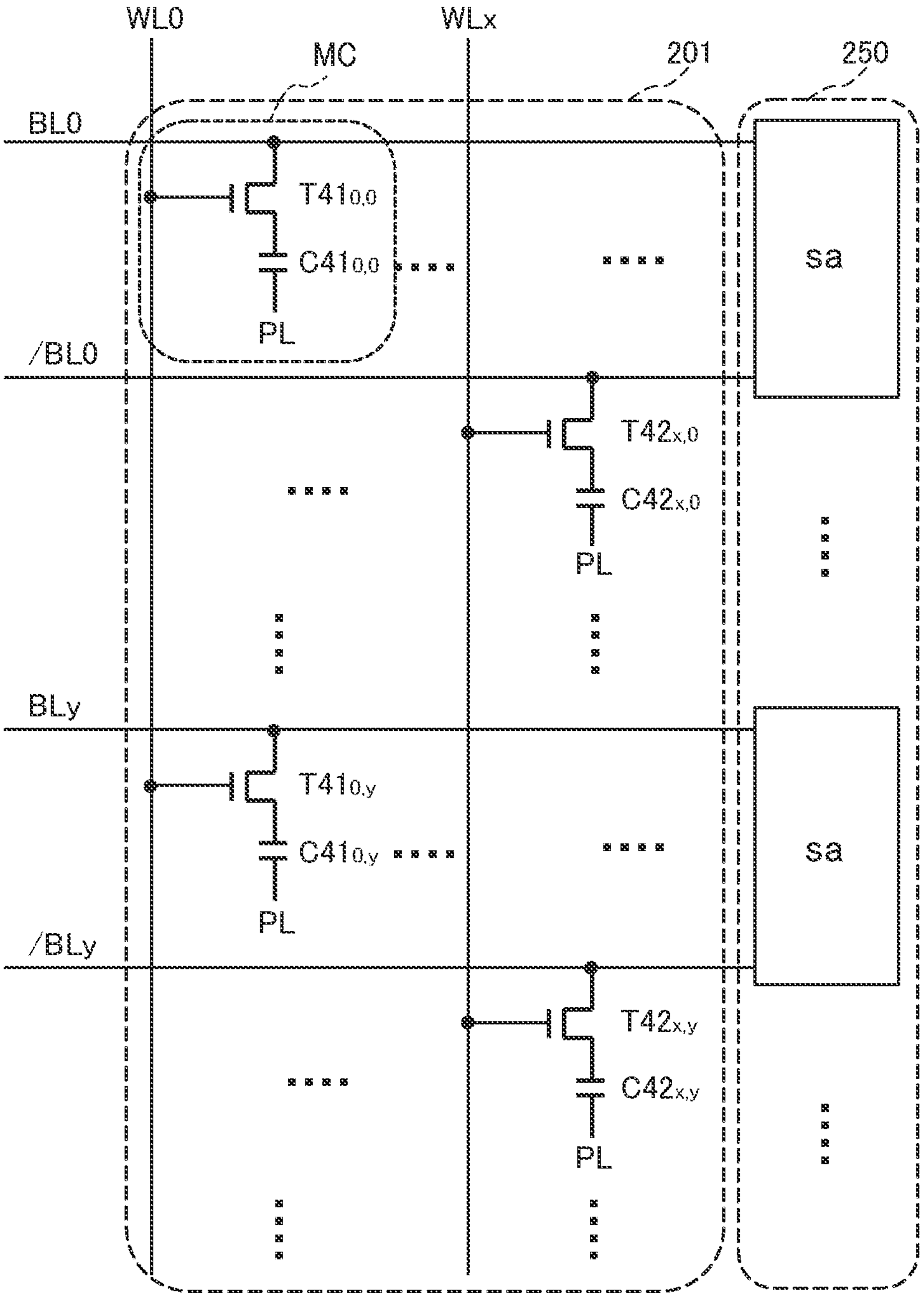
FIG. 33 is a schematic circuit diagram illustrating an exemplary configuration of a memory cell array according to an eighth embodiment.

FIG. 33 is a schematic circuit diagram illustrating an exemplary configuration of the memory cell array 201 according to an eighth embodiment. In each of the memory cell array 201, as illustrated in FIG. 33, the plurality of word lines WL (the word lines WL0, . . . WLx, . . . ) and the plurality of bit lines BL (the bit lines BL, /BL, . . . , BLy, /BLy, . . . ) are disposed in a matrix.

The memory cell array 201 according to the eighth embodiment includes the plurality of memory cells MC. The respective memory cells MC are disposed at portions (cross points) where the plurality of word lines intersect with the plurality of bit lines. The respective memory cells MC are connected to the word lines WL and the bit lines BL, /BL.

Each of the memory cells MC is configured of one cell transistor T41 and one cell capacitor C41. Such a configuration of memory cell MC is referred to as "1T1C" in some cases. As illustrated in FIG. 33, a first terminal of the cell transistor T41 is connected to the bit line BL, and a second terminal of the cell transistor T41 is connected to one terminal of the cell capacitor C41. The other terminal of the cell capacitor C41 is connected to the plate line PL. The plate line PL is applied with a predetermined voltage. A third terminal of the cell transistor T41 is connected to the word line WL.

A first terminal of a cell transistor T42 is connected to the bit line /BL, and a second terminal of the cell transistor T42 is connected to one terminal of a cell capacitor C42. The other terminal of the cell capacitor C42 is connected to the plate line PL. The plate line PL is applied with a predetermined voltage. A third terminal of the cell transistor T42 is connected to the word line WL.

Here, the first terminal is any one of the terminals of the source/drain of the cell transistor. The second terminal is the other terminal of the source/drain of the cell transistor. The third terminal is a gate terminal of the cell transistor.

The word line WL is applied with a voltage of a low level or a high level, the bit line BL is applied with a voltage of a low level or a high level, and thus, the cell transistors T41, T42 are turned ON or turned OFF. This causes an electric charge to be accumulated in the cell capacitor C41, C42 or causes an accumulated electric charge to be discharged.

The sense amplifier sa senses data read out from the memory cell MC. As illustrated in FIG. 33, the plurality of sense amplifiers sa are disposed corresponding to the plurality of bit lines [BL0, /BL], . . . [BLy, /BLy], . . . forming the pairs. The respective sense amplifiers sa are connected to the bit lines [BL0, /BL], . . . , [BLy, /BLy], . . . forming the pairs. Such connections between the bit lines BL, /BL and the sense amplifiers sa are referred to as a "folded bit line method".

[Structure of Memory Cell Array 201 and Contact Electrodes]

Figure 34:
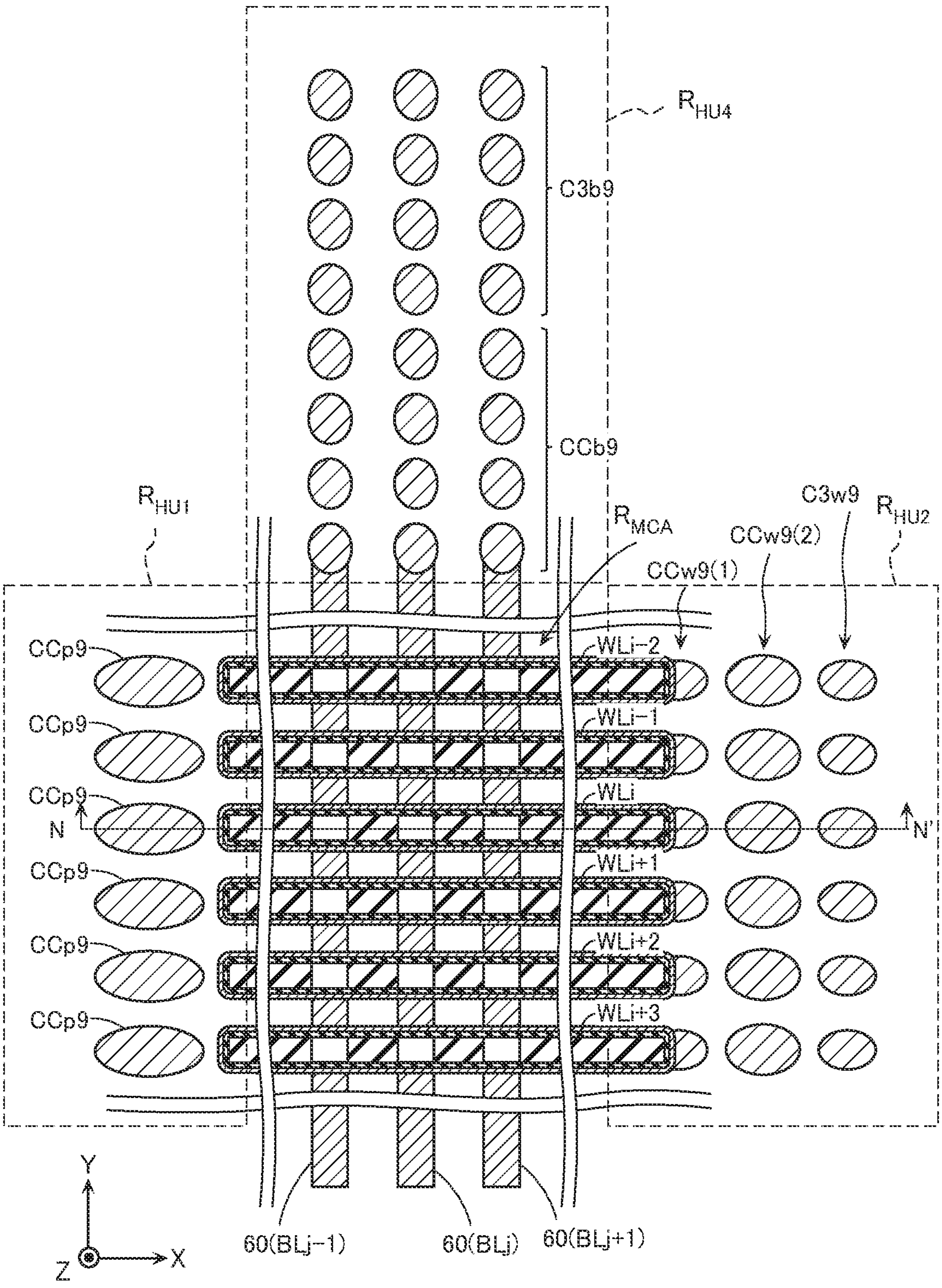
FIG. 34 is a schematic plan view illustrating an exemplary configuration of the memory cell array and contact electrodes according to the eighth embodiment.
Figure 35:
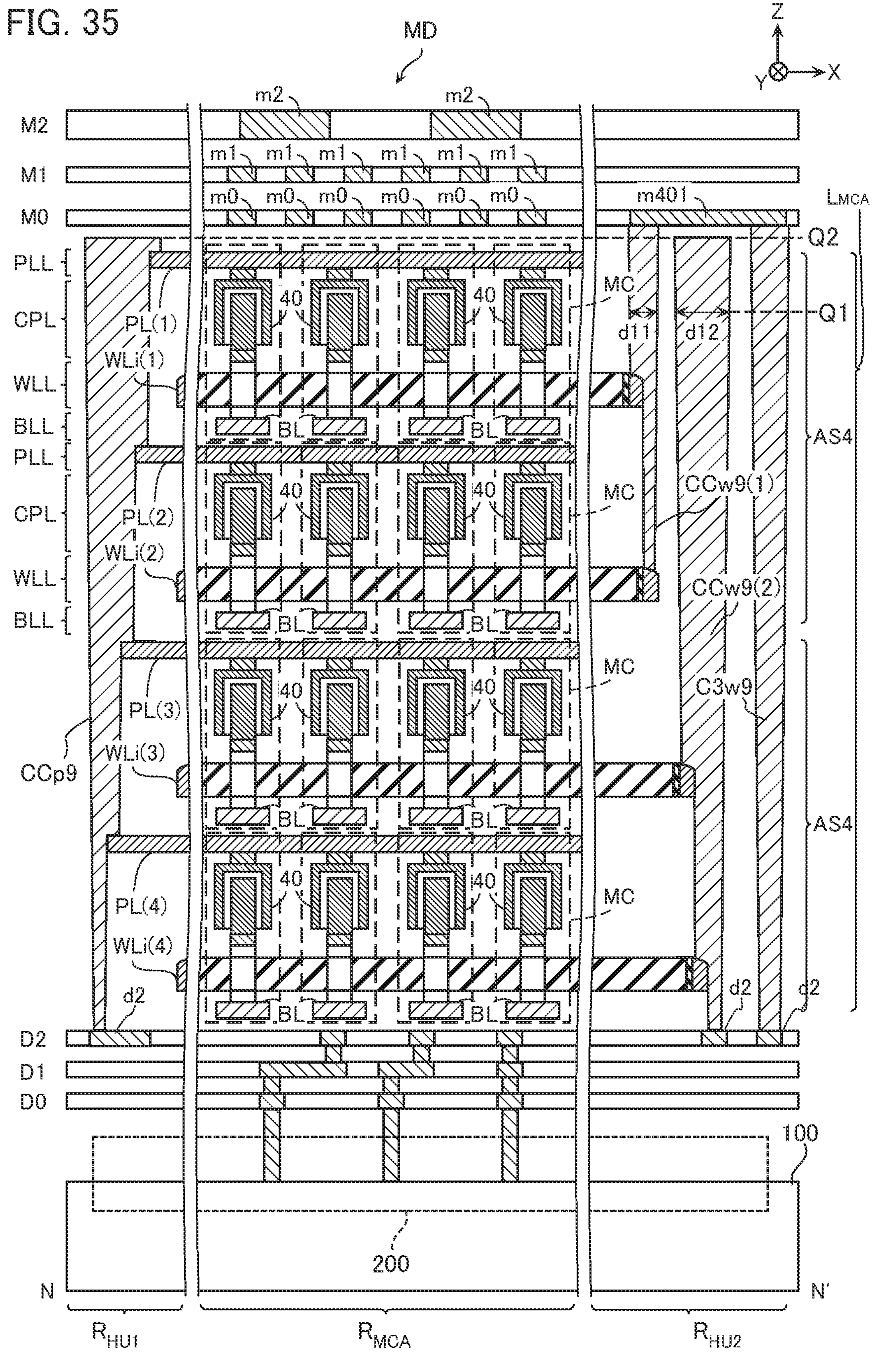
FIG. 35 is a schematic cross-sectional view of the structure illustrated in FIG. 34 taken along the line N-N', and viewed along a direction of the arrow.

FIG. 34 is a schematic plan view illustrating an exemplary configuration of the memory cell array 201 and contact electrodes according to an eighth embodiment. FIG. 35 is a schematic cross-sectional view of the structure illustrated in FIG. 34 taken along the line N-N', and viewed along a direction of the arrow.

Note that, in FIG. 34 and FIG. 35, an insulating layer (for example, an inter-layer insulating film) covering the components of the memory die MD is not illustrated. In FIG. 34 and FIG. 35, the same reference numerals are attached for the same configurations as the above-described configurations, and the description of the configuration is omitted.

[Memory Cell Array Region $R_{MCA}$]

For example, as illustrated in FIG. 35, the memory cell array region $R_{MCA}$ includes a plurality (two in the illustrated example) of array structures AS4 arranged in Z-direction. For example, as illustrated in FIG. 31, the array structure AS4 is, for example, configured similarly to the array structure AS3 described with reference to FIG. 24.

[Hook-Up Region]

For example, as illustrated in FIG. 34 and FIG. 35, in the first hook-up region $R_{HU2}$, contact electrodes CCw9, C3*w*9 extending in the Z-direction are disposed. Two contact electrodes CCw9 and one contact electrode C3*w*9 arranged in the X-direction are arranged in the Y-direction corresponding to the word lines WL.

In the first hook-up regions $R_{HU1}$, contact electrodes CCp9 extending in the Z-direction are disposed. Note that, the contact electrodes CCp9 have configurations the same as those of the contact electrodes CCp5 in FIG. 23 and FIG. 24 and the contact electrodes CCp8 in FIG. 31.

In the second hook-up region $R_{HU4}$, a plurality of contact electrodes CCb9, C3*b*9 extending in the Z-direction are disposed. The contact electrodes CCb9, C3*b*9 have configurations the same as those of the contact electrodes CCb8, C3*b*8 in FIG. 30 and FIG. 32.

[Contact Electrodes CCw9, C3*w*9]

A contact electrode CCw9(1) has a side surface connected to the word lines WLi(1), WLi(2), and has an upper end connected to a wiring m401 in the wiring layer M0. A contact electrode CCw9(2) has a side surface connected to the word lines WLi(3), WLi(4), and has a lower end connected to the wiring d2 in the wiring layer D2. A contact electrode C3*w*9 has an upper end connected to the wiring m401 in the wiring layer M0, and has a lower end connected to the wiring d2 in the wiring layer D2.

As illustrated in FIG. 35, the contact electrode CCw9(1) has a diameter d11 on a predetermined XY-plane Q1 smaller than a diameter d12 of the contact electrode CCw9(2) on the same XY-plane Q1. As illustrated in FIG. 35, the contact electrodes CCw9 have diameters that get smaller as approaching the bottom. If the contact electrode CCw9(1) and the CCw9(2) on the XY-plane Q1 have the same diameters, diameters at positions of the word lines WLi(1), WLi(2) in the contact electrode CCw9(1) are larger than diameters at positions of the word lines WLi(3), WLi(4) in the contact electrode CCw9(2). In this case, a contacted area between the contact electrode CCw9(1) and the word lines WLi(1), WLi(2) differs from a contacted area between the contact electrode CCw9(2) and the word lines WLi(3), WLi(4).

Therefore, each of the contact electrodes CCw9(1), CCw9(2) is formed such that the contacted area between the contact electrode CCw9(1) and the word lines WLi(1), WLi(2) and the contacted area between the contact electrode CCw9(2) and the word lines WLi(3), WLi(4) are the same or approximately the same. Therefore, the diameter d11 of the contact electrode CCw9(1) on the XY-plane Q1 is smaller than the diameter d12 of the contact electrode CCw9(2) on the same XY-plane Q1.

That is, the diameters of the contact electrodes CCw9 at the connection positions with the word lines WL are the same or approximately the same those in the respective plurality of contact electrodes CCw9.

As illustrated in FIG. 35, an upper end of the contact electrode CCp9 and an upper end of the contact electrode CCw9(2) may be at positions on the same XY-plane Q2. With such a configuration, the contact electrode CCp9 and the contact electrode CCw9(2) can be formed in the same process.

Note that, in FIG. 34 and FIG. 35, as in FIG. 25, the configuration of the word line WL, the bit line BL, the plate line PL, the cell transistor, and the cell capacitor 40 in a predetermined stage may be inverted upside down.

The memory die MD may be configured by combining the configurations in the above-described first embodiment to eighth embodiment as necessary. For example, the memory cell MC may be any of 2T1C, 2T2C, and 1T1C. An extraction method of the word line WL may be any of an extraction by the first hook-up region on one side or an extraction by the first hook-up regions on both the sides. An extraction method of the bit line BL may be any of an extraction by the first hook-up region on one side or an extraction by the first hook-up regions on both the sides. The word lines WL in the respective stages may be separately extracted or the word lines WL in the respective stages may be extracted in common. The bit lines BL in the respective stages may be separately extracted or the bit lines BL in the respective stages may be extracted in common. Any of the open bit line method or the folded bit line method may be employed. However, any one of the contact electrodes CCw and the contact electrodes CCb connect any one of the word lines WL and the bit lines BL in the plurality of stages in common, and the other ones connect the other ones of the word lines WL and the bit lines BL in the plurality of stages by individual stage. This is for the memory cells MC to normally operate.

Ninth Embodiment

Figure 36:
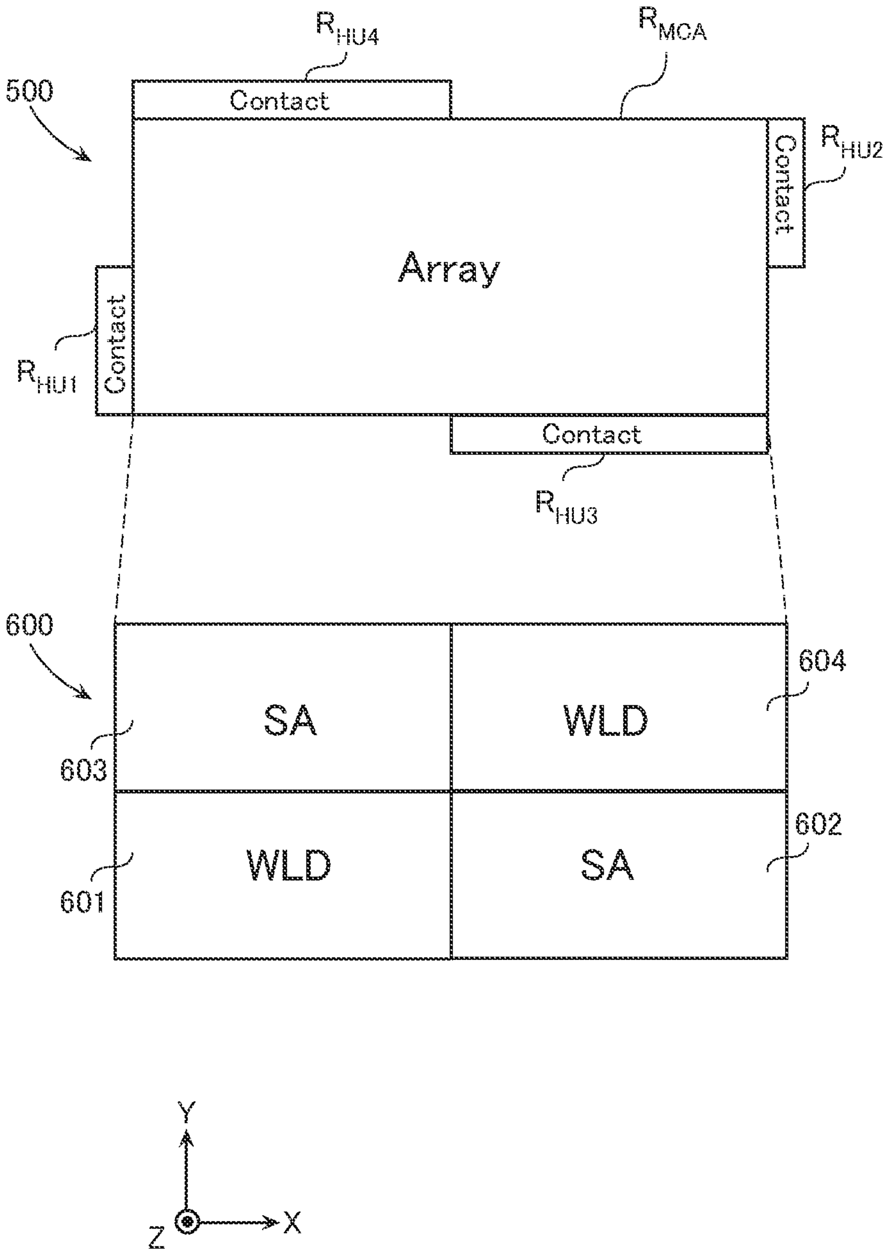
FIG. 36 is a schematic diagram illustrating a configuration of a region of a memory cell array and a region of a peripheral circuit according to a ninth embodiment.
Figure 37:
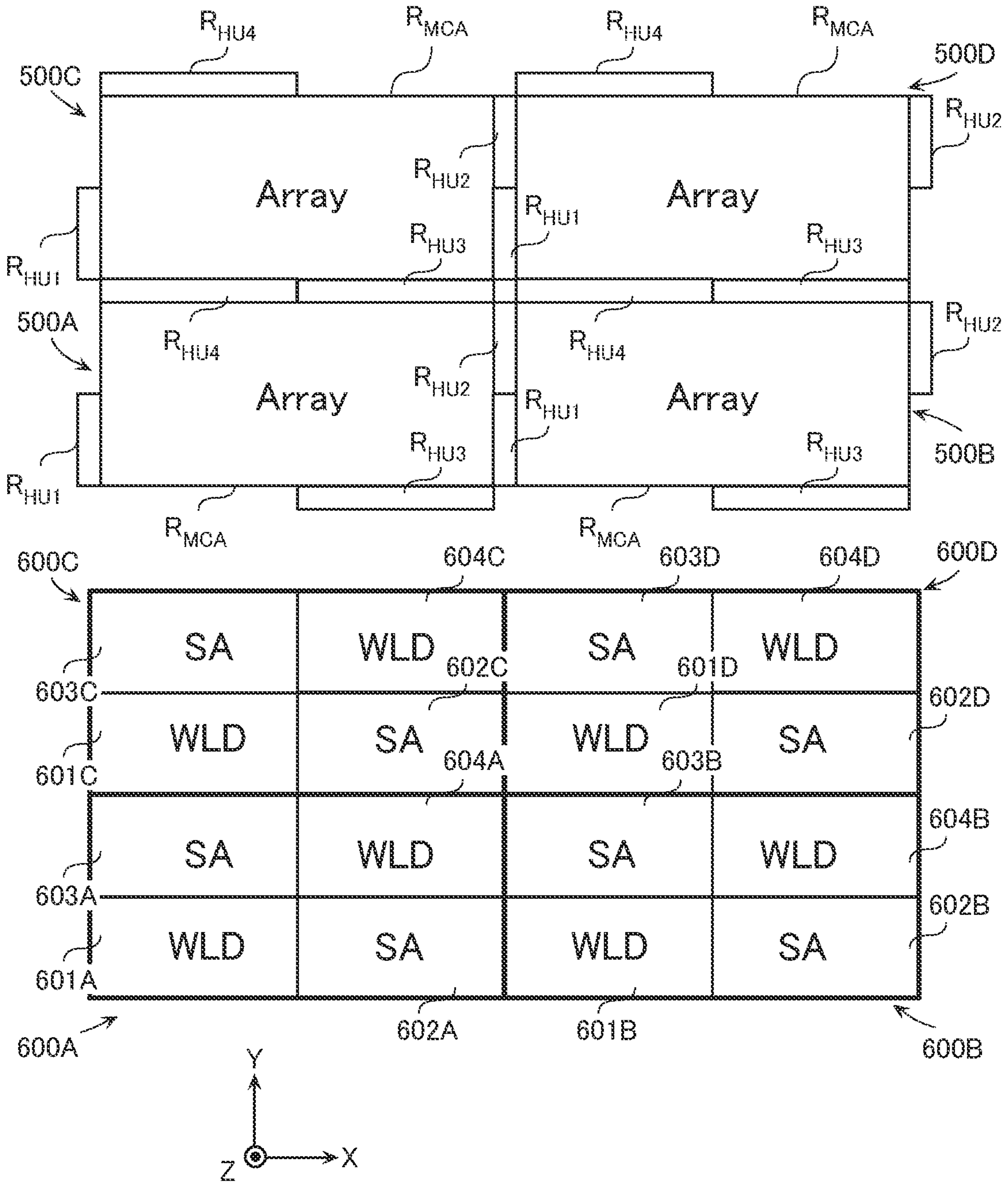
FIG. 37 is a schematic diagram illustrating a layout of the region illustrated in FIG. 36.

FIG. 36 is a schematic diagram illustrating a configuration of a region of a memory cell array and a region of a peripheral circuit according to a ninth embodiment. FIG. 37 is a schematic diagram illustrating a layout of the region illustrated in FIG. 36.

In FIG. 36, an array region 500 is exemplarily illustrated. The array region 500 corresponds to the memory cell array region $R_{MCA}$.

In the illustrated example, the first hook-up region $R_{HU1}$ is disposed on a −X side of the array region 500 and a −Y side with respect to a center position in the Y-direction of the array region 500. The first hook-up region $R_{HU1}$ includes a part of the plurality of word lines WL disposed on the −Y side with respect to the center position in the Y-direction of the array region 500, and the plurality of contact electrodes CCw connected to the part of the plurality of word lines WL disposed on the −Y side with respect to the center position in the Y-direction of the array region 500.

The first hook-up region $R_{HU2}$ is disposed on a +X side of the array region 500 and a +Y side with respect to the center position in the Y-direction of the array region 500. The first hook-up region $R_{HU2}$ includes a part of the plurality of word lines WL disposed on the +Y side with respect to the center position in the Y-direction of the array region 500, and the plurality of contact electrodes CCw connected to the part of the plurality of word lines WL disposed on the +Y side with respect to the center position in the Y-direction of the array region 500.

The second hook-up region $R_{HU3}$ is disposed on the −Y side of the array region 500 and the +X side with respect to the center position in the X-direction of the array region 500. The second hook-up region $R_{HU3}$ includes a part of the plurality of bit lines BL disposed on the +X side with respect to the center position in the X-direction of the array region 500, and the plurality of contact electrodes CCb connected to the part of the plurality of bit lines BL disposed on the +X side with respect to the center position in the X-direction of the array region 500.

The second hook-up region $R_{HU4}$ is disposed on the +Y side of the array region 500 and the −X side with respect to the center position in the X-direction of the array region 500. The second hook-up region $R_{HU4}$ includes a part of the plurality of bit lines BL disposed on the −X side with respect to the center position in the X-direction of the array region 500, and the plurality of contact electrodes CCb connected to the part of the plurality of bit lines BL disposed on the −X side with respect to the center position in the X-direction of the array region 500.

FIG. 36 exemplarily illustrates a peripheral circuit region 600. The peripheral circuit region 600 is a region in which the peripheral circuit 200 on the semiconductor substrate 100 is disposed. In a region on a −X side with respect to a center position in the X-direction and on a −Y side with respect to a center position in the Y-direction of the peripheral circuit region 600, a WLD region 601 is disposed. In a region on a +X side with respect to the center position in the X-direction and on the −Y side with respect to the center position in the Y-direction, an SA region 602 is disposed. In a region on the −X side respect to the center position in the X-direction and on a +Y side with respect to the center position in the Y-direction, an SA region 603 is disposed. In a region on the +X side with respect to the center position in the X-direction and on the +Y side with respect to the center position in the Y-direction, a WLD region 604 is disposed. The WLD regions 601, 604 are regions in which the word line drivers 220 are disposed. The SA regions 602, 603 are regions in which the sense amplifiers sa are disposed.

The word line driver 220 in the WLD region 601 is connected to the word lines WL via the contact electrodes CCw in the first hook-up region $R_{HU1}$. The word line driver 220 in the WLD region 604 is connected to the word lines WL via the contact electrodes CCw in the first hook-up region $R_{HU2}$. The sense amplifier sa in the SA region 602 is connected to the bit lines BL via the contact electrodes CCb in the second hook-up region $R_{HU3}$. The sense amplifier sa in the SA region 603 is connected to the bit lines BL via the contact electrodes CCb in the second hook-up region $R_{HU4}$.

In FIG. 37, as the array region 500 in FIG. 36, four array regions 500A, 500B, 500C, 500D are exemplarily illustrated. As the peripheral circuit region 600, four peripheral circuit regions 600A, 600B, 600C, 600D are exemplarily illustrated. The number of the array regions 500 and the peripheral circuit regions 600 disposed in one memory die MD may be four, or may be 16, 32, 64, 128, 256, or the like. Here, when the size of the memory die MD does not change, the more the number of the array regions 500 and the peripheral circuit regions 600 disposed in one memory die MD increases, the smaller one array region 500 becomes. The smaller the array region 500 is (the smaller the memory cell array 201 is), the smaller electrostatic capacities of the word line WL and the bit line BL become, thereby reducing a charging period. This ensures achieving an increased speed in operation. Note that the minimum machining dimension of the array region 500 may be larger or smaller than the minimum machining dimension of the peripheral circuit region 600.

In the case of the layout in FIG. 36 and FIG. 37, the word lines WL are extracted in the first hook-up region on one side, and the bit lines BL are extracted in the second hook-up region on one side. In the array region 500, the memory cell array 201 with the memory cell MC of 2T2C or 2T1C may be disposed, or the memory cell array 201 in the folded bit line method of 1T1C may be disposed.

Tenth Embodiment

Figure 38:
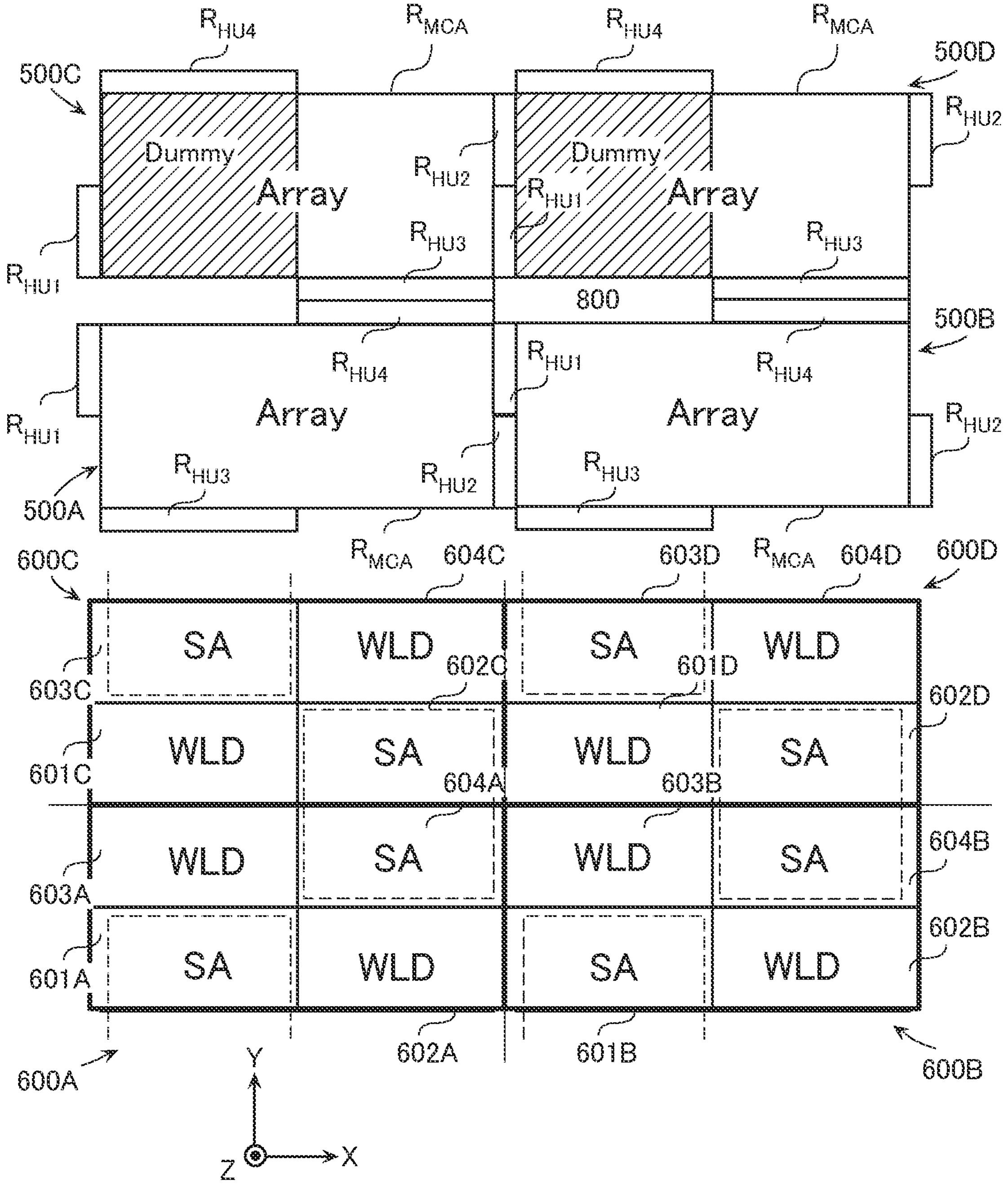
FIG. 38 is a schematic diagram illustrating a layout of a region of a memory cell array and a region of a peripheral circuit according to a tenth embodiment.

FIG. 38 is a schematic diagram illustrating a layout of a region of a memory cell array and a region of a peripheral circuit according to a tenth embodiment. The layout in FIG. 38 is basically similar to the layout in FIG. 37.

However, in the example in FIG. 38, arrangements of the first hook-up regions $R_{HU1}$, $R_{HU2}$ and the second hook-up regions $R_{HU3}$, $R_{HU4}$ corresponding to the array regions 500A, 500B are different from the layout in FIG. 37. That is, the first hook-up regions $R_{HU1}$ corresponding to the array regions 500A, 500B is disposed on the +Y side with respect to the center position in the Y-direction of the array regions 500A, 500B. The first hook-up regions $R_{HU2}$ corresponding to the array regions 500A, 500B is disposed on the −Y side with respect to the center position in the Y-direction of the array regions 500A, 500B. The second hook-up regions $R_{HU3}$ corresponding to the array regions 500A, 500B is disposed on the +X side with respect to the center position in the X-direction of the array regions 500A, 500B. The second hook-up regions $R_{HU4}$ corresponding to the array regions 500A, 500B is disposed on the −X side with respect to the center position in the X-direction of the array regions 500A, 500B.

In the example in FIG. 38, the common sense unit 250 is disposed across an SA region 604A in the peripheral circuit region 600A and an SA region 602C in the peripheral circuit region 600C. Similarly, the common sense unit 250 is disposed across an SA region 604B in the peripheral circuit region 600B and an SA region 602D in the peripheral circuit region 600D.

While the array region 500 in the ninth embodiment is disposed with the memory cell array 201 of 2T2C or 2T1C, the array region 500 in the tenth embodiment is disposed with the memory cell array 201 (FIG. 29 to FIG. 32) in the open bit line method of 1T1C.

Here, when the memory cell MC of 1T1C type is employed as illustrated in FIG. 29, the bit lines BL, /BL are connected to the respective sense amplifiers sa included in the sense unit 250. When the open bit line method is employed, as the bit lines BL, /BL, the bit lines BL included in the different memory cell array 201 are used. For example, the bit lines BL included in the array regions 500A, 500B are used as the normal bit lines BL, and the bit lines BL included in the array regions 500C, 500D are used as the bit lines /BL.

Here, for example, it is assumed that the array regions 500C, 500D are 1st array regions counted from an end portion on the +Y-direction side of the memory die MD, the array regions 500A, 500B are 2nd array regions counted from the end portion on the +Y-direction side of the memory die MD, and are not a 1st array region counted from an end portion on the −Y-direction side.

In this case, the plurality of bit lines BL disposed on the +X side with respect to the center position in the X-direction of the array region 500A are connected to the sense amplifiers sa in the sense unit 250 formed across the SA regions 604A, 602C. Similarly, the plurality of bit lines BL disposed on the +X side with respect to the center position in the X-direction of the array region 500B are connected to the sense amplifiers sa in the sense unit 250 formed across the SA regions 604B, 602D.

The plurality of bit lines BL disposed on the −X side with respect to the center position in the X-direction of the array regions 500A, 500B are connected to the sense amplifiers sa in the sense unit 250 formed across SA regions 601A, 601B and the respective SA regions adjacent to the SA regions 601A, 601B and not illustrated.

The plurality of bit lines BL disposed on the +X side with respect to the center position in the X-direction of the array regions 500C, 500D are connected to the sense amplifiers sa in the sense unit 250 formed across the SA regions 604A, 602C.

On the other hand, the plurality of bit lines BL disposed on the −X side with respect to the center position in the X-direction of the array regions 500C, 500D are not connected to the sense amplifiers sa. Such a memory cell MC connected to the bit line BL serves as, what is called, a dummy memory cell, and is similar to the memory cell MC on the structure, but does not allow the controller to specify an address for reading and writing. The sense amplifiers sa are not necessarily disposed in SA regions 603C, 603D.

Note that, in the example in FIG. 38, a region 800 is disposed between the second hook-up regions $R_{HU4}$ corresponding to the array regions 500A, 500B and between the second hook-up regions $R_{HU3}$ corresponding to the array regions 500C, 500D. In such a region 800, the contact electrodes and the like for connecting, for example, the wiring layers M0, M1, M2 to the wiring layers D0, D1, D2 may be disposed.

Eleventh Embodiment

Figure 39:
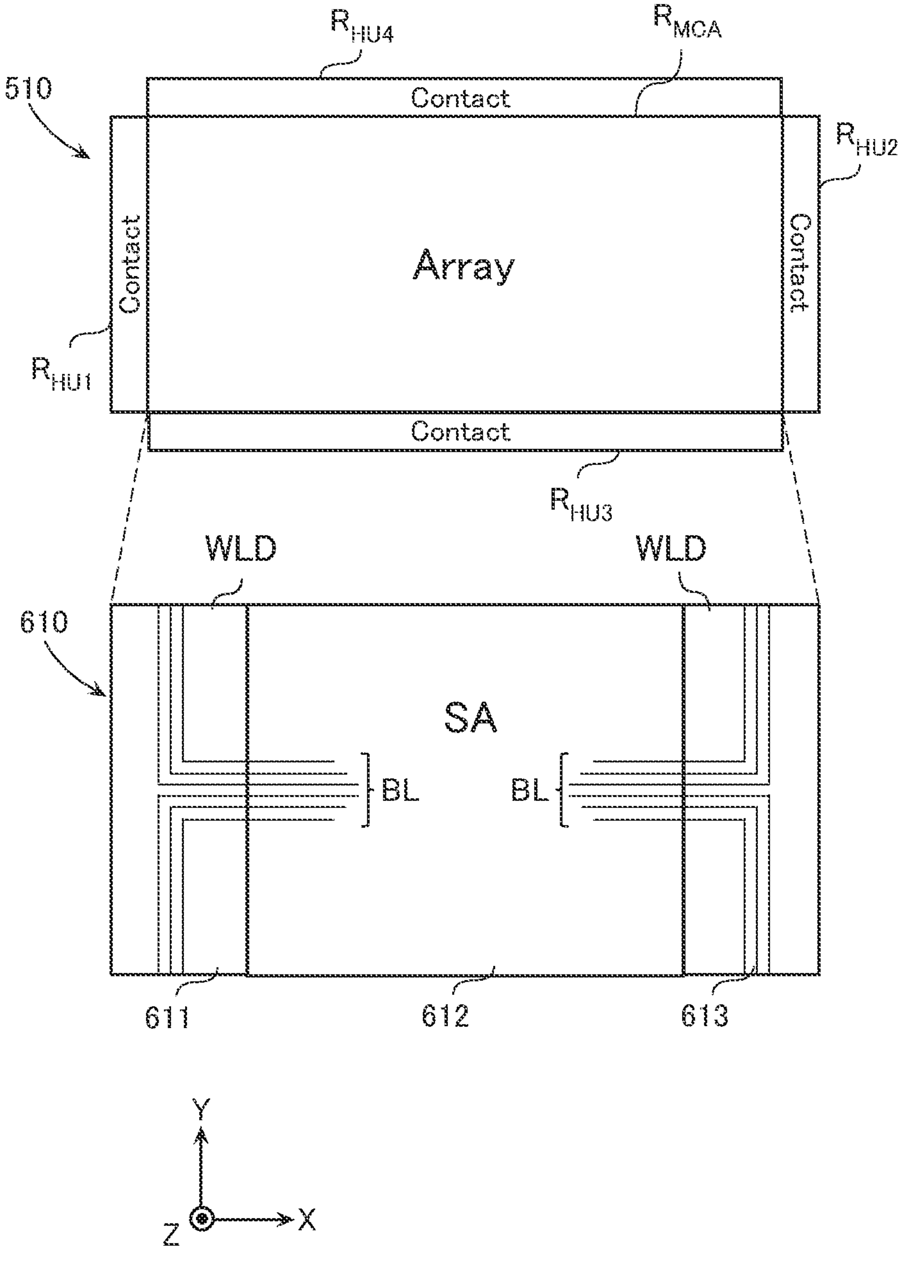
FIG. 39 is a schematic diagram illustrating a configuration of a region of a memory cell array and a region of a peripheral circuit according to an eleventh embodiment.
Figure 40:
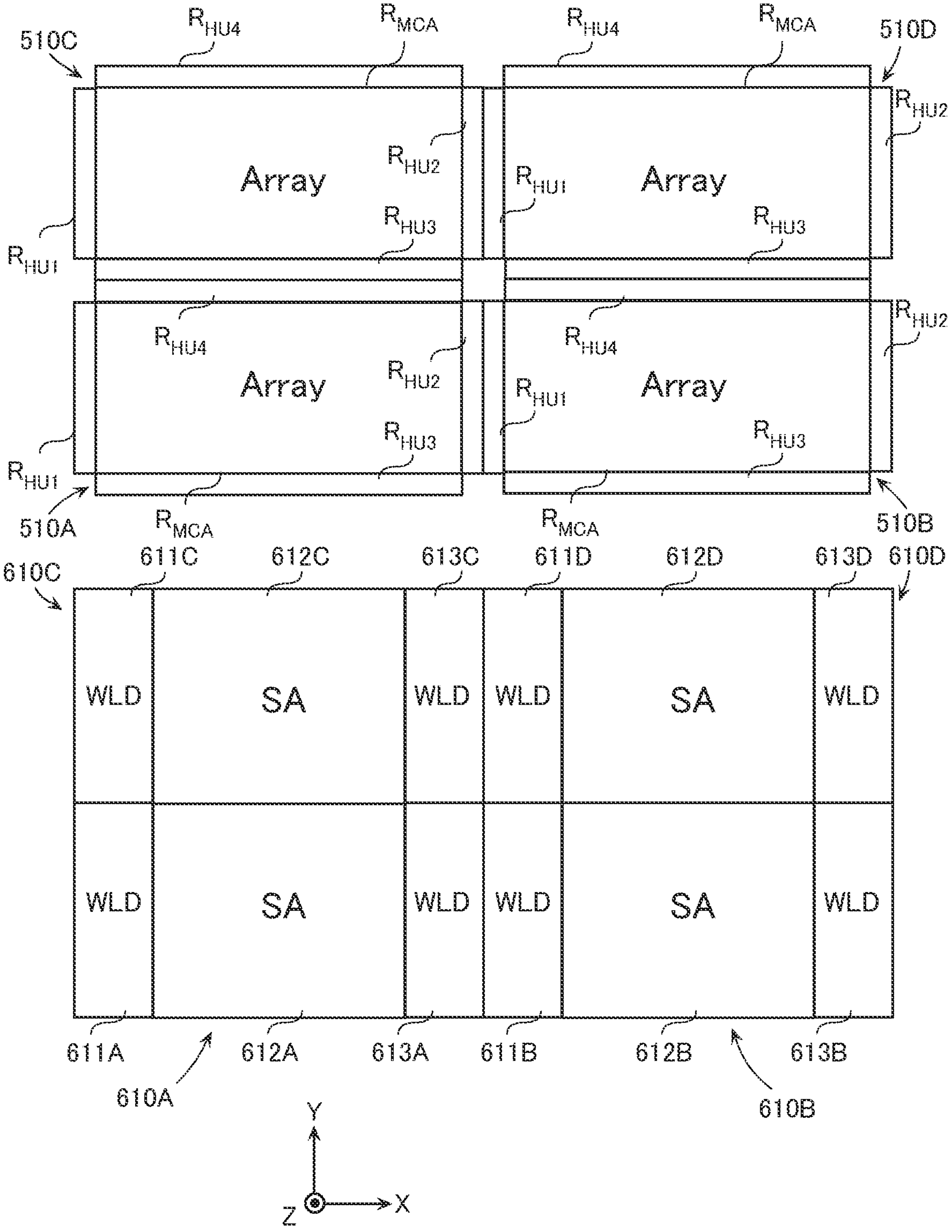
FIG. 40 is a schematic diagram illustrating a layout of the region illustrated in FIG. 39.

FIG. 39 is a schematic diagram illustrating a configuration of a region of a memory cell array and a region of a peripheral circuit according to an eleventh embodiment. FIG. 40 is a schematic diagram illustrating a layout of the region illustrated in FIG. 39.

FIG. 39 exemplarily illustrates an array region 510. The array region 510 corresponds to the memory cell array region $R_{MCA}$.

In the illustrated example, the first hook-up regions $R_{HU1}$ is formed on a-X side of the array region 510. The first hook-up region $R_{HU2}$ is formed on a +X side of the array region 510.

The second hook-up regions $R_{HU3}$ is formed on a −Y side of the array region 510. The second hook-up regions $R_{HU4}$ is formed on a +Y side of the array region 510.

In FIG. 39, a peripheral circuit region 610 is exemplarily illustrated. The peripheral circuit region 610 is a region in which the peripheral circuit 200 on the semiconductor substrate 100 is disposed. An SA region 612 is disposed in a center position in the X-direction of the peripheral circuit region 610. A WLD region 611 is disposed on a −X-direction side of the SA region 612. A WLD region 613 is disposed on a +X-direction side of the SA region 612. The WLD regions 611, 613 are regions in which the word line drivers 220 are disposed. The SA region 612 is a region in which the sense amplifier sa is disposed.

The word line driver 220 in the WLD region 611 is, for example, connected to the word lines WL in odd numbered rows via the contact electrodes CCw in the first hook-up region $R_{HU1}$. The word line driver 220 in the WLD region 613 is, for example, connected to the word lines WL in even numbered rows via the contact electrodes CCw in the first hook-up region $R_{HU2}$. At this time, the word lines WL, for example, extend in the X-direction on the wiring layer D0. The sense amplifier sa in the SA region 612 is connected to, for example, the bit lines BL in odd numbered rows via the contact electrodes CCb in the second hook-up region $R_{HU3}$, and is connected to, for example, the bit lines BL in even numbered rows via the contact electrodes CCb in the second hook-up region $R_{HU4}$. At this time, the bit lines BL extending from the contact electrodes CCb in the second hook-up regions $R_{HU3}$, $R_{HU4}$ at end portions in the X-direction, for example, extend in the Y-direction on the wiring layer D2, via the contacts CS2, extend in the X-direction on the wiring layer D1, and are connected to the sense amplifier sa.

In FIG. 40, as the array region 510 in FIG. 39, four array regions 510A, 510B, 510C, 510D are exemplarily illustrated. As the peripheral circuit region 610, four peripheral circuit regions 610A, 610B, 610C, 610D are exemplarily illustrated. Similarly to the ninth embodiment, the number of the array regions 510 and the peripheral circuit regions 610 disposed in one memory die MD is adjustable as necessary.

In the case of the layout in FIG. 39 and FIG. 40, the word lines WL are extracted in the first hook-up region $R_{HU1}$, $R_{HU2}$ disposed on both the sides in the X-direction, and the bit lines BL are extracted in the second hook-up region $R_{HU3}$, $R_{HU4}$ disposed on both the sides in the Y-direction. In the array region 510, the memory cell array 201 with the memory cell MC of 2T2C or 2T1C may be disposed, or the memory cell array 201 in the folded bit line method of 1T1C may be disposed.

Twelfth Embodiment

Figure 41:
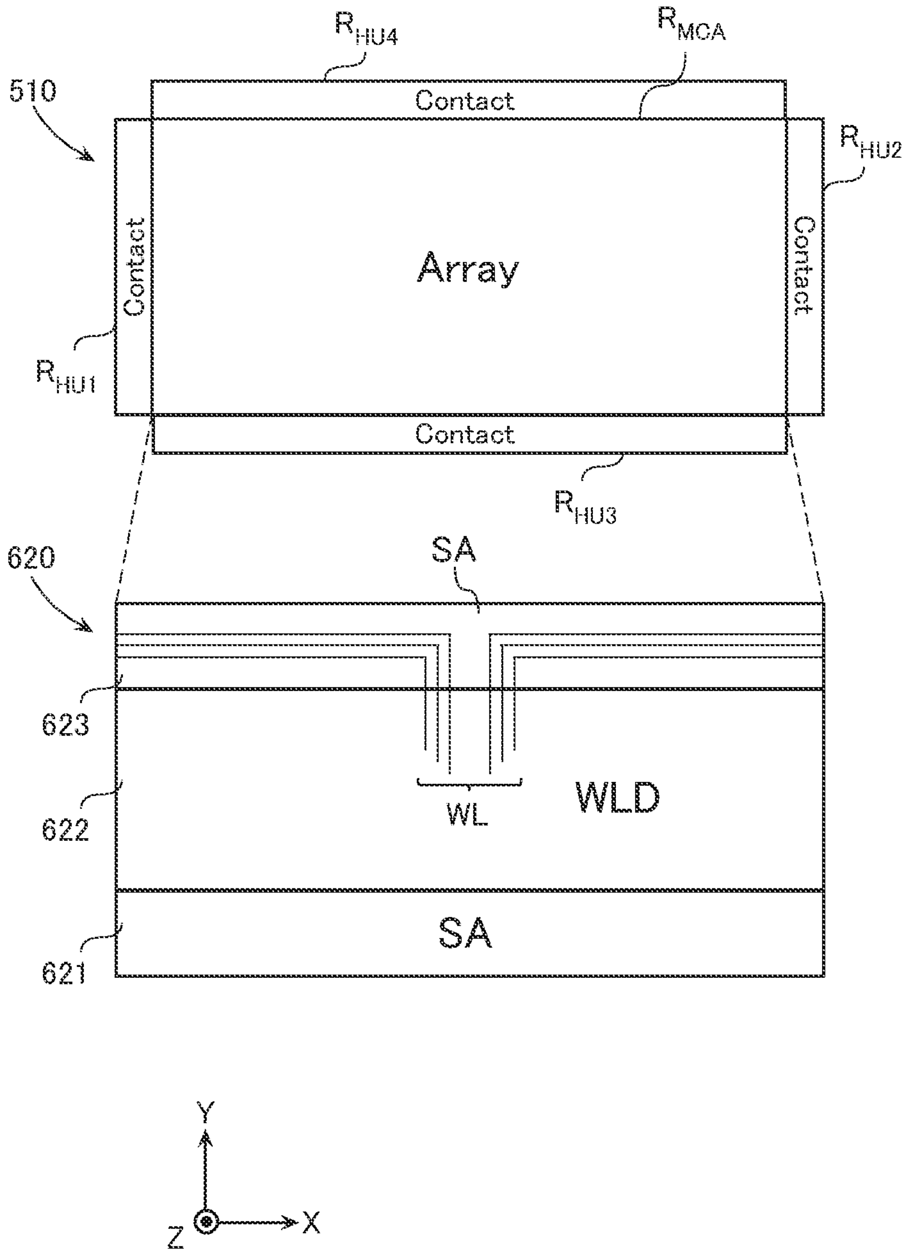
FIG. 41 is a schematic diagram illustrating a configuration of a region of a memory cell array and a region of a peripheral circuit according to a twelfth embodiment.
Figure 42:
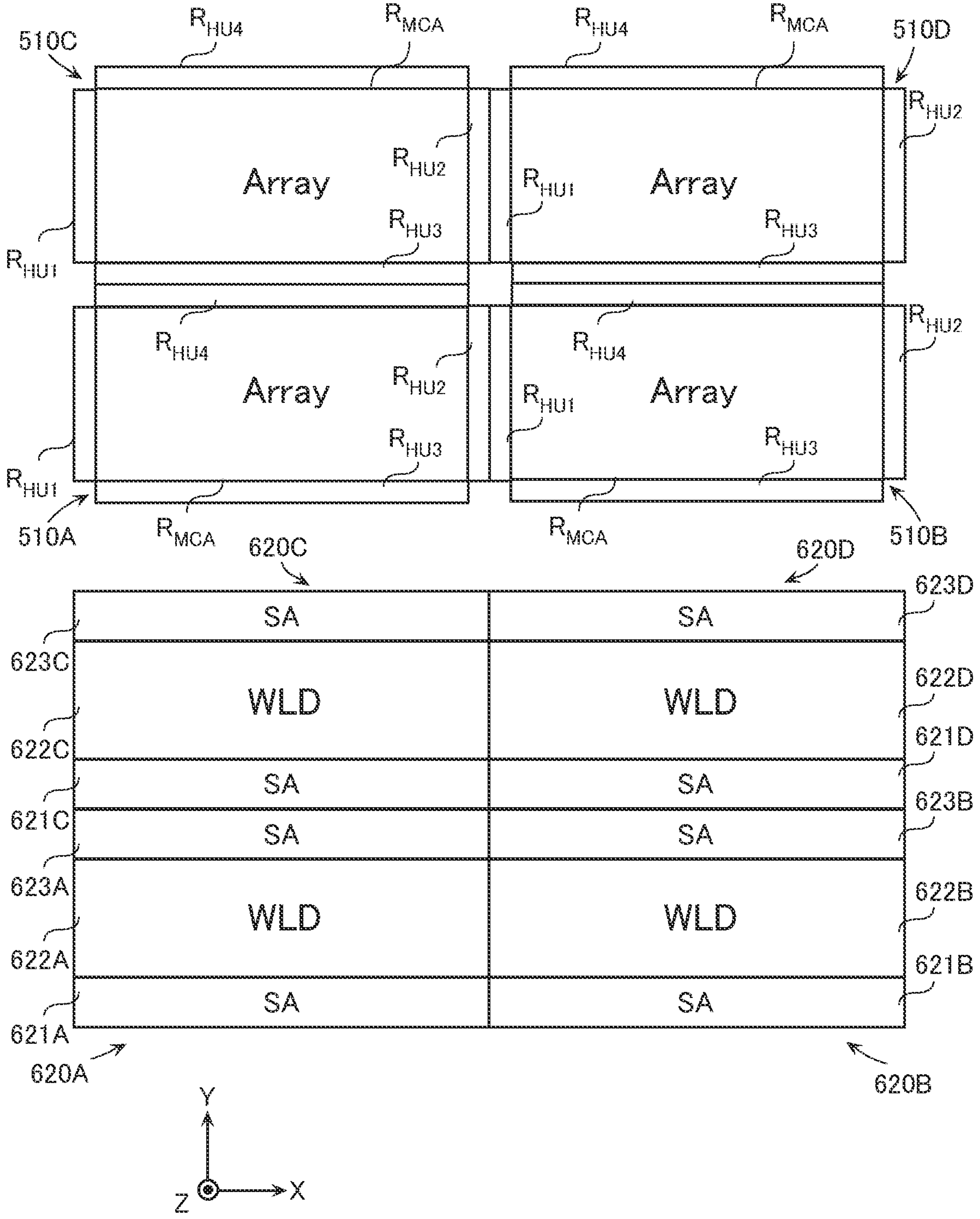
FIG. 42 is a schematic diagram illustrating a layout of the region illustrated in FIG. 41.

FIG. 41 is a schematic diagram illustrating a configuration of a region of a memory cell array and a region of a peripheral circuit according to a twelfth embodiment. FIG. 42 is a schematic diagram illustrating a layout of the region illustrated in FIG. 41.

FIG. 41 exemplarily illustrates the array region 510. The array region 510 in FIG. 41 has a configuration the same as that of the array region 510 in FIG. 39.

FIG. 41 exemplarily illustrates a peripheral circuit region 620. The peripheral circuit region 620 is a region in which the peripheral circuit 200 on the semiconductor substrate 100 is disposed. A WLD region 622 is disposed in a center position in the Y-direction of the peripheral circuit region 610. An SA region 621 is disposed on a −Y-direction side of the WLD region 622. An SA region 623 is disposed on a +Y-direction side of the WLD region 622. The SA region 621 is a region in which the sense amplifier sa is disposed. The SA region 623 is a region in which the sense amplifier sa is disposed. The WLD region 622 is a region in which the word line driver 220 is disposed.

The word lines WL are connected to the word line driver 220 of the WLD region 622 via the contact electrodes CCw in the first hook-up regions $R_{HU1}$, $R_{HU2}$. At this time, the word lines WL extending from the contact electrodes CCw in the first hook-up regions $R_{HU1}$, $R_{HU2}$ at end portions in the Y-direction, for example, extend in the X-direction on the wiring layer D2, via the contacts CS2, extend in the Y-direction on the wiring layer D1, and are connected to the word line driver 220. The bit lines BL are connected to the sense amplifier sa in the SA region 621 via the contact electrodes CCb in the second hook-up region $R_{HU3}$. The bit lines BL are connected to the sense amplifier sa in the SA region 623 via the contact electrode CCb in the second hook-up region $R_{HU4}$. At this time, the bit lines BL, for example, extend in the Y-direction on the wiring layer D0.

In FIG. 42, as the array region 510 in FIG. 41, the four array regions 510A, 510B, 510C, 510D are exemplarily illustrated. As the peripheral circuit region 620, four peripheral circuit regions 620A, 620B, 620C, 620D are exemplarily illustrated. Similarly to the ninth embodiment, the number of the array regions 510 and the peripheral circuit regions 610 disposed in one memory die MD is adjustable as necessary.

In the case of the layout in FIG. 41 and FIG. 42, the word lines WL are extracted in the first hook-up regions $R_{HU1}$, $R_{HU2}$ disposed on both the sides in the X-direction, and the bit lines BL are extracted in the second hook-up regions $R_{HU3}$, $R_{HU4}$ disposed on both the sides in the Y-direction. In the array region 510, the memory cell array 201 with the memory cell MC of 2T2C or 2T1C may be disposed, or the memory cell array 201 in the folded bit line method of 1T1C may be disposed.

Thirteenth Embodiment

Figure 43:
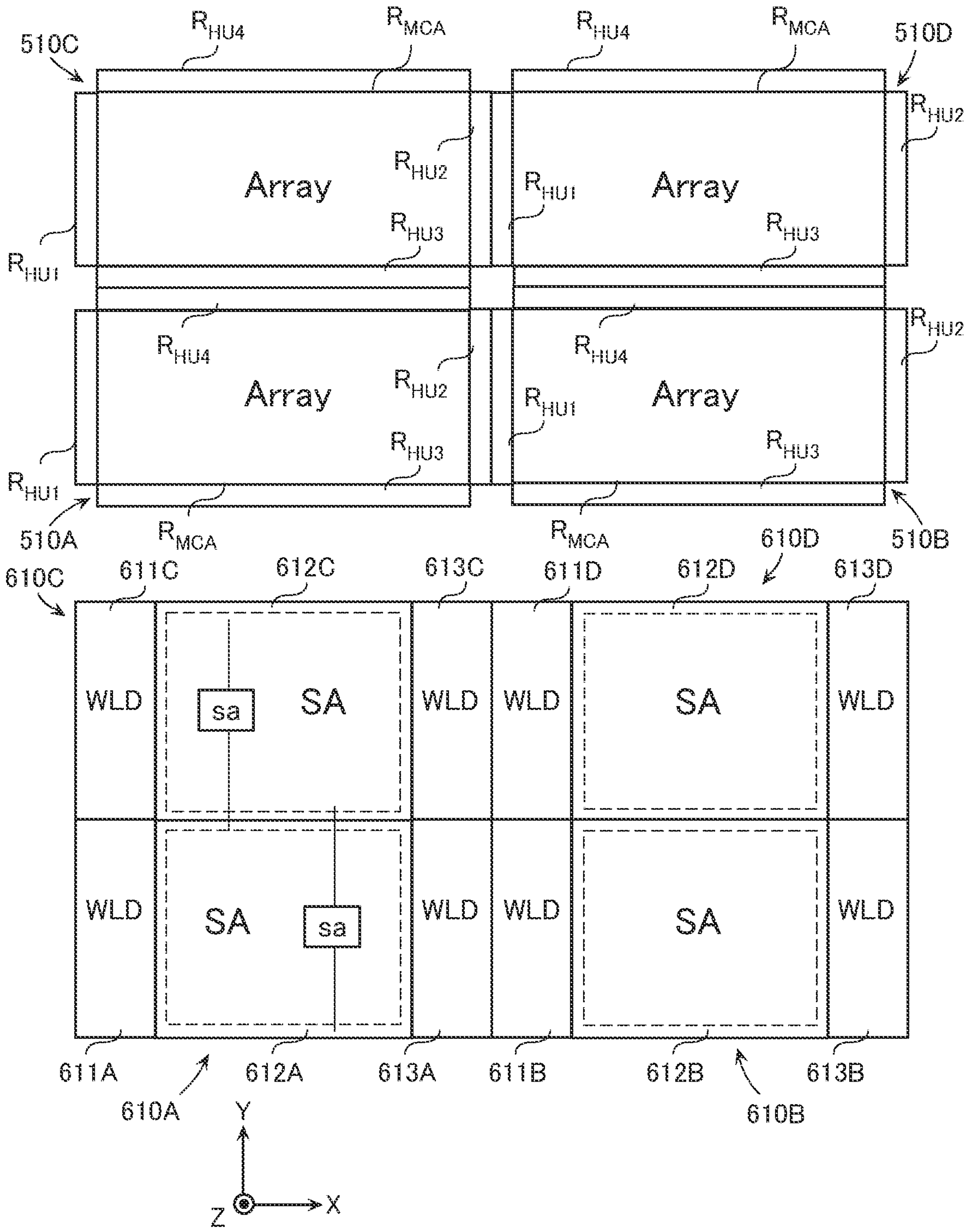
FIG. 43 is a schematic diagram illustrating a layout of a region of a memory cell array and a region of a peripheral circuit according to a thirteenth embodiment.

FIG. 43 is a schematic diagram illustrating a layout of a region of a memory cell array and a region of a peripheral circuit according to a thirteenth embodiment. The layout in FIG. 43 is basically similar to the layout in FIG. 40.

However, in the example in FIG. 43, the common sense unit 250 is disposed across an SA region 612A in the peripheral circuit region 610A and an SA region 612C in the peripheral circuit region 610C. Similarly, the common sense unit 250 is disposed across an SA region 612B in the peripheral circuit region 610B and an SA region 612D in the peripheral circuit region 610D.

While the array region 510 in the eleventh embodiment is disposed with the memory cell array 201 of 2T2C or 2T1C, the array region 510 in the thirteenth embodiment is disposed with the memory cell array 201 (FIG. 29 to FIG. 32) in the open bit line method of 1T1C.

Therefore, for example, the bit lines BL included in the array regions 510A, 510B are used as the normal bit lines BL, and the bit lines BL included in the array regions 510C, 510D are used as the bit lines /BL. The sense amplifier sa in the SA region 612C is, for example, connected to the bit lines in the array region 510A via the contact electrodes CCb in the second hook-up region $R_{HU4}$, and in addition, is connected to the bit lines in the array region 510C via the contact electrodes CCb in the second hook-up region $R_{HU4}$. The sense amplifier sa in the SA region 612A is, for example, connected to the bit lines in the array region 510A via the contact electrodes CCb in the second hook-up region $R_{HU3}$, and in addition, is connected to the bit lines in the array region 510C via the contact electrodes CCb in the second hook-up region $R_{HU3}$.

Fourteenth Embodiment

Figure 44:
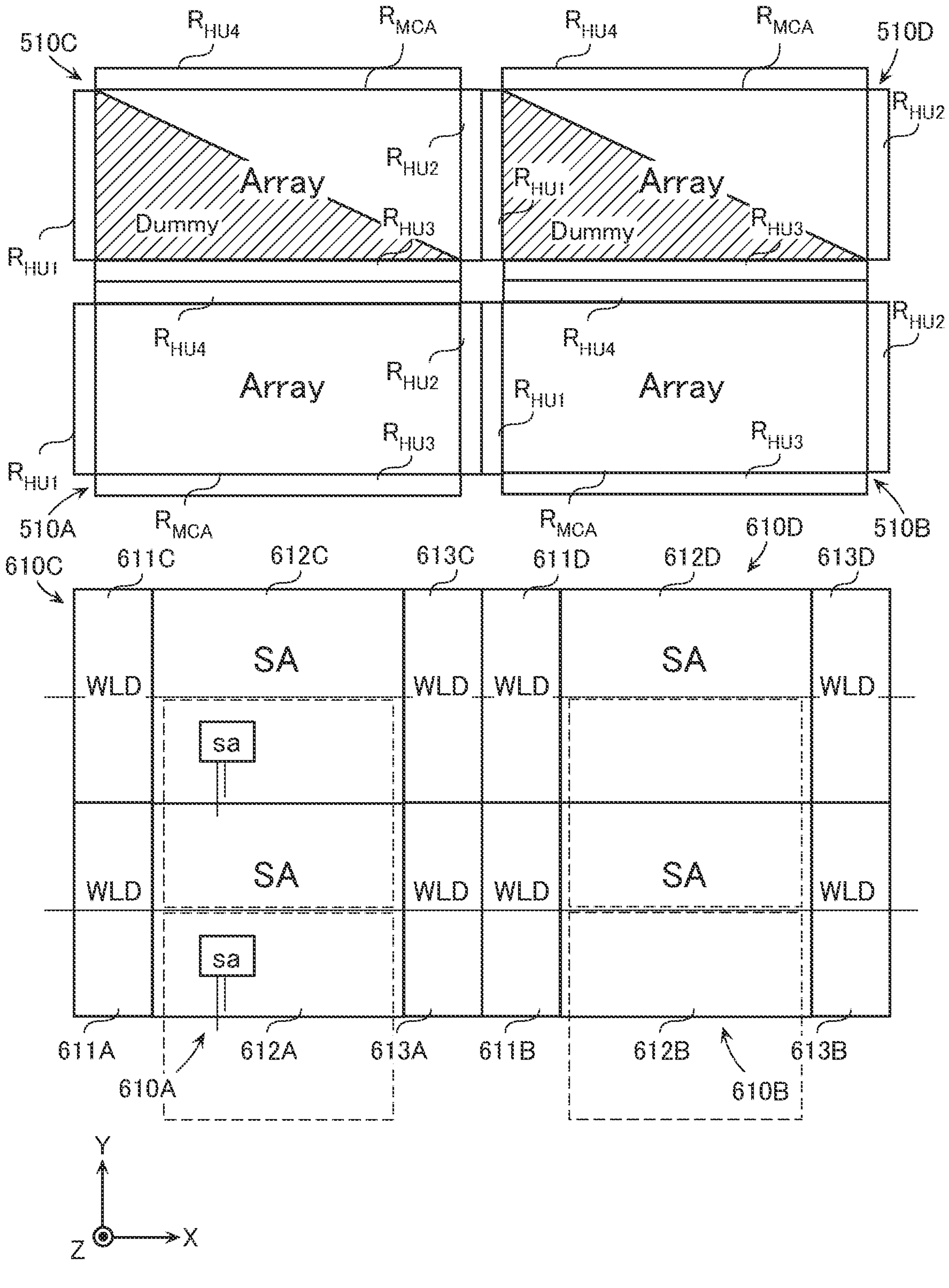
FIG. 44 is a schematic diagram illustrating a layout of a region of a memory cell array and a region of a peripheral circuit according to a fourteenth embodiment.

FIG. 44 is a schematic diagram illustrating a layout of a region of a memory cell array and a region of a peripheral circuit according to a fourteenth embodiment. The layout in FIG. 44 is basically similar to the layout in FIG. 43.

However, in the example in FIG. 44, a half of the bit lines BL in the array regions 510A to 510D (for example, the bit lines in even-numbered rows) are connected to the sense amplifier sa via the contact electrodes CCb in the second hook-up region $R_{HU3}$, and the remaining half (for example, the bit lines in odd-numbered rows) are connected to the sense amplifier sa via the contact electrodes CCb in the second hook-up region $R_{HU4}$.

Here, for example, it is assumed that the array regions 510C, 510D are 1st array regions counted from an end portion on the +Y-direction side of the memory die MD, the array regions 510A, 510B are 2nd array regions counted from the end portion on the +Y-direction side of the memory die MD, and are not 1st array regions counted from an end portion on the −Y-direction side.

In this case, similarly to the tenth embodiment, a part of the memory cells MC (for example, the memory cells MC connected to the bit lines in the odd-numbered rows) in the array regions 510C, 510D disposed at the end portion in the memory die MD in the Y-direction serve as dummy memory cells. For example, a part of the plurality of bit lines BL (for example, the bit lines in the even-numbered rows) included in such array regions 510C, 510D is connected to the sense amplifier sa via the contact electrodes CCb in the second hook-up region $R_{HU3}$. On the other hand, other bit lines BL (for example, the bit lines in the odd-numbered rows) are not connected to the sense amplifier sa. The memory cell MC connected to such bit lines BL serve as the dummy memory cells. In a part of the SA regions 612C, 612D, the sense amplifiers sa are not necessarily disposed.

Fifteenth Embodiment

Figure 45:
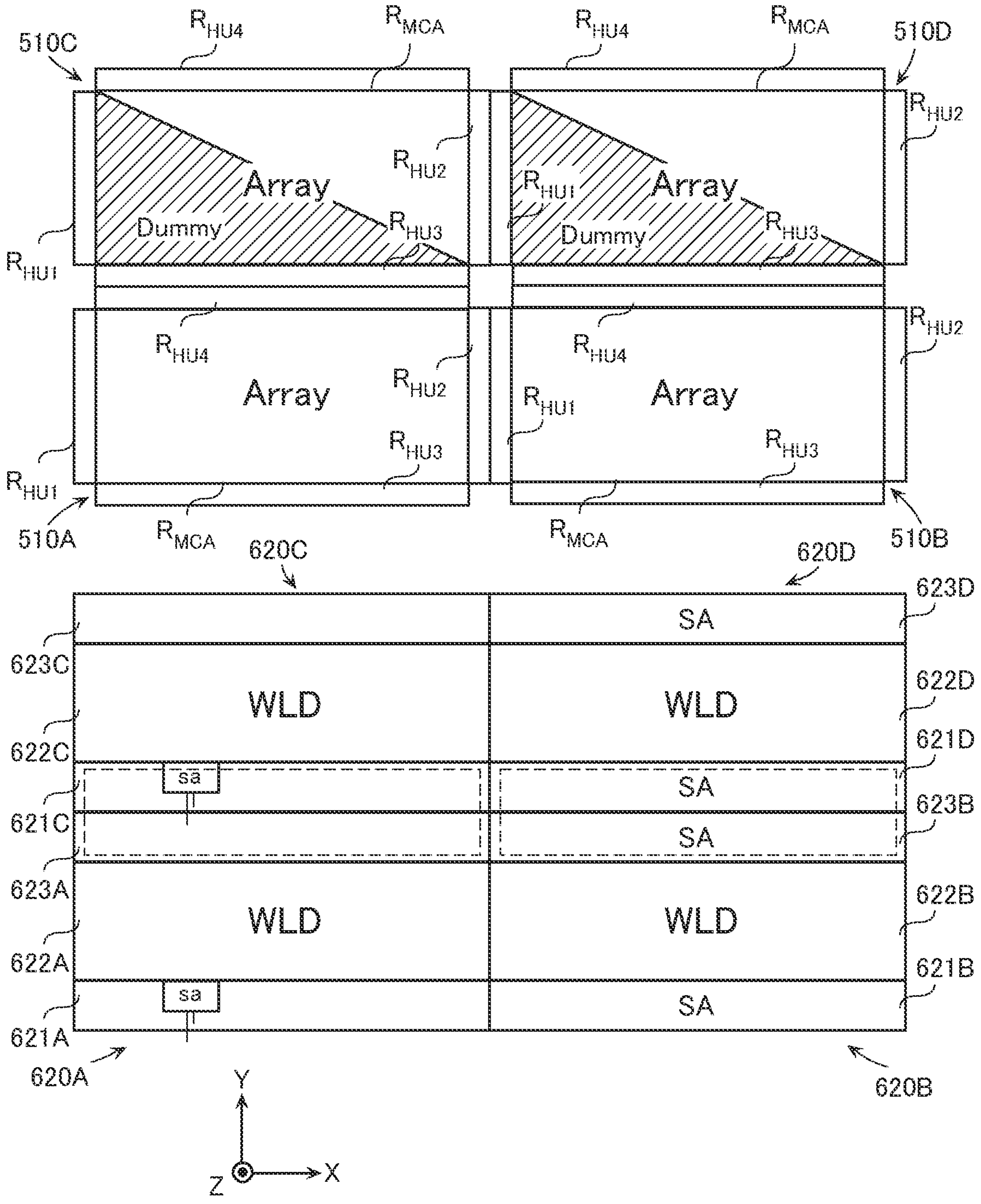
FIG. 45 is a schematic diagram illustrating a layout of a region of a memory cell array and a region of a peripheral circuit according to a fifteenth embodiment.

FIG. 45 is a schematic diagram illustrating a layout of a region of a memory cell array and a region of a peripheral circuit according to a fifteenth embodiment. The layout in FIG. 45 is basically similar to the layout in FIG. 42.

However, in the example in FIG. 45, the contact electrodes CCb in the second hook-up region $R_{HU4}$ corresponding to the array regions 510C, 510D are not used. The sense amplifiers sa are not disposed in SA regions 623C, 623D, or the sense amplifiers sa in the SA regions 623C, 623D are not used.

While the array region 510 in the twelfth embodiment is disposed with the memory cell array 201 of 2T2C or 2T1C, the array region 510 in the fifteenth embodiment is disposed with the memory cell array 201 (FIG. 29 to FIG. 32) in the open bit line method of 1T1C.

Therefore, for example, the bit lines BL included in the array regions 510A, 510B are used as the normal bit lines BL, and the bit lines BL included in the array regions 510C, 510D are used as the bit lined /BL.

Here, for example, it is assumed that the array regions 510C, 510D are the 1st array regions counted from the end portion on the +Y-direction side of the memory die MD, the array regions 510A, 510B are the 2nd array regions counted from the end portion on the +Y-direction side of the memory die MD, and are not the 1st array regions counted from the end portion on the −Y-direction side.

In this case, the sense amplifiers sa in SA regions 623A, 621C are, for example, connected to the bit lines in the array region 510A via the contact electrodes CCb in the second hook-up region $R_{HU4}$, and in addition, connected to the bit lines in the array region 510C via the contact electrode CCb in the second hook-up regions $R_{HU3}$. The sense amplifiers sa in SA regions 623B, 621D are, for example, connected to the bit lines in the array region 510B via the contact electrodes CCb in the second hook-up region $R_{HU4}$, and in addition, connected to the bit lines in the array region 510D via the contact electrodes CCb in the second hook-up regions $R_{HU3}$. The memory cells MC (for example, the memory cells MC connected to the bit lines in the odd-numbered rows) connected to the contact electrodes CCb in the second hook-up region $R_{HU4}$ in the array regions 510C, 510D disposed at the end portions in the memory die MD in the Y-direction serve as the dummy memory cells.

Note that, the sense amplifiers sa in the sense unit 250 formed across SA regions 621A, 621B and the respective SA regions adjacent to the SA regions 621A, 621B and not illustrated are also similar to the sense amplifiers sa in the SA regions 623A, 621C and the SA regions 623B, 621D.

With such an arrangement, wiring distances from the bit lines BL, /BL to the sense amplifiers sa can be reduced. Therefore, an increased speed of the operation can be achieved.

Sixteenth Embodiment

Figure 46:
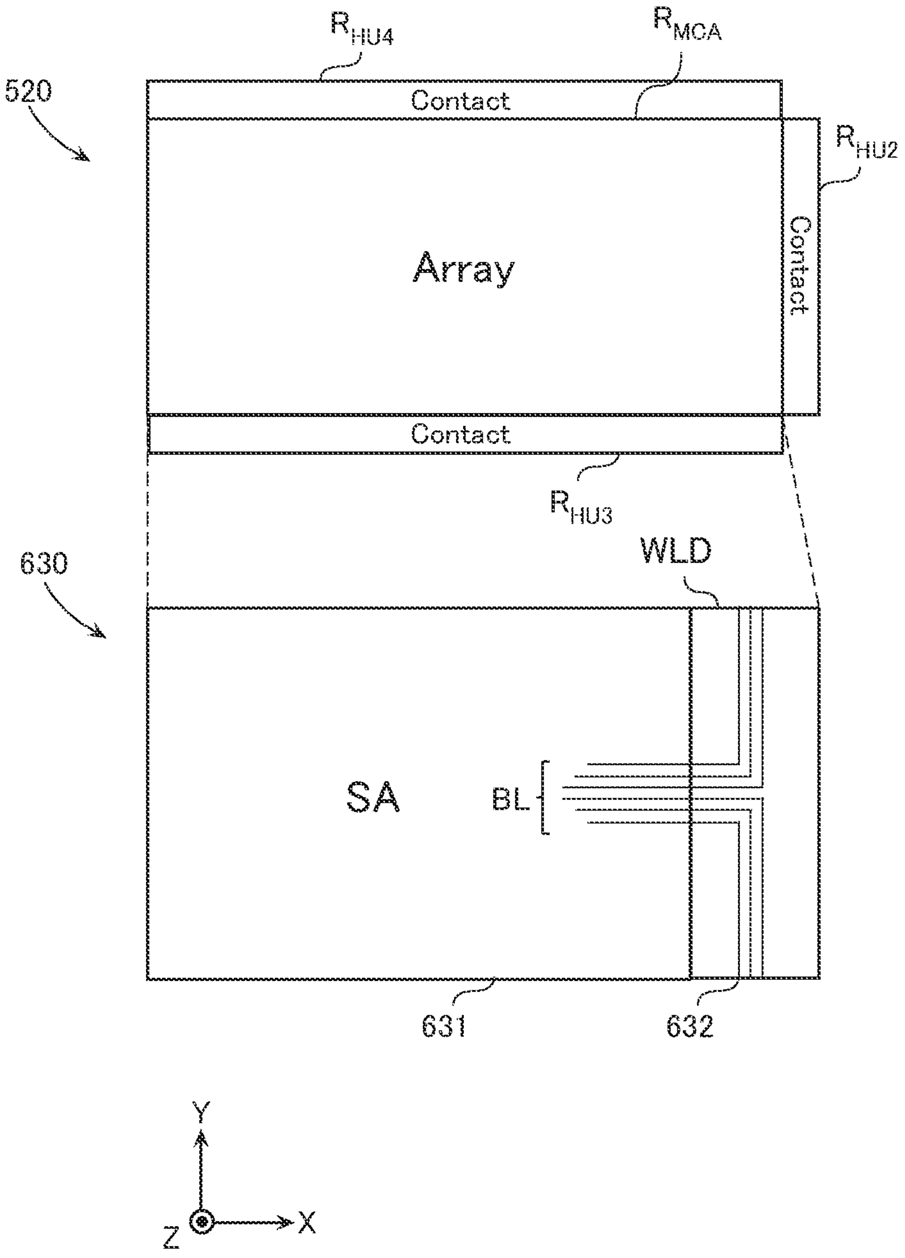
FIG. 46 is a schematic diagram illustrating a configuration of a region of a memory cell array and a region of a peripheral circuit according to a sixteenth embodiment.
Figure 47:
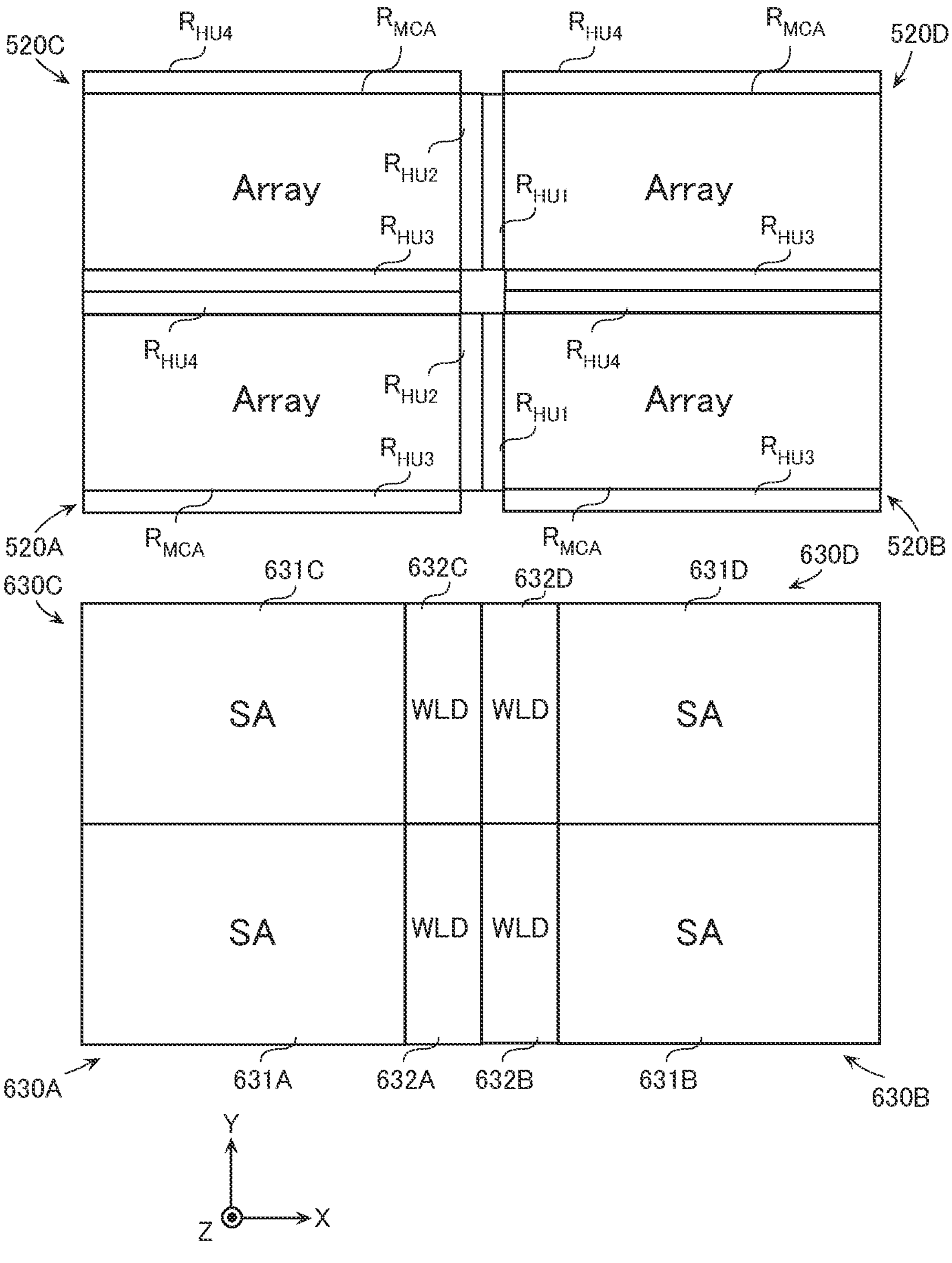
FIG. 47 is a schematic diagram illustrating a layout of the region illustrated in FIG. 46.

FIG. 46 is a schematic diagram illustrating a configuration of a region of a memory cell array and a region of a peripheral circuit according to a sixteenth embodiment. FIG. 47 is a schematic diagram illustrating a layout of the region illustrated in FIG. 46.

FIG. 46 exemplarily illustrates an array region 520. The array region 520 is basically configured similarly to the array region 510. However, while the first hook-up regions $R_{HU1}$ is disposed on the −X side of the array region 510, the first hook-up regions $R_{HU1}$ is not disposed on the −X side of the array region 520.

FIG. 46 exemplarily illustrates a peripheral circuit region 630. The peripheral circuit region 630 is basically configured similarly to the peripheral circuit region 610. However, in the peripheral circuit region 610, the WLD region 611 is disposed on the −X-direction side of the SA region 612. On the other hand, while the peripheral circuit region 630 includes an SA region 631 and a WLD region 632 disposed on the +X-direction side of the SA region 631, the WLD region 611 is not disposed on the −X-direction side of the SA region 631. Note that, the SA region 631 is a region disposed in the sense amplifier sa. The WLD region 632 is a region in which the word line driver 220 is disposed.

The word lines WL are connected to the word line driver 220 in the WLD region 632 via the contact electrodes CCw in the first hook-up region $R_{HU2}$. At this time, the word lines WL, for example, extend in the X-direction on the wiring layer D0. The bit lines BL are connected to the sense amplifier sa in the SA region 631 via the contact electrodes CCb in the second hook-up regions $R_{HU3}$, $R_{HU4}$. At this time, the bit lines BL extending from the contact electrodes CCb in the second hook-up regions $R_{HU3}$, $R_{HU4}$ at the end portion in the −X-direction, for example, extend in the Y-direction on the wiring layer D2, via vias, extend in the X-direction on the wiring layer D1, and are connected to the sense amplifier sa.

FIG. 47 exemplarily illustrates four array regions 520A, 520B, 520C, 520D as the array region 520 in FIG. 46. As the peripheral circuit region 630, four peripheral circuit regions 630A, 630B, 630C, 630D are exemplarily illustrated. Similarly to the ninth embodiment, the number of the array regions 520 and the peripheral circuit regions 630 disposed in one memory die MD is adjustable as necessary.

In the case of the layout in FIG. 46 and FIG. 47, the word lines WL are extracted in the first hook-up region $R_{HU2}$ disposed on one side in the X-direction, and the bit lines BL are extracted in the second hook-up regions $R_{HU3}$, $R_{HU4}$ disposed in both the sides in the Y-direction. In the array region 510, the memory cell array 201 with the memory cells MC of 2T2C or 2T1C may be disposed, and the memory cell array 201 in the folded bit line method of 1T1C may be disposed.

Seventeenth Embodiment

Figure 48:
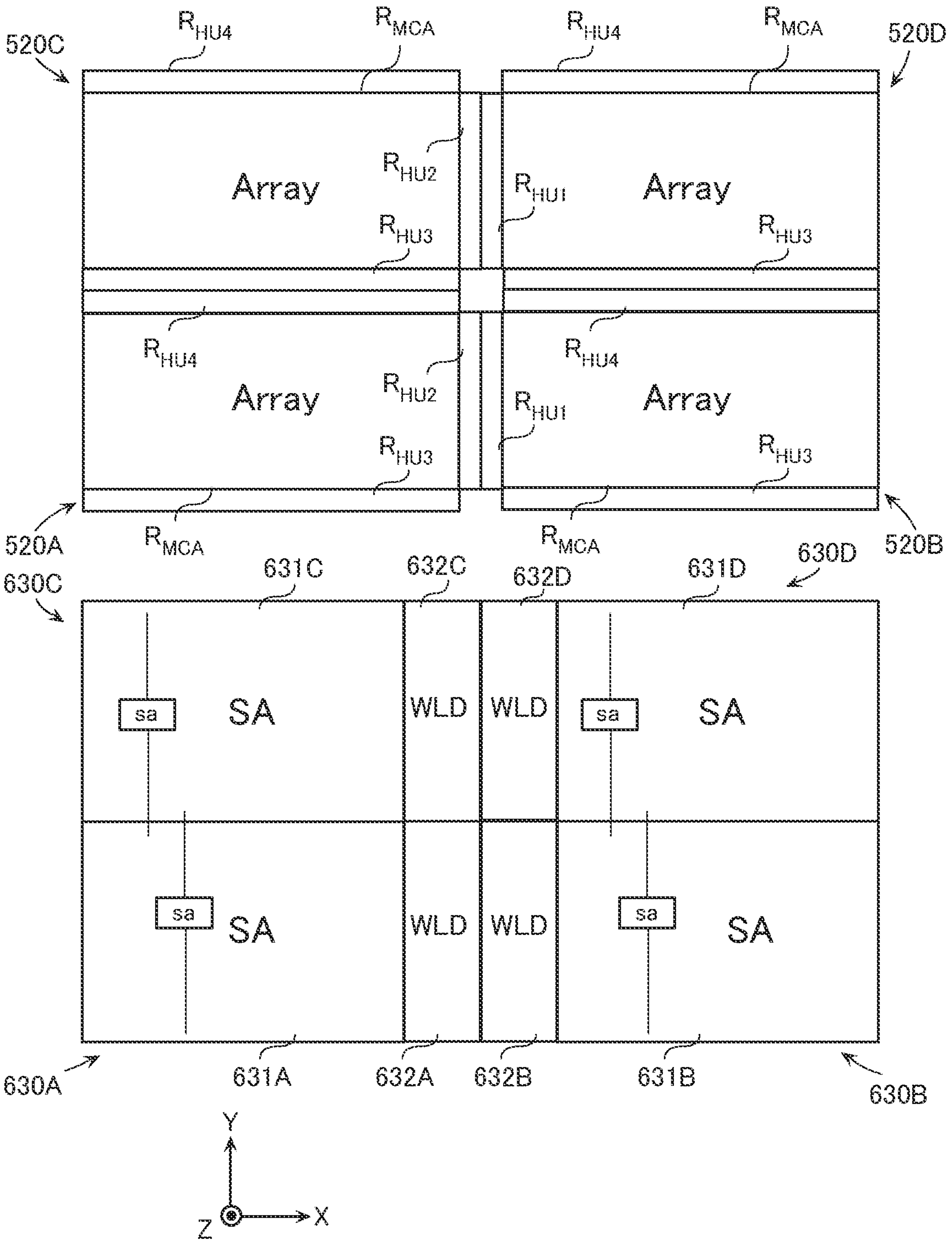
FIG. 48 is a schematic diagram illustrating a layout of a region of a memory cell array and a region of a peripheral circuit according to a seventeenth embodiment.

FIG. 48 is a schematic diagram illustrating a layout of a region of a memory cell array and a region of a peripheral circuit according to a seventeenth embodiment. The layout in FIG. 48 are basically similar to the layout in FIG. 47.

However, in the example in FIG. 48, the common sense unit 250 is disposed across an SA region 631A in the peripheral circuit region 630A and an SA region 631C in the peripheral circuit region 630C. Similarly, the common sense unit 250 is disposed across an SA region 631B in the peripheral circuit region 630B and an SA region 631D in the peripheral circuit region 630D.

While the array region 510 in the sixteenth embodiment is disposed with the memory cell array 201 of 2T2C or 2T1C, the array region 520 in the seventeenth embodiment is disposed with the memory cell array 201 (FIG. 29 to FIG. 32) in the open bit line method of 1T1C.

Therefore, for example, the bit lines BL included in the array regions 520A, 520B are used as the normal bit lines BL, and the bit lines BL included in the array regions 520C, 520D are used as the bit lines /BL.

The sense amplifier sa in the SA region 631C is, for example, connected to the bit lines in the array region 520A via the contact electrodes CCb in the second hook-up region $R_{HU4}$, and in addition, is connected to the bit lines in the array region 520C via the contact electrodes CCb in the second hook-up region $R_{HU4}$. The sense amplifier sa in the SA region 631A is, for example, connected to the bit lines in the array region 520A via the contact electrodes CCb in the second hook-up region $R_{HU3}$, and in addition, is connected to the bit lines in the array region 520C via the contact electrodes CCb in the second hook-up region $R_{HU3}$.

Eighteenth Embodiment

Figure 49:
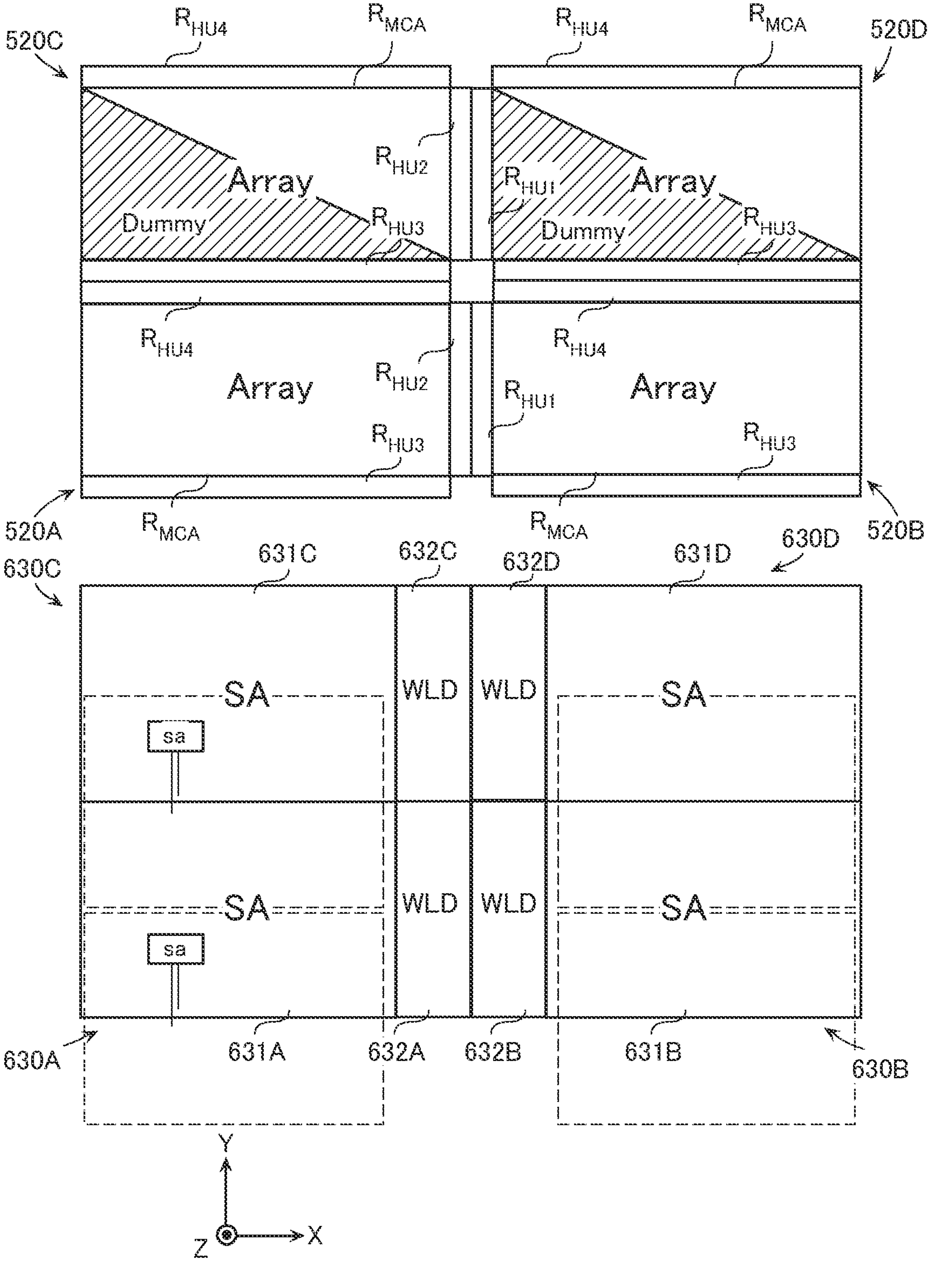
FIG. 49 is a schematic diagram illustrating a layout of a region of a memory cell array and a region of a peripheral circuit according to an eighteenth embodiment.

FIG. 49 is a schematic diagram illustrating a layout of a region of a memory cell array and a region of a peripheral circuit according to in an eighteenth embodiment. The layout in FIG. 49 is basically similar to the layout in FIG. 48.

However, in the example in FIG. 49, a half of the bit lines BL (for example, the bit lines in the odd-numbered rows) in the array regions 520C, 520D are not used.

The sense amplifiers sa are not disposed in a part of the SA regions 631C, 631D, or the sense amplifiers sa disposed in a part of the SA regions 631C, 631D are not used.

The sense amplifiers sa in a region on a +Y side in the SA region 631A and a region on a −Y side of the SA region 631C are, for example, connected to the bit lines in the array region 520A via the contact electrodes CCb in the second hook-up region $R_{HU4}$, and in addition, are connected to the bit lines in the array region 520C via the contact electrodes CCb in the second hook-up regions $R_{HU3}$. The sense amplifiers sa in a region on a +Y side in the SA region 631B and a region on a −Y side of the SA region 631D are, for example, connected to the bit lines in the array region 520B via the contact electrodes CCb in the second hook-up region $R_{HU4}$, and in addition, are connected to the bit lines in the array region 520D via the contact electrodes CCb in the second hook-up regions $R_{HU3}$. The memory cells MC (for example, the memory cells MC connected to the bit lines in the odd-numbered row) connected to the contact electrodes CCb in the second hook-up region $R_{HU4}$ in the array regions 510C, 510D disposed at the end portions of the memory die MD in the Y-direction serve as the dummy memory cells.

Note that, the sense amplifiers sa in the sense unit 250 formed across the region on the −Y side in the SA region 631A, the region on the −Y side in the SA region 631B, and the respective SA regions adjacent to the region on the −Y side in the SA region 631A and the region on the −Y side in the SA region 631B and not illustrated are also similar to the region on the +Y side of the SA region 631A and the region in the −Y side in the SA region 631C and the region on the +Y side in the SA region 631B and the region on the −Y side in the SA region 631D.

With such an arrangement, compared with the seventeenth embodiment, the wiring distances from the bit lines BL, /BL to the sense amplifiers sa can be reduced. Therefore, compared with the semiconductor memory device according to the seventeenth embodiment, an increased speed of the operation can be achieved.

Nineteenth Embodiment

Figure 50:
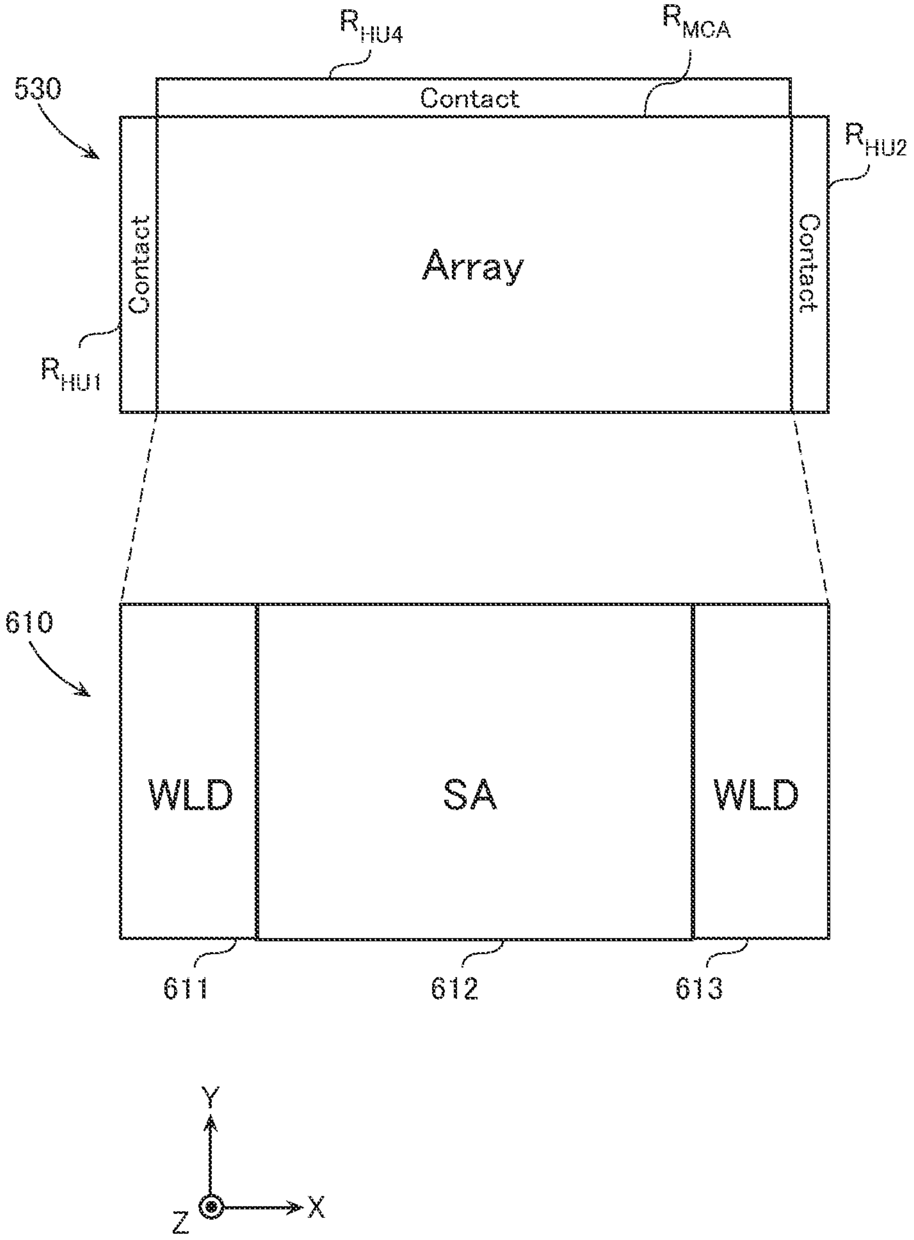
FIG. 50 is a schematic diagram illustrating a configuration of a region of a memory cell array and a region of a peripheral circuit according to a nineteenth embodiment.
Figure 51:
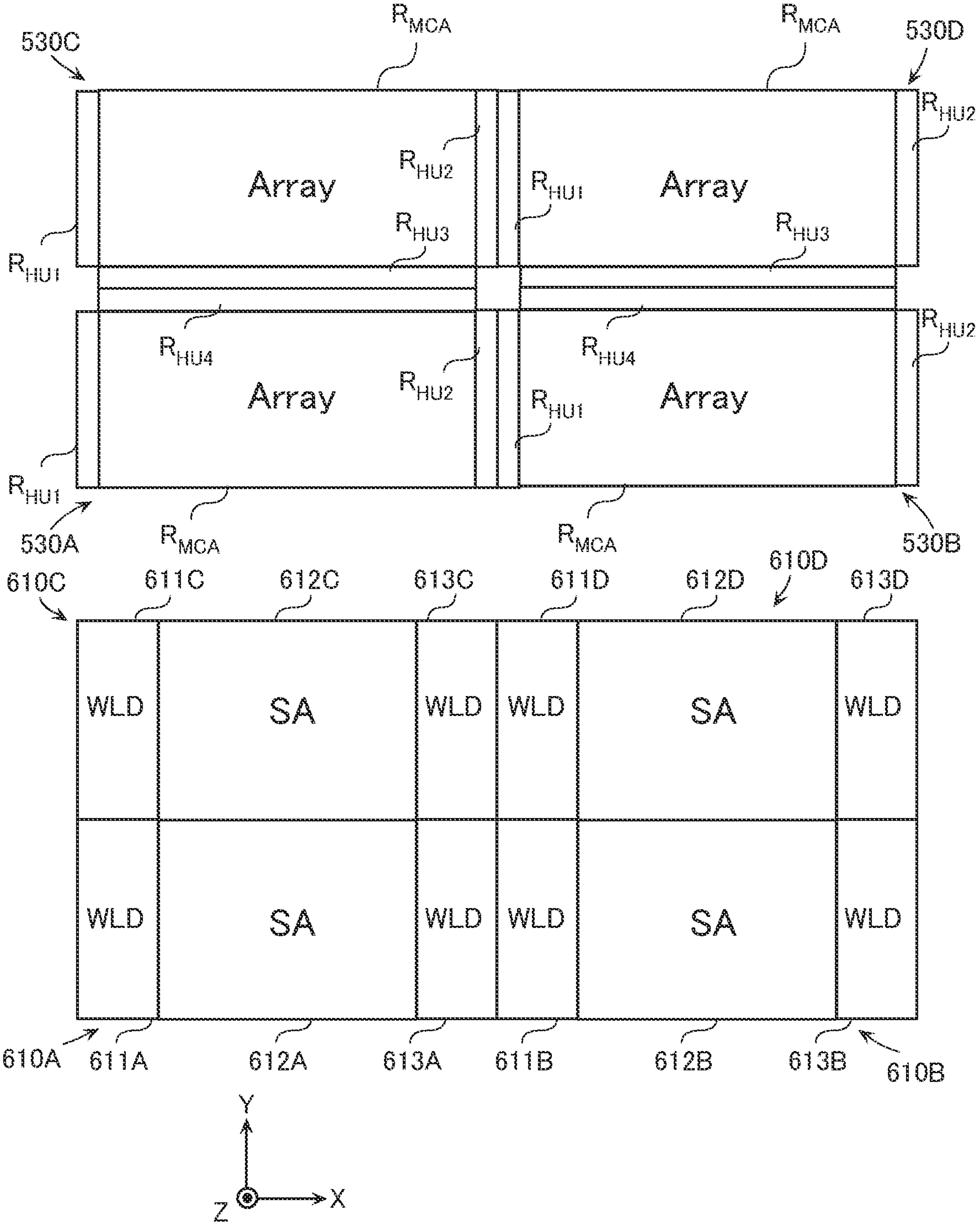
FIG. 51 is a schematic diagram illustrating a layout of the region illustrated in FIG. 50.

FIG. 50 is a schematic diagram illustrating a configuration of a region of a memory cell array and a region of a peripheral circuit according to a nineteenth embodiment. FIG. 51 is a schematic diagram illustrating a layout of the region illustrated in FIG. 50.

FIG. 50 exemplarily illustrates an array region 530. The array region 530 is basically configured similarly to the array region 510. However, while the second hook-up regions $R_{HU3}$ is disposed on the −Y side of the array region 510, the second hook-up regions $R_{HU3}$ is not disposed on a −Y side of the array region 530.

FIG. 50 exemplarily illustrates the peripheral circuit region 610.

In FIG. 51, as the array region 530 in FIG. 50, four array regions 530A, 530B, 530C, 530D are exemplarily illustrated. As the peripheral circuit region 610, the four peripheral circuit regions 610A, 610B, 610C, 610D are exemplarily illustrated. Similarly to the ninth embodiment, the number of the array regions 530 and the peripheral circuit regions 610 disposed in one memory die MD is adjustable as necessary.

In the case of the layout in FIG. 50 and FIG. 51, the word lines WL are extracted in the first hook-up regions $R_{HU1}$, $R_{HU2}$ disposed on both the sides in the X-direction, and the bit lines BL are extracted in the second hook-up region ($R_{HU3}$ or $R_{HU4}$) disposed on one side in the Y-direction. In the array region 530, the memory cell array 201 with the memory cells MC of 2T2C or 2T1C may be disposed, or the memory cell array 201 in the folded bit line method of 1T1C may be disposed.

Twentieth Embodiment

Figure 52:
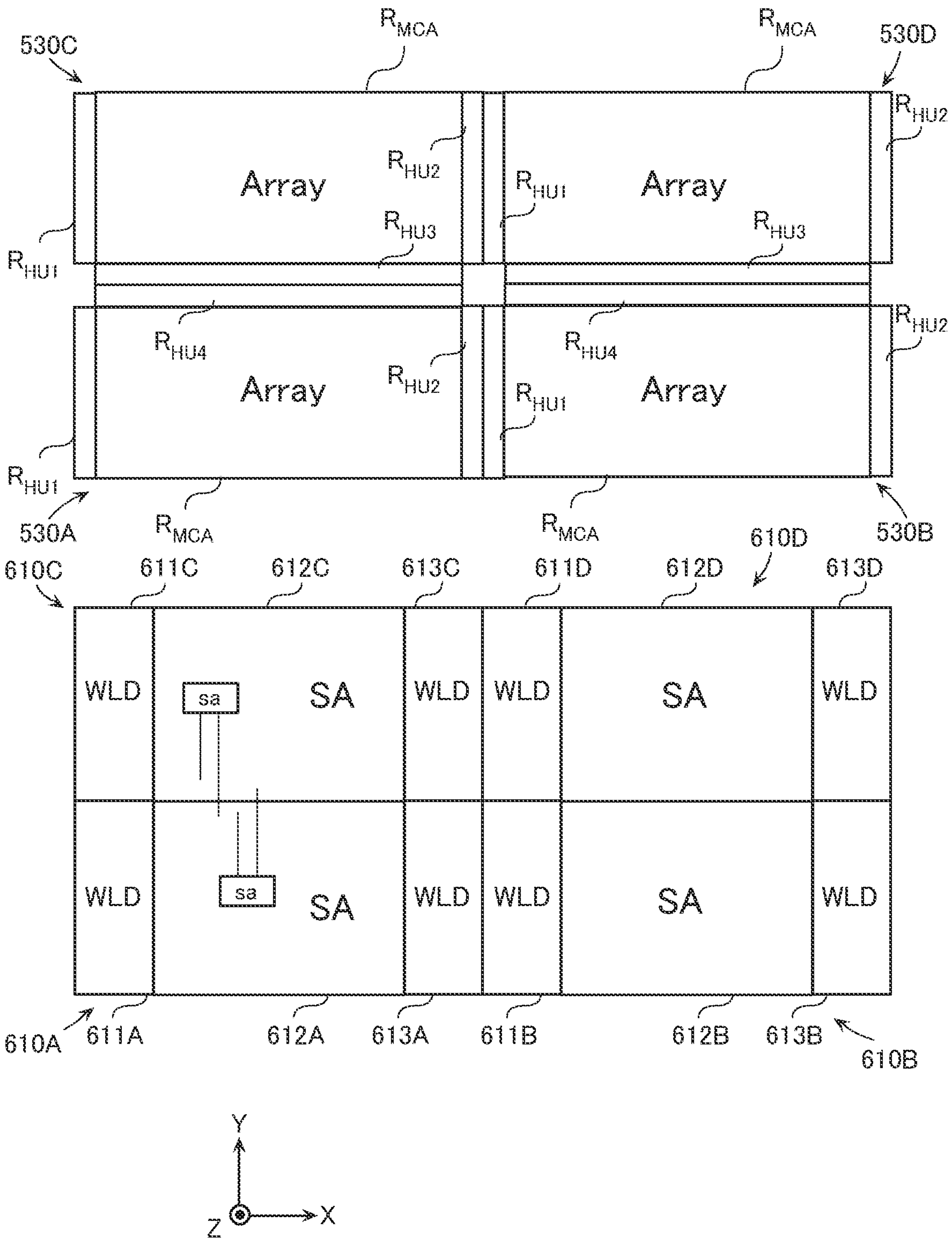
FIG. 52 is a schematic diagram illustrating a layout of a region of a memory cell array and a region of a peripheral circuit according to a twentieth embodiment.

FIG. 52 is a schematic diagram illustrating a layout of a region of a memory cell array and a region of a peripheral circuit according to a twentieth embodiment. The layout in FIG. 52 is basically similar to the layout in FIG. 51.

However, in the example in FIG. 52, the common sense unit 250 is disposed across the SA region 612A in the peripheral circuit region 610A and the SA region 612C in the peripheral circuit region 610C. Similarly, the common sense unit 250 is disposed across the SA region 612B in the peripheral circuit region 610B and the SA region 612D in the peripheral circuit region 610D.

While the array region 510 in the nineteenth embodiment is disposed with the memory cell array 201 of 2T2C or 2T1C, the array region 530 in the twentieth embodiment is disposed with the memory cell array 201 (FIG. 29 to FIG. 32) in the open bit line method of 1T1C.

Therefore, for example, the bit lines BL included in the array regions 530A, 530B are used as the normal bit lines BL, and a part of the bit lines BL included in the array regions 530C, 530D are used as the bit lines /BL. The connection between the bit lines BL, /BL and the sense amplifiers sa in the SA regions 612A, 612B, 612C, 612D are similar to the content described in FIG. 43.

The sense amplifier sa in the SA region 612C is, for example, connected to the bit lines in the array region 530A via the contact electrodes CCb in the second hook-up region $R_{HU4}$, and in addition, is connected to the bit lines in the array region 530C via the contact electrodes CCb in the second hook-up regions $R_{HU3}$. The sense amplifier sa in the SA region 612A is, for example, connected to the bit lines in the array region 530A via the contact electrodes CCb in the second hook-up region $R_{HU4}$, and in addition, is connected to the bit lines in the array region 530C via the contact electrodes CCb in the second hook-up regions $R_{HU3}$.

Twenty-First Embodiment

Figure 53:
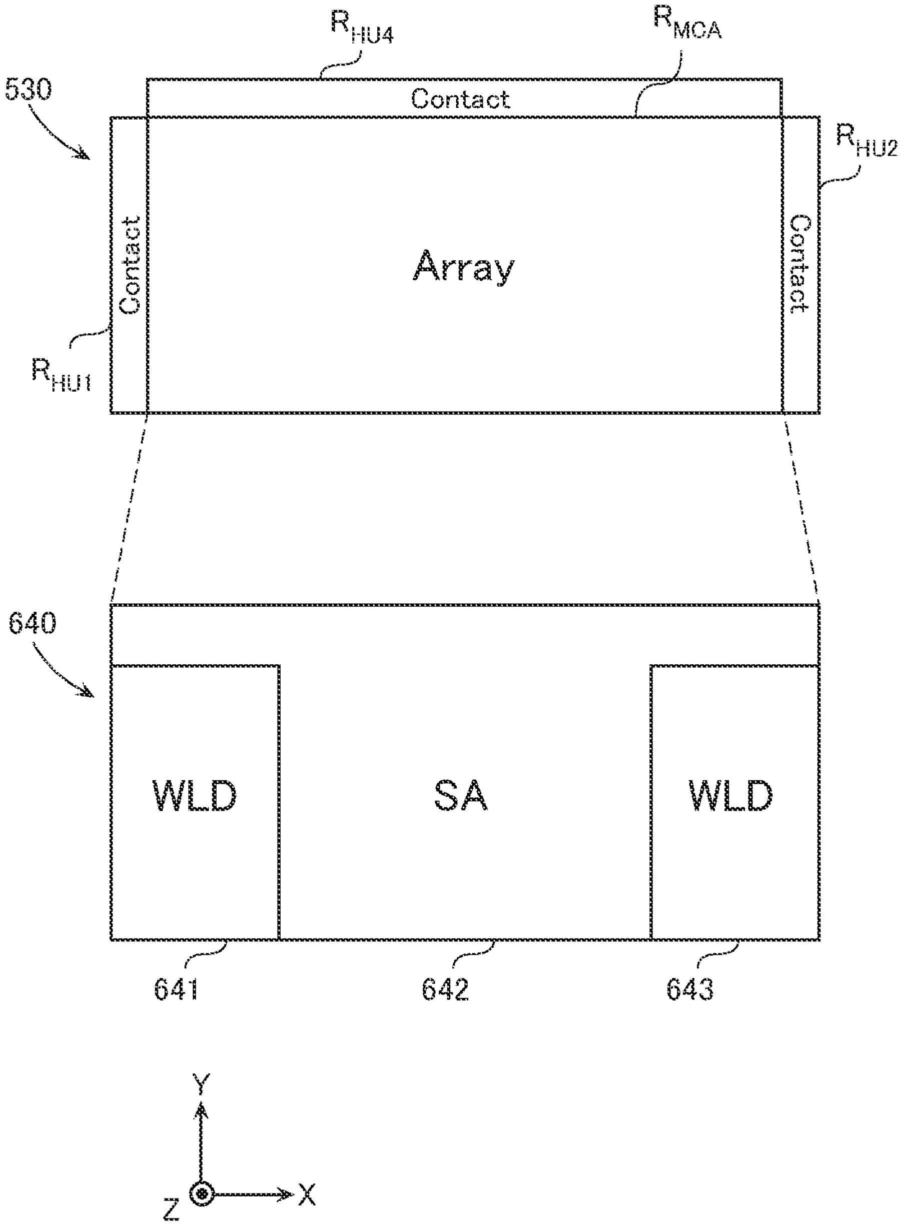
FIG. 53 is a schematic diagram illustrating a configuration of a region of a memory cell array and a region of a peripheral circuit according to a twenty-first embodiment.
Figure 54:
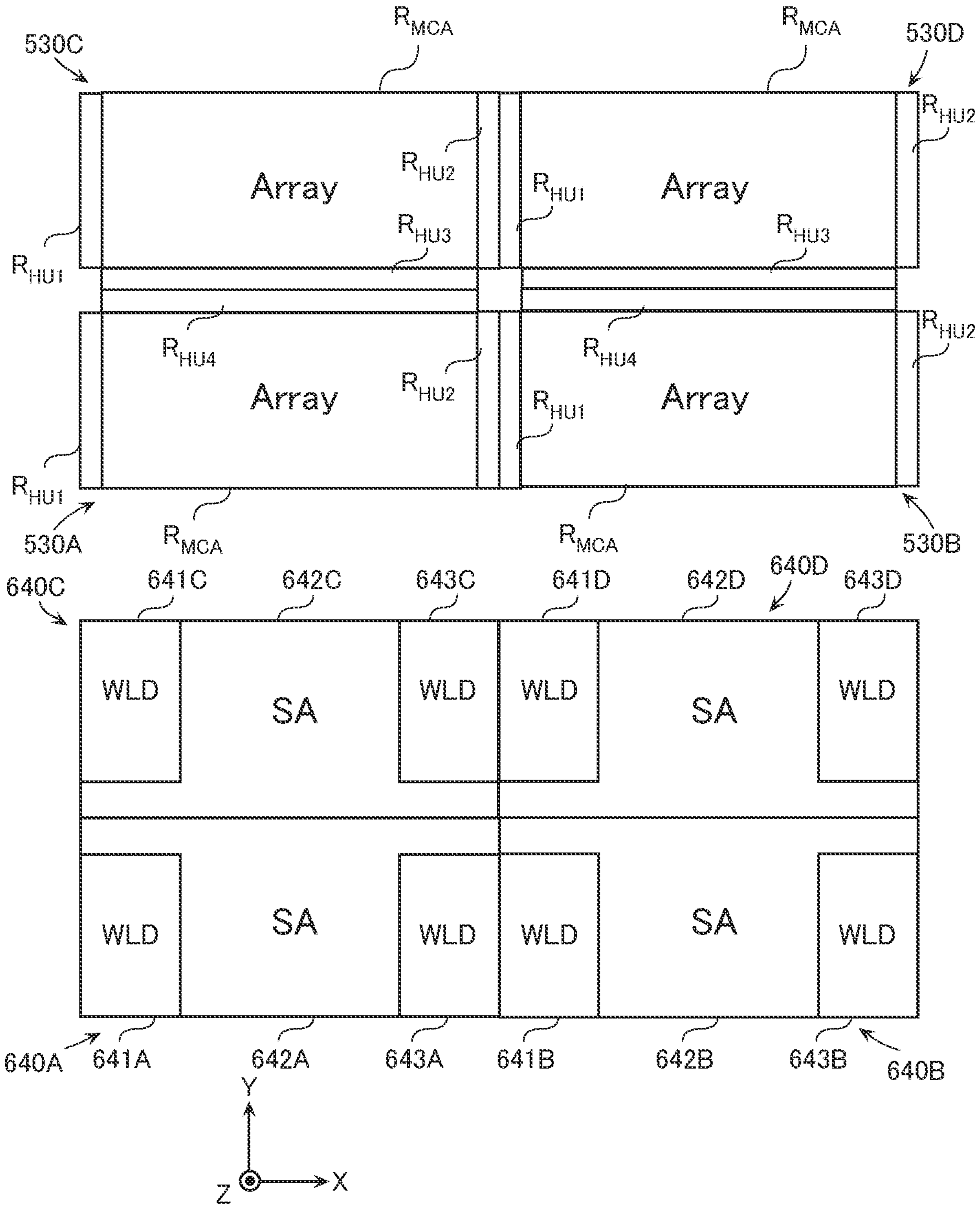
FIG. 54 is a schematic diagram illustrating a layout of the region illustrated in FIG. 53.

FIG. 53 is a schematic diagram illustrating a configuration of a region of a memory cell array and a region of a peripheral circuit according to a twenty-first embodiment. FIG. 54 is a schematic diagram illustrating a layout in the region illustrated in FIG. 53.

FIG. 53 exemplarily illustrates the array region 530.

FIG. 53 exemplarily illustrates a peripheral circuit region 640. The peripheral circuit region 640 is basically configured similarly to the peripheral circuit region 610. However, in the peripheral circuit region 640, not only a center position in the X-direction of the peripheral circuit region 640, but also a whole region near an end portion in the +Y-direction of the peripheral circuit region 640 is an SA region 642. In a region excluding these regions, WLD regions 641, 643 are disposed. The WLD region 641 is a region in which the word line driver 220 is disposed. The WLD region 643 is a region in which the word line driver 220 is disposed. The SA region 642 is a region in which the sense amplifier sa is disposed.

The word lines WL are connected to the word line driver 220 of the WLD region 641 via the contact electrodes CCw in the first hook-up regions $R_{HU1}$. The word lines WL are connected to the word line driver 220 of the WLD region 643 via the contact electrodes CCw of the first hook-up region $R_{HU2}$. The bit lines BL are connected to the sense amplifier sa of the SA region 642 via the contact electrodes CCb in the second hook-up region $R_{HU4}$.

In FIG. 54, as the array region 530 in FIG. 53, the four array regions 530A, 530B, 530C, 530D are exemplarily illustrated. As the peripheral circuit region 640, four peripheral circuit regions 640A, 640B, 640C, 640D are exemplarily illustrated. Similarly to the ninth embodiment, the number of the array regions 530 and the peripheral circuit regions 640 disposed in one memory die MD is adjustable as necessary.

In the case of the layout in FIG. 53 and FIG. 54, the word lines WL are extracted in the first hook-up regions on both the sides, and the bit lines BL are extracted in the second hook-up region on one side. In the array region 530, the memory cell array 201 with the memory cells MC of 2T2C or 2T1C may be disposed, or the memory cell array 201 in the folded bit line method of 1T1C may be disposed.

Twenty-Second Embodiment

Figure 55:
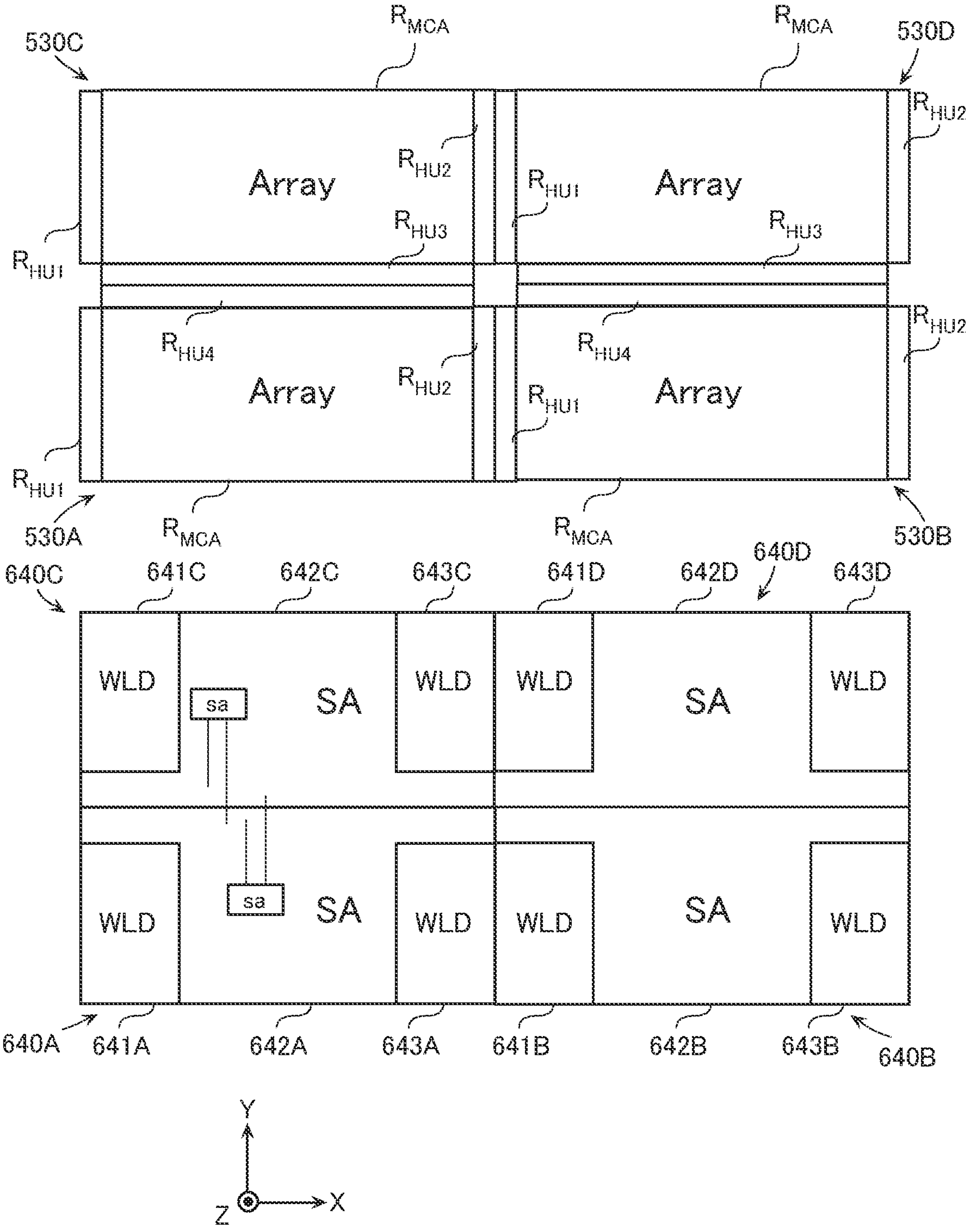
FIG. 55 is a schematic diagram illustrating a layout of a region of a memory cell array and a region of a peripheral circuit according to a twenty-second embodiment.

FIG. 55 is a schematic diagram illustrating a layout of a region of a memory cell array and a region of a peripheral circuit according to a twenty-second embodiment. The layout in FIG. 55 is basically similar to the layout in FIG. 54.

However, in the example in FIG. 55, the common sense unit 250 is disposed across an SA region 642A in the peripheral circuit region 640A and an SA region 642C in the peripheral circuit region 640C. Similarly, the common sense unit 250 is disposed across an SA region 642B in the peripheral circuit region 640B and an SA region 642D in the peripheral circuit region 640D.

In the array region 530 in the twenty-second embodiment, the memory cell array 201 (FIG. 29 to FIG. 32) in the open bit line method of 1T1C is disposed.

Therefore, for example, the bit lines BL included in the array regions 530A, 530B are used as the normal bit lines BL, and the bit line BL included in the array regions 530C, 530D are used as the bit lines /BL.

The sense amplifier sa in the SA region 642C is, for example, connected to the bit lines in the array region 530A via the contact electrodes CCb in the second hook-up region $R_{HU4}$, and in addition, is connected to the bit lines in the array region 530C via the contact electrodes CCb in the second hook-up regions $R_{HU3}$. The sense amplifier sa in the SA region 642A is, for example, connected to the bit lines in the array region 530A via the contact electrodes CCb in the second hook-up region $R_{HU4}$, and in addition, is connected to the bit lines in the array region 530C via the contact electrodes CCb in the second hook-up regions $R_{HU3}$.

Other Embodiments

The semiconductor memory devices according to the first embodiment to the twenty-second embodiment have been described above. However, the configurations of the semiconductor memory devices according to the first embodiment to the twenty-second embodiment are merely examples, and the specific configurations and the manufacturing methods are adjustable as necessary.

For example, the semiconductor memory device 1 according to each embodiment is configured as a DRAM as described above. However, it is not limited to the DRAM. The semiconductor memory device 1 may be configured as another volatile memory, such as a Static random access memory (SRAM). It may be configured as a non-volatile memory, such as a Magnetoresistive Random Access Memory (MRAM).

The memory cells MC are formed at the portions (the cross points) where the word lines WL intersect with the bit lines BL. However, the memory cells MC may be formed at positions displaced from the cross points.

Materials of the respective parts that configure the memory die MD are not limited to the materials described in the specification.

Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
- a substrate including a first region and a second region arranged in a first direction;
- a first wiring extending in the first direction across the first region and the second region;
- a second wiring that is disposed in the first region and extends in a second direction intersecting with the first direction;
- a memory cell that is disposed in the first region and is connected to the first wiring and the second wiring; and
- a first contact electrode that is disposed in the second region, extends in a third direction intersecting with a surface of the substrate, and is connected to the first wiring, wherein the memory cell includes:
- a semiconductor layer that is electrically connected to the second wiring and positioned facing the first wiring with a gate insulating layer therebetween; and
- a memory unit electrically connected to the semiconductor layer, the first contact electrode includes:
- a first part overlapping with the first wiring viewed from above along the third direction; and
- a second part not overlapping with the first wiring viewed from above along the third direction, and the first contact electrode is in contact with a side surface in the first direction of the first wiring.

2. The semiconductor memory device according to claim 1, further comprising:
- a plurality of the semiconductor layers and a plurality of insulating core materials alternately arranged in the first direction; and
- a conductive sidewall film extending in the first direction along side surfaces in the second direction of the plurality of semiconductor layers and the plurality of core materials, wherein the first contact electrode is connected to an end portion in the first direction of the sidewall film.

3. The semiconductor memory device according to claim 2, wherein when a cross-sectional surface that extends in the second direction and the third direction and includes one of the plurality of core materials is a first cross-sectional surface, in the first cross-sectional surface, a length in the second direction of one of the plurality of core materials is shorter than a length in the third direction of one of the plurality of core materials.

4. The semiconductor memory device according to claim 1, further comprising:

a driver circuit formed in the first region or the second region on the substrate; and a first wiring layer electrically connected to the driver circuit, wherein the first wiring layer is disposed between the substrate and the memory cell, and the first contact electrode is electrically connected to the first wiring layer.

5. The semiconductor memory device according to claim 4, wherein the first contact electrode is connected to the first wiring layer at one end portion in the third direction.

6. The semiconductor memory device according to claim 4, further comprising:

a second contact electrode that extends in the third direction and is connected to the first wiring layer at one end portion in the third direction; and a second wiring layer that electrically connects the first contact electrode to the second contact electrode.

7. The semiconductor memory device according to claim 6, further comprising:

two second regions disposed at one side and another side of the first region in the first direction; and a plurality of the first wirings arranged in the second direction, wherein the second region disposed at the one side of the first region in the first direction includes:

a plurality of the first contact electrodes connected to 2n−1-th (n is an integer of one or more) first wirings counted from one side in the second direction among the plurality of first wirings; and a plurality of the second contact electrodes aligned in the first direction with 2n-th first wirings counted from the one side in the second direction among the plurality of first wirings, and the second region disposed at the other side of the first region in the first direction includes:

a plurality of the first contact electrodes connected to the 2n-th first wirings counted from the one side in the second direction among the plurality of first wirings; and a plurality of the second contact electrodes aligned in the first direction with the 2n−1-th first wirings counted from the one side in the second direction among the plurality of first wirings.

8. The semiconductor memory device according to claim 1, wherein the substrate includes a third region aligned with the first region in the second direction, and the semiconductor memory device comprises:

a third contact electrode that is disposed in the third region, extends in the third direction, and is connected to the second wiring;

a sense amplifier formed in the first region or the third region on the substrate; and a first wiring layer electrically connected to the sense amplifier, the first wiring layer is disposed between the substrate and the memory cell, and the third contact electrode is electrically connected to the first wiring layer.

9. The semiconductor memory device according to claim 8, wherein the third contact electrode is connected to the first wiring layer at one end portion in the third direction.

10. The semiconductor memory device according to claim 8, further comprising:

a fourth contact electrode that extends in the third direction and is connected to the first wiring layer at one end portion in the third direction; and a second wiring layer that electrically connects the third contact electrode to the fourth contact electrode.

11. A semiconductor memory device comprising:

a substrate including a first region and a second region arranged in a first direction;

a plurality of array structures arranged in a second direction intersecting with the first direction; and a first contact electrode that is disposed in the second region, extends in the second direction, and is connected to at least one of the plurality of array structures, wherein each of the plurality of array structures includes:

two first wirings that extend in the first direction across the first region and the second region and are arranged in the second direction;

two second wirings that are disposed in the first region, are arranged in the second direction, and extend in a third direction intersecting with the first direction and the second direction;

two semiconductor layers that are disposed in the first region, electrically connected to the respective two second wirings, and positioned facing the respective two first wirings with gate insulating layers therebetween; and a first memory unit and a second memory unit electrically connected to the respective two semiconductor layers, wherein the first contact electrode is connected to the two first wirings of one of the plurality of array structures, and the first contact electrode includes:

a first part overlapping with one of the two first wirings viewed from above along the second direction; and a second part not overlapping with the one of the two first wirings viewed from above along the second direction.

12. The semiconductor memory device according to claim 11, wherein each of the plurality of array structures includes:

a plurality of the semiconductor layers and a plurality of insulating core materials alternately arranged in the first direction; and a conductive sidewall film extending in the first direction along both side surfaces in the third direction of the plurality of semiconductor layers and the plurality of core materials, the conductive sidewall film is one of the two first wirings, and the first contact electrode is connected to an end portion in the first direction of the sidewall film corresponding to one of the plurality of array structures.

13. The semiconductor memory device according to claim 12, wherein when a cross-sectional surface that extends in the second direction and the third direction and includes one of the plurality of core materials included in one of the plurality of array structures is a first cross-sectional surface, and in the first cross-sectional surface, a length in the second direction of one of the plurality of core materials is shorter than a length in the third direction of one of the plurality of core materials.

14. The semiconductor memory device according to claim 12, wherein a first core material as one of the plurality of core materials and a second core material as another one of the plurality of core materials are arranged in the second direction, the first core material has an end portion at a position in the first direction different from a position of an end portion in the first direction of the second core material, and widths of the sidewall films at the end portions in the first direction in the first core material and the second core material are same.

15. The semiconductor memory device according to claim 12, wherein a first core material as one of the plurality of core materials and a second core material as another one of the plurality of core materials are arranged in the second direction, the first core material has an end portion at a position in the first direction same as a position of an end portion in the first direction of the second core material, and a width of the sidewall film at the end portion in the first direction in the first core material is different from a width of the sidewall film at the end portion in the first direction in the second core material.

16. The semiconductor memory device according to claim 11, further comprising:

a driver circuit formed in the first region or the second region on the substrate; and a first wiring layer electrically connected to the driver circuit, wherein the first wiring layer is disposed between the substrate and the plurality of array structures, and the first contact electrode is electrically connected to the first wiring layer.

17. The semiconductor memory device according to claim 16, wherein the first contact electrode is connected to the first wiring layer at one end portion in the third direction.

18. The semiconductor memory device according to claim 16, further comprising:

a second contact electrode that extends in the third direction and is connected to the first wiring layer at one end portion in the third direction; and a second wiring layer that electrically connects the first contact electrode to the second contact electrode.

19. The semiconductor memory device according to claim 11, wherein the substrate includes a third region aligned with the first region in the third direction, and the semiconductor memory device comprises:

a third contact electrode that is disposed in the third region, extends in the second direction, and is connected to one of the second wirings;

a sense amplifier formed in the first region or the third region on the substrate; and a first wiring layer electrically connected to the sense amplifier, the first wiring layer is disposed between the substrate and the plurality of array structures, and the third contact electrode is electrically connected to the first wiring layer.

20. A semiconductor memory device comprising:

a substrate including a first region and a second region arranged in a first direction;

a plurality of array structures arranged in a second direction intersecting with the first direction; and a first contact electrode that is disposed in the second region, extends in the second direction, and is connected to at least one of the plurality of array structures, wherein each of the plurality of array structures includes:

two first wirings that extend in the first direction across the first region and the second region and are arranged in the second direction;

two second wirings that are disposed in the first region, are arranged in the second direction, and extend in a third direction intersecting with the first direction and the second direction;

two semiconductor layers that are disposed in the first region, electrically connected to the respective two second wirings, and positioned facing the respective two first wirings with gate insulating layers therebetween; and a first memory unit electrically connected to the two semiconductor layers, wherein the first contact electrode is connected to the two first wirings of one of the plurality of array structures, and the first contact electrode includes:

a first part overlapping with one of the two first wirings viewed from above along the second direction; and a second part not overlapping with the one of the two first wirings viewed from above along the second direction.

* * * * *